US006987784B2

(12) United States Patent  
Woodley et al.

(10) Patent No.: US 6,987,784 B2  
(45) Date of Patent: Jan. 17, 2006

(54) WAVELENGTH AGILE LASER

(75) Inventors: Bruce Robert Woodley, Mountain View, CA (US); Neil MacKinnon, San Jose, CA (US)

(73) Assignee: San Jose Systems, Inc., San Jose, CA (US)

( * ) Notice: Subject to any disclaimer, the term of this patent is extended or adjusted under 35 U.S.C. 154(b) by 267 days.

(21) Appl. No.: 10/244,618

(22) Filed: Sep. 17, 2002

(65) Prior Publication Data

US 2003/0053495 A1  Mar. 20, 2003

Related U.S. Application Data

(63) Continuation-in-part of application No. 09/954,495, filed on Sep. 10, 2001.

(51) Int. Cl.  
   *H01S 3/10*  (2006.01)  
   *H01S 3/00*  (2006.01)

(52) U.S. Cl. ..................................... 372/20; 372/38.05
(58) Field of Classification Search .................. 372/20, 372/21, 29.01–33, 38.05  
See application file for complete search history.

(56) References Cited

U.S. PATENT DOCUMENTS

| | | | |
|---|---|---|---|
| 3,867,012 A | 2/1975 | Phillips | 385/10 |
| 4,384,760 A | 5/1983 | Alferness | 312/296 |
| 4,390,236 A | 6/1983 | Alferness | 385/9 |
| 4,445,751 A | 5/1984 | Divens et al. | 385/43 |
| 4,533,207 A | 8/1985 | Alferness | 385/40 |
| 4,667,331 A | 5/1987 | Alferness et al. | 372/12 |
| 4,695,121 A | 9/1987 | Mahapatra et al. | 385/40 |
| 4,728,207 A | 3/1988 | Foster | 400/248 |

(Continued)

OTHER PUBLICATIONS

Alferness, R.C., "Efficient waveguide electro–optic TE⇌TM mode converter/wavelength filter", Applied Physics Letters, vol. 36, No. 7, Apr. 1980, pp. 513–515.

Kim, et al., "Switching Operations of Three–Waveguide Optical Switches", IEEE Journal of Selected Topics in Quantum Electronics, vol. 6, No. 1, pp. 170–174, Jan./Feb. 2000.

Haus, et al., "Three–Waveguide Couplers for Improved Sampling and Filtering", IEEE Journal of Quantum Electronics, vol. QE–17, No. 12, pp. 2321–2325, Dec. 1981.

Marom, et al., "Relation Between Normal–Mode and Coupled–Mode Analyses of Parallel Waveguides", IEEE Journal of Quantum Electronics, vol. QE–20, No. 12, pp. 1311–1318 Dec. 1984.

(Continued)

*Primary Examiner*—Minsun Oh Harvey  
*Assistant Examiner*—James Menefee  
(74) *Attorney, Agent, or Firm*—Katten Muchin Rosenman, LLP

(57) ABSTRACT

A method and system are disclosed for synthesizing an electric field. In accordance with exemplary embodiments of the present invention, an electric field that changes across a distance in space is synthesized by applying voltage levels at several locations independently of one another. The independence in voltage levels allows the electric field that is synthesized to be made periodic or aperiodic. Such a synthesized electric field can be changed at any time for use in, for example, a tunable laser. According to an exemplary embodiment, the electric field is used to change the refractive index of an electro-optic substance in an optical filter. Such an optical filter can be used as part of, for example, a wavelength agile laser, an optical add drop multiplexer, an optical switch, or the like. Such an optical filter can also be used for dynamic power balancing, dynamic gain equalization, or the like.

99 Claims, 40 Drawing Sheets

U.S. PATENT DOCUMENTS

| | | | |
|---|---|---|---|
| 4,948,407 A | 8/1990 | Bindell et al. | 65/386 |
| 5,150,447 A | 9/1992 | Tamada et al. | 385/130 |
| 5,185,831 A | 2/1993 | Kawashima | 385/41 |
| 5,311,540 A | 5/1994 | Pocholle et al. | 372/97 |
| 5,319,494 A | 6/1994 | Miyaguchi et al. | 359/487 |
| 5,327,447 A | 7/1994 | Mooradian | 372/92 |
| 5,393,371 A | 2/1995 | Chang et al. | 216/24 |
| 5,442,719 A | 8/1995 | Chang et al. | 385/3 |
| 5,473,722 A | 12/1995 | Sohler et al. | 385/132 |
| 5,488,681 A | 1/1996 | Deacon et al. | 385/37 |
| 5,519,802 A | 5/1996 | Field et al. | 385/129 |
| 5,524,012 A | 6/1996 | Wang et al. | 372/23 |
| 5,526,439 A | 6/1996 | Bergmann | 385/24 |
| 5,581,572 A * | 12/1996 | Delorme et al. | 372/50 |
| 5,581,642 A | 12/1996 | Deacon et al. | 385/15 |
| 5,615,041 A | 3/1997 | Field et al. | 359/326 |
| 5,748,660 A * | 5/1998 | Delorme et al. | 372/50 |
| 5,809,188 A | 9/1998 | Tseng et al. | 385/37 |
| 5,838,714 A * | 11/1998 | Delorme | 372/96 |
| 5,852,688 A | 12/1998 | Brinkman et al. | 385/16 |
| 6,041,071 A | 3/2000 | Tayebati | 372/64 |
| 6,074,594 A | 6/2000 | Byer et al. | 264/406 |
| 6,101,210 A | 8/2000 | Bestwick et al. | 372/96 |
| 6,108,355 A | 8/2000 | Zorabedian | 372/20 |
| 6,156,255 A | 12/2000 | Byer et al. | 264/406 |
| 6,156,483 A | 12/2000 | McCoy et al. | 430/311 |
| 6,246,709 B1 | 6/2001 | Oshiba et al. | 372/50 |

OTHER PUBLICATIONS

Alferness, et al., "Tunable optical waveguide directional coupler filter", Applied Physics Letters, vol. 33, No. 2, pp. 161–163, Jul. 1978.

Kogelnik, et al., "Switched Directional Couplers with Alternating $\Delta\beta$", IEEE Journal of Quantum Electronics, vol. QE–12, No. 7, pp. 396–401, Jul. 1976.

Wacogne, et al., "Single lithium niobate crystal for mode selection and phase modulation in a tunable extended–cavity diode laser" Optics Letters, vol. 19, No. 17, pp. 1334–1336, Sep. 1994.

Mackinnon, et al., Laser–diode–pumped, electro–optically tunable Nd:MgO:LiNbO$_3$ Microchip Laser, Journal of the Optical Society of America B, vol. 11, No. 3, pp. 519–522, Mar. 1994.

Irace, et al., "Fast Silicon–on–Silicon Optoelectronic Router Based on a BMFET Device", IEEE Journal of Selected Topics in Quantum Electronics, vol. 6, No. 1, pp. 14–17, Jan./Feb. 2000.

Kasunic, K., "Design Equations for the Reflectivity of Deep–Etch Distributed Bragg Reflector Gratings", Journal of Lightwave Technology, vol. 18, No. 3, pp. 425–429, Mar. 2000.

Alferness, et al., "Characteristics of Ti–diffused lithium niobate optical directional couplers", Applied Optics, vol. 18, No. 23, pp. 4012–4016, Dec. 1979.

Nelson, et al., "Coupling optical waveguides by tapers", Applied Optics, vol. 14, No. 12, pp. 3012–3015, Dec. 1975.

Kaminow, et al., "Loss in cleaved Ti–diffused LiNbO$_3$ waveguides", Applied Physics Letters, vol. 33, No. 1, pp. 62–64, Jul. 1978.

Payne et al., "Design of Lithium Niobate Based Photonic Switching Systems", IEEE Communications Magazine, vol. 25, No. 5, pp. 37–41, May 1987.

Ohmachi, et al., "Electro–optic light modulator with branched ridge waveguide", Applied Physics Letters, vol. 27, No. 10, pp. 544–546, Nov. 1975.

Burns, et al., "Active branching waveguide modular", Applied Physics Letters, vol. 29, No. 12, pp. 790–792, Dec. 1976.

Burns, et al., "Optical waveguide parabolic coupling horns", Applied Physics Letters, vol. 30, No. 1, pp. 28–30, Jan. 1977.

Favre, et al., "External–Cavity Semiconductor Laser with 15nm Continuous Tuning Range", Electronics Letters, vol. 22, No. 15, pp. 795–796, Jul. 1986.

Schmidt, et al., "Metal–diffused optical waveguide in LiNbO$_3$", Applied Physics Letters, vol. 25, No. 8, pp. 458–460, Oct. 1974.

Tien, et al., "Light beam scanning and deflection in epitaxial LiNbO$_3$ electro–optic waveguides", Applied Physics Letters, vol. 25, No. 10, pp. 563–565, Nov. 1974.

Lin, et al., "A Three–Dimensional Optical Photonic Crystal", Journal of Lightwave Technology, vol. 17, No. 11, pp. 1944–1947, Nov. 1999.

Talneau, et al., "Agile and Fast Switching Monolithically Integrated Four Wavelength Selectable Source at 1.55 $\mu$m", IEEE Photonics Technology Letters, vol. 11, No. 1, pp. 12–14, Jan. 1999.

Locco, et al., "Bragg grating fast tunable filter", Electronics Letters, vol. 33, No. 25, pp. 2147–2148, Dec. 1997.

Vengsarkar, et al., "Long–Period Fiber Gratings as Band–Rejection Filters" Journal of Lightwave Technology, vol. 14, No. 1, pp. 58–65, Jan. 1996.

Alferness, et al., "Electro–optic waveguide TE$\rightleftharpoons$TM mode converter with low drive voltage", Optics Letters, vol. 5, No. 11, pp. 473–475, Nov. 1980.

Franke, et al., "All–Optical Switching in an Angled–Grating Semiconductor Bragg Amplifier", IEEE Photonics Technology Letters, vol. 11, No. 7, pp. 815–817, Jul. 1999.

Wörhoff, et al., "Design, Tolerance Analysis, and Fabrication of Silicon Oxynitride Based Planar Optical Waveguides for Communication Devices", Journal of Lightwave Technology, vol. 17, No. 8, pp. 1401–1407, Aug. 1999.

Matos, et al., "Epitaxial Liftoff Microcavities for 1.55-$\mu$m Quantum–Well Spatial Light Modulators", IEEE Photonics Technology Letters, vol. 11, No. 1, pp. 57–59, Jan. 1999.

Ma, et al., "Realization of All–Optical Wavelength Converter Based on Directionally Coupled Semiconductor Optical Amplifiers", IEEE Photonics Technology Letters, vol. 11, No. 2, pp. 188–190, Feb. 1999.

Mason, et al., "Widely Tunable Sampled Grating DBR Laser with Integrated Electroabsorption Modulator", IEEE Photonics Technology Letters, vol. 11, No. 6, pp. 638–640, Jun. 1999.

Eickhjoff, W., "In–Line Fibre–Optic Polariser", Electronics Letters, vol. 16, No. 20, pp. 762–763, Sep. 1980.

Bergh, et al., "Single–Mode Fiber–Optic Polarizer", Optics Letters, vol. 5, No. 11, pp. 479–481, Nov. 1980.

Zervas, et al., "Performance of surface–plasma–wave fiber–optic polarizers", Optics Letters, vol. 15, No. 9, pp. 513–515, May 1990.

Lee, et al., "Fabrication of a side–polished fiber polarizer with a birefringent polymer overlay", Optics Letters, vol. 22, No. 9, pp. 606–608, May 1997.

Wu, et al., "UV–Induced Surface–Relief Gratings on LiNbO$_3$ Channel Waveguides", IEEE Journal of Quantum Electronics, vol. 35, No. 10, pp. 1369–1373, Oct. 1999.

Schmidt, et al., "Metal–diffused optical waveguides in LiNbO$_3$", Applied Physics Letters, vol. 25, No. 8, pp. 458–460, Oct. 1974.

Jackel, et al., "Elimination of out–diffused surface guiding in titanium–diffused LiNbO$_3$", Applied Physics Letters, vol. 38, No. 7, pp. 509–511, Apr. 1981.

Alferness, et al., "Efficient Single–Mode Fiber to Titanium Diffused Lithium Niobate Waveguide Coupling for $\lambda$=1.32 $\mu$m", IEEE Journal of Quantum Electronics, vol. QE–18, No. 10, pp. 1807–1813, Oct. 1982.

McCaughan, et al., "Influence of Temperature and Initial Titanium Dimensions on Fiber–Ti:LiNbO$_3$ Waveguide Insertion Loss at $\lambda$=1.3 $\mu$m", IEEE Journal of Quantum Electronics, vol. QE–19, No. 2, pp. 131–136, Feb. 1983.

Minakata, et al., "Precise determination of refractive–index changes in Ti–diffused LiNbO$_3$ optical waveguides", J. Applied Physics, vol. 49, No. 9, pp. 4677–4682, Sep. 1978.

Hahn, et al., "Electron–Concentration Dependence of Absorption and Refraction in n–In$_{0.53}$Ga$_{0.47}$As Near the Band–Edge", Journal of Electronic Materials, vol. 24, No. 10, pp. 1357–1361, 1996.

Birks, et al., "Low Power Acousto–Optic Device Based on A Tapered Single–Mode Fiber", IEEE Photonics Technology Letters, vol. 6, No. 6, pp. 725–727, Jun. 1994.

Wu, et al., "FIR Filter Design via Spectral Factorization and Convex Optimization", 33 pages 1997, no month.

Oppenheim, et al., "Filter Design Techniques", Discrete–Time Signal Processing, Prentice Hall, Englewood Cliffs, New Jersey, pp. 444–480, 1989.

Leuthold, et al., "Multimode Interference Couplers for the Conversion and Combining of Zero–and First–Order Modes", Journal of Lightwave Technology, vol. 16, No. 7, pp. 1228–1239, Jul. 1998.

"Oversampling Techniques using the TMS320C24x Family", Literature No. SPRA461, Texas Instruments Europe, 37 pages, Jun. 1998.

Okamoto, Katsunari, "Fundamentals of Optical Waveguides", Optics and Photonics, Academic Press, pp. 59–71, 2000.

Alferness, R., "Electrooptic guided–wave device for general polarization transformations", IEEE Journal of Quantum Electronics, vol. QE–17, No. 6, pp. 965–969, Jun. 1981.

Alferness, R. et al, "Waveguide electro–optic polarization transformer", Applied Physics Letters, vol. 38, No. 9, pp. 655–657 May 1981.

Burns, W., et al., "End fire coupling between optical fibers and diffused channel waveguides," Applied Optics, vol. 16, No. 8, pp. 2048–2050, Aug. 1997.

Burns, W. et al., "Mode conversion in Planar–Dielectric Separating Waveguides", IEEE Journal of Quantum Electronics, vol. QE–11, No. 1, pp. 32–39, Jan. 1975.

Heismann, F., et al., "Narrow–linewidth, electro–optically tunable InGaAsP–Ti:LiNbO$_3$ extended cavity laser", Applied Phyhsics Letters, vol. 51, No. 1, pp. 164–166, Jul. 1987.

Heismann, F., et al., "Electro–Optically Tunable, Narrowband Ti: LiNbO$_3$ Wavelength Filter", Electronics Letters, vol. 23, No. 11, pp. 572–574, May 1987.

Heismann, F., et al., "Wavelength–Tunable Electrooptic Polarization Conversion in Birefringent Waveguides", IEEE Journal of Quantum Electronics, vol. QE–24, No. 1, pp. 83–93, Jan. 1988.

Holzman, J., et al., "Ultrafast All–Optical Modulation of Infrared Radiation Via Metal–Semiconductor Waveguide Structures", IEEE Journal of Quantum Electronics, vol. 35, No. 4, pp. 583–589, Apr. 1999.

Jayaraman; V., et al., "Theory, Design, and Performance of Extended Tuning Range Semiconductor Lasers with Sampled Gratings", IEEE Journal of Quantum Electronics, vol. 29, No. 6, pp. 1824–1834, Jun. 1993.

Korotky, S., et al., "Mode Size and Method for Estimating the Propagation Constant of Single–Mode Ti:LiNbO$_3$ Strip Waveguides", IEEE Journal of Quantum Electronics, vol. QE–18, No. 10, pp. 1796–1801, Oct. 1982.

Minford, W., et al., "Low–Loss Ti:LiNbO$_3$ Waveguide Bends at $\lambda$=1.3 $\mu$m", IEEE Journal of Quantum Electronics, vol. QE–18, No. 10, pp. 1802–1806, Oct. 1982.

Noda, J., et al., "Single–mode optical–wavelength fiber coupler", Applied Optics, vol. 17, No. 13, pp. 2092–2096, Jul. 1978.

Liu, B., et al., "Fused InP–GaAs Vertical Coupler Filters", IEEE Photonics Technology Letters, vol. 11, No. 1, pp. 93–95, Jan. 1999.

Liu, P., "LiNbO$_3$ Waveguide Modulator with 1,2$\mu$m Thick Electrodes Fabricated by Lift–Off Technique", IEEE Journal of Quantum Electronics, vol. QE–18, No. 10, pp. 1780–1782, Oct. 1982.

Marcatill, E., "Dielectric Rectangular Waveguide and Directional Coupler for Integrated Optics", The Bell System Technical Journal, pp. 2071–2102, Sep. 1969.

Ranganath, T., et al., "Ti–Diffused LiNbO$_3$ Branched–Waveguide modulators: Performance and Design", IEEE Journal of Quantum Electronics, vol. QE–13, No. 4, pp. 290–295, Apr. 1977.

Saitoh, T., et al., "Theoretical Analysis and Fabrication of Antireflection Coatings on Laser–Diode Facets", Journal of Lightwave Technology, vol. LT–3, No. 2, pp. 288–293, Apr. 1985.

Sasaki, H., et al., "Electro–Optic Y–Junction Modulator/Switch", Electronics Letters vol. 12, No. 18, pp. 459–460, Sep. 1976.

Schmidt, R., et al., "Electro–optically switched coupler with stepped $\Delta\beta$ reversal using Ti–diffused LiNbO$_3$ waveguides", Applied Physics Letters, vol. 28, No. 9, pp. 503–506, May 1976.

Soref, R., et al., "Electrooptical Effects in Silicon", IEEE Journal of Quantum Electronics, vol. QE–23, No. 1, pp. 123–129, Jan. 1987.

Taylor, H., "Frequency–Selective Coupling in Parallel Dielectric Waveguides", Optics Communications, vol. 8, No. 4, pp. 421–425, Aug. 1973.

* cited by examiner

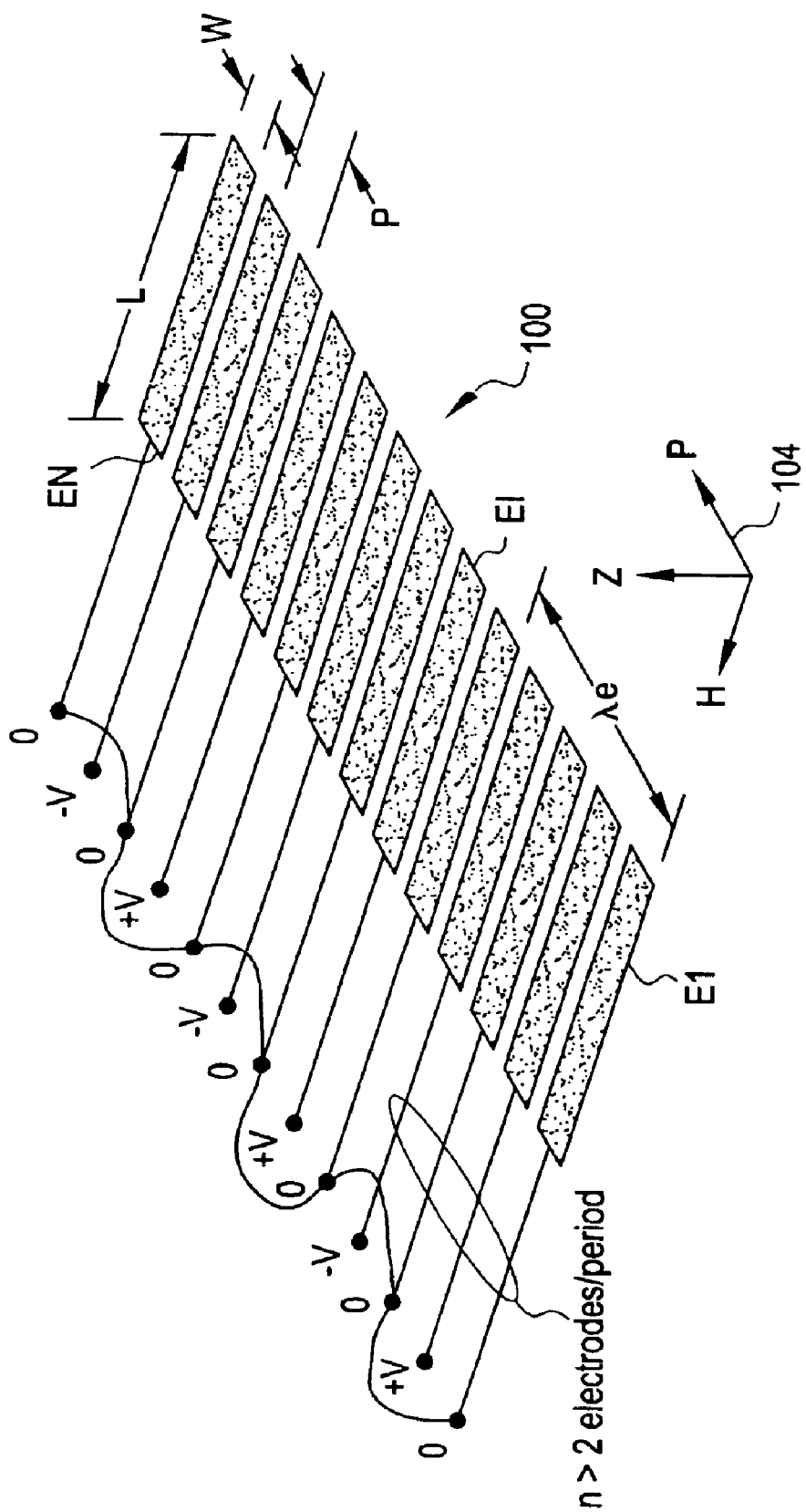

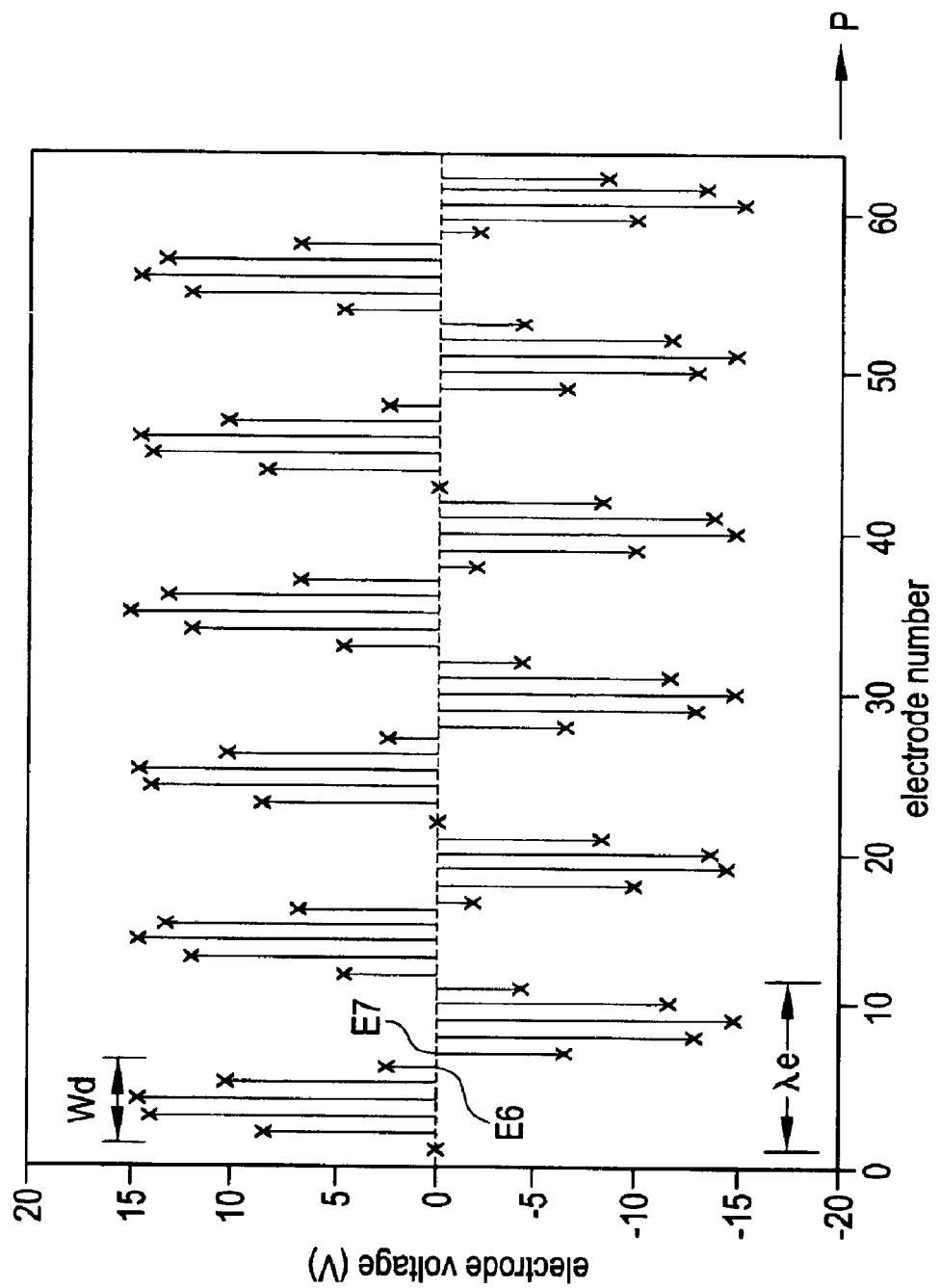

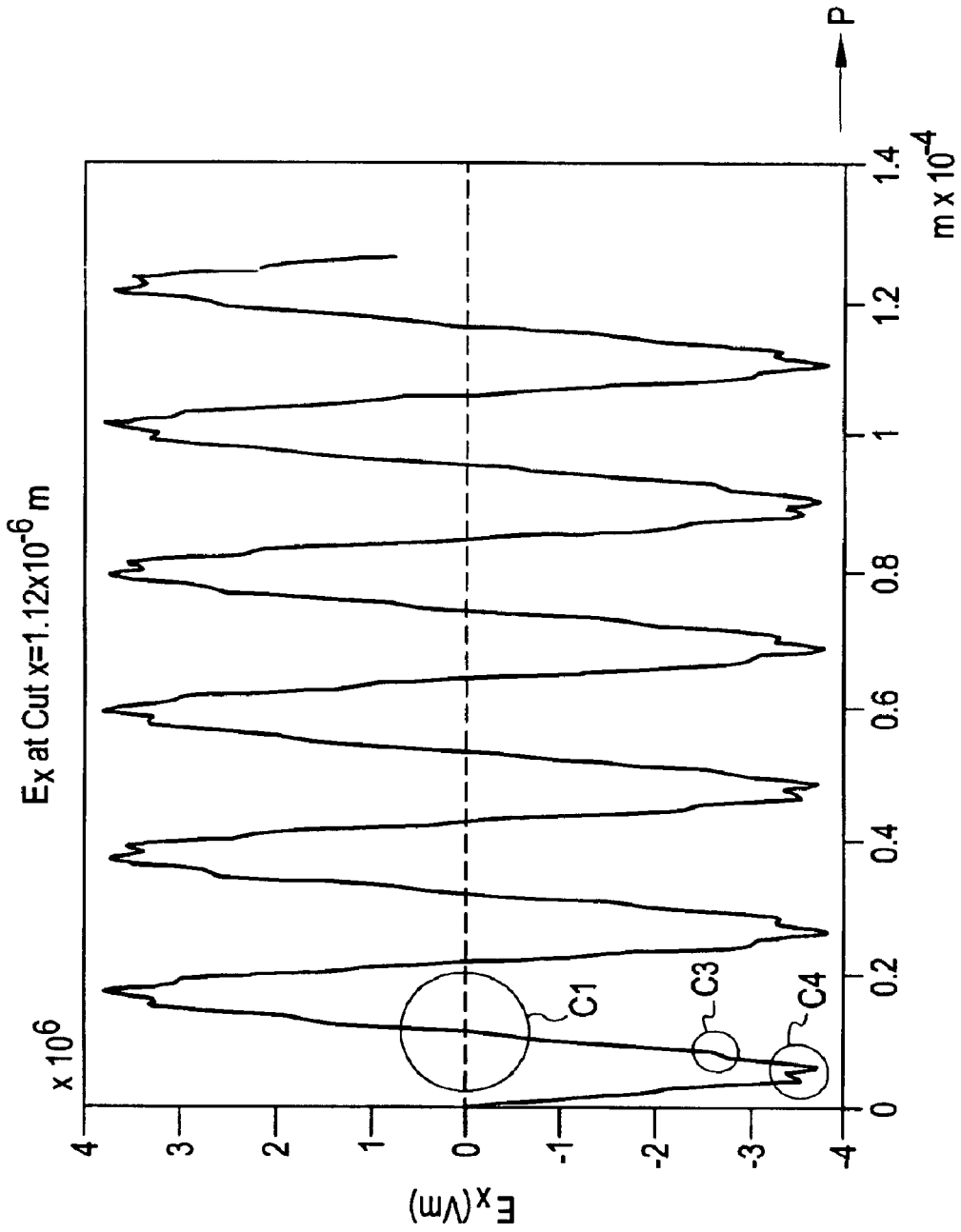

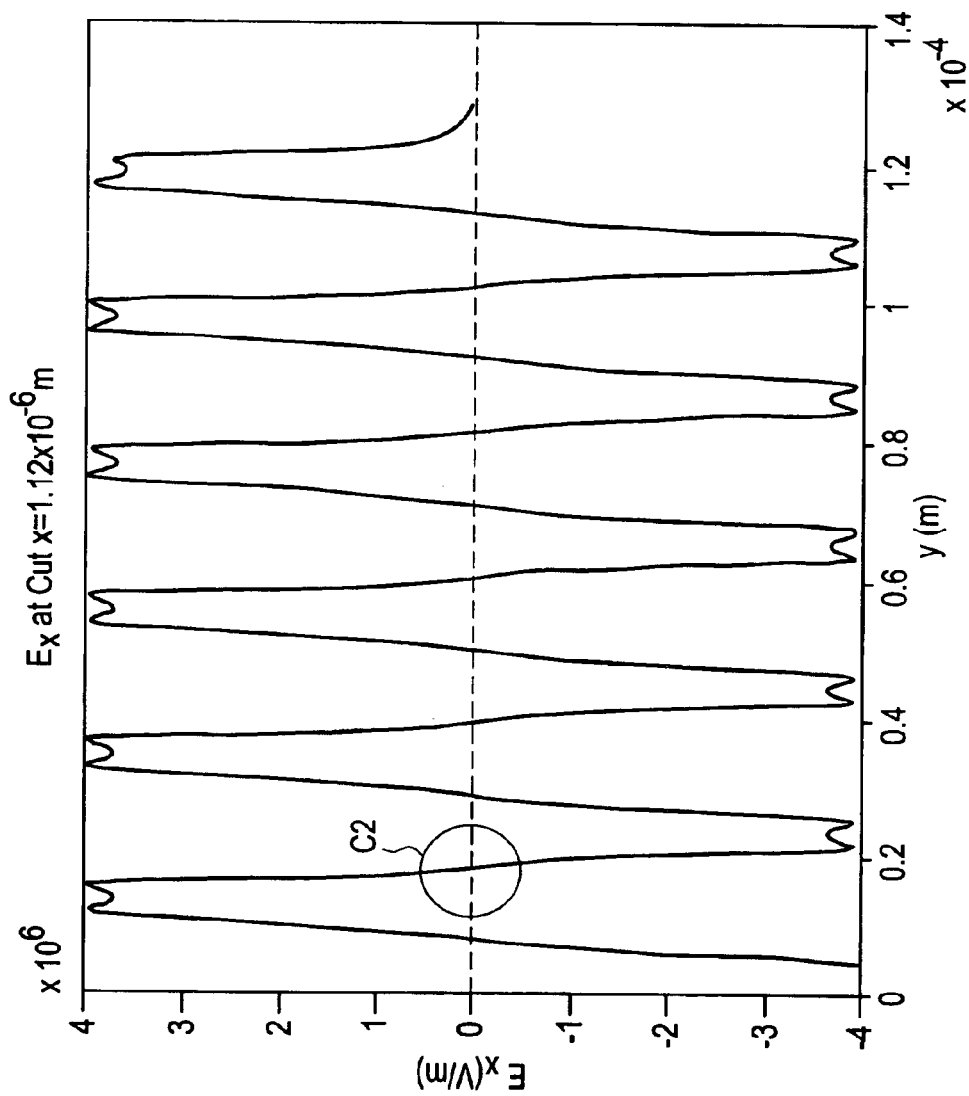

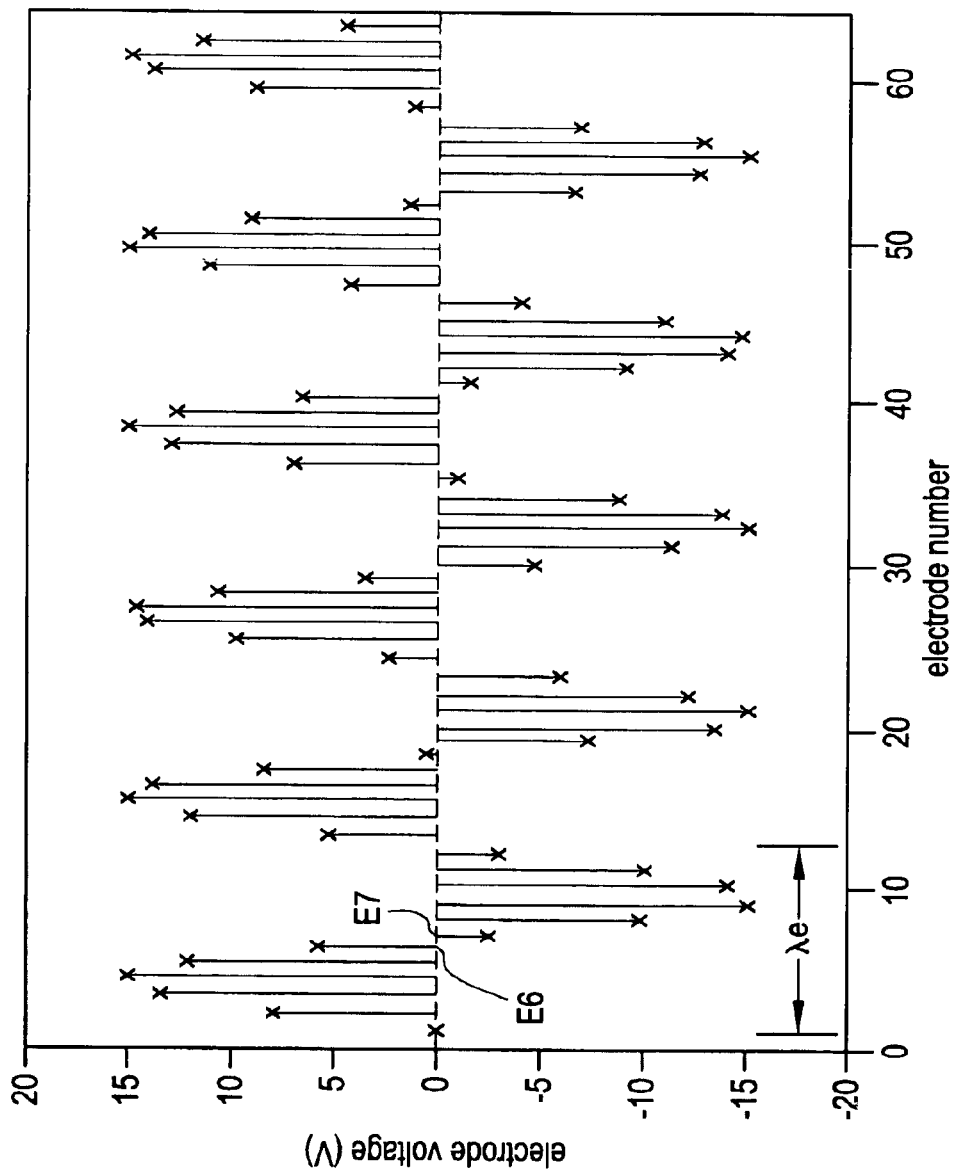

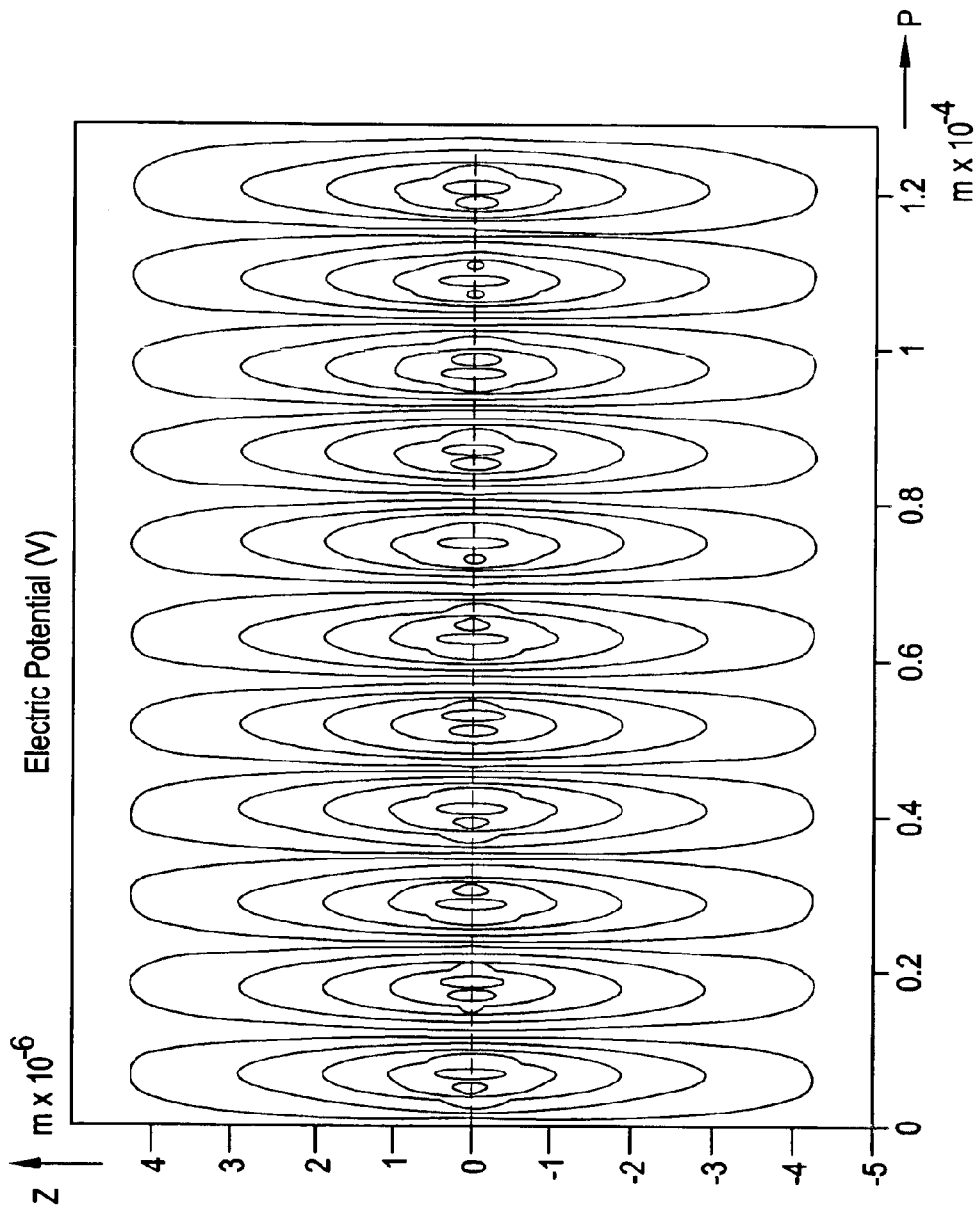

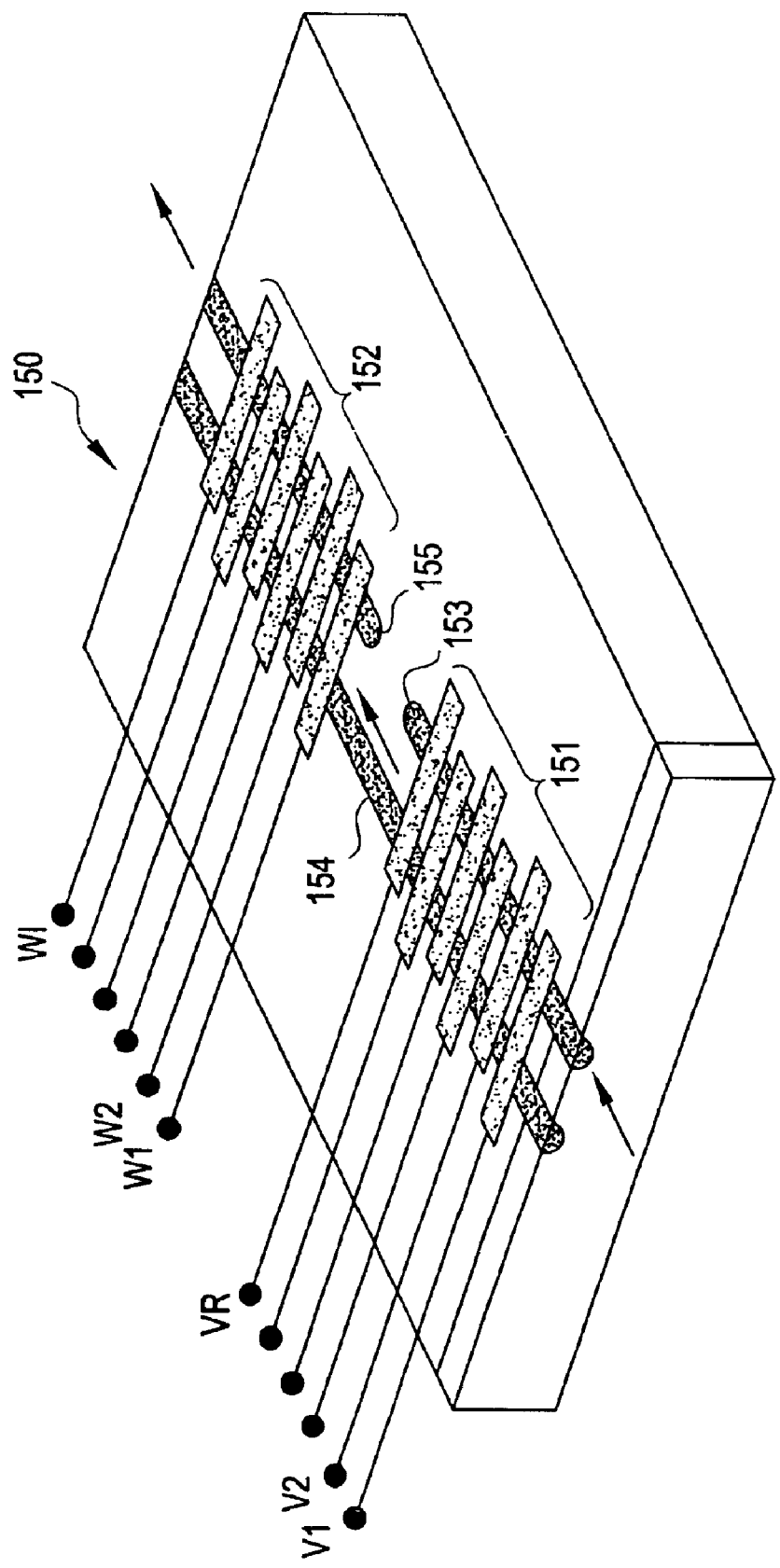

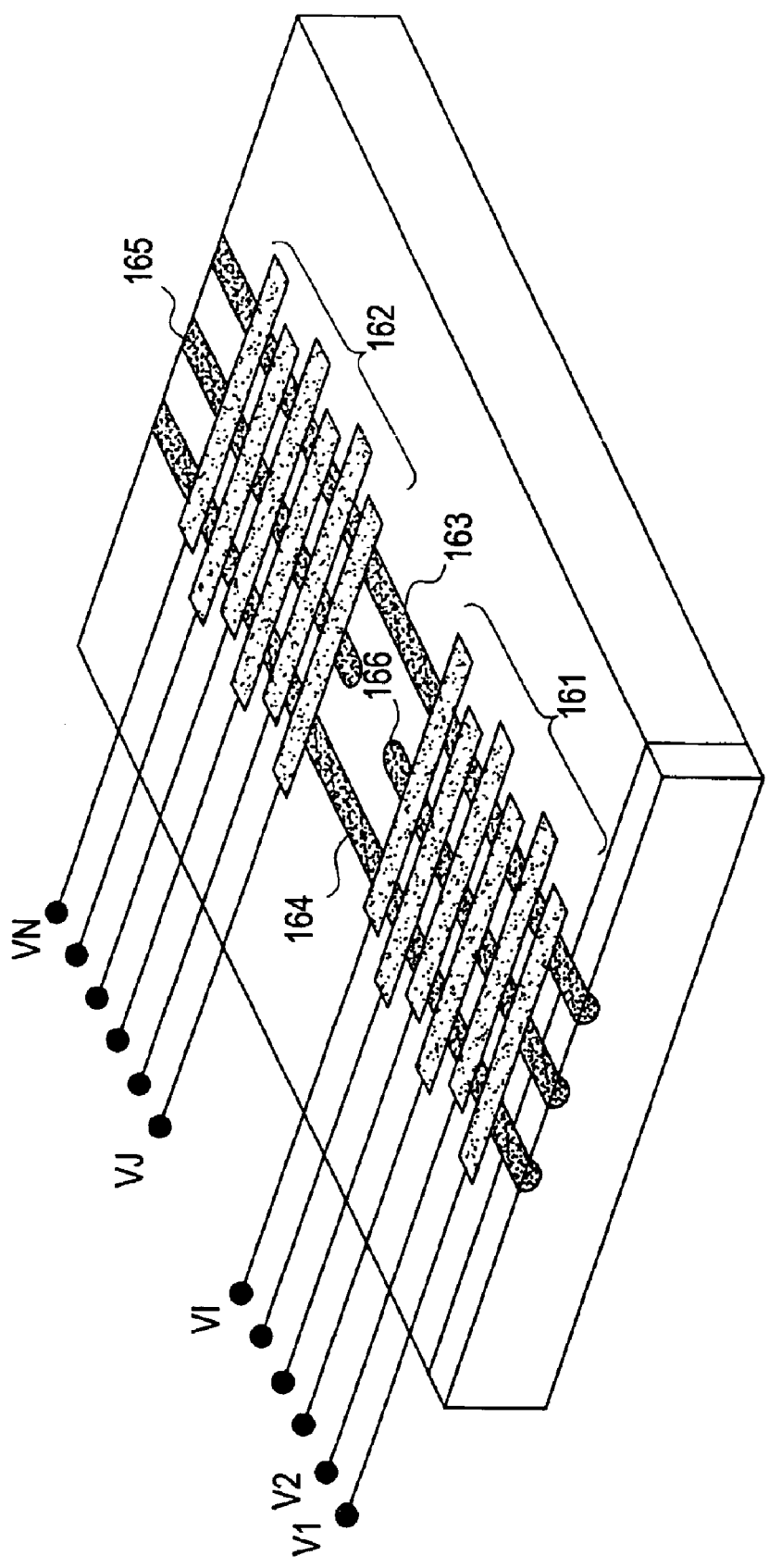

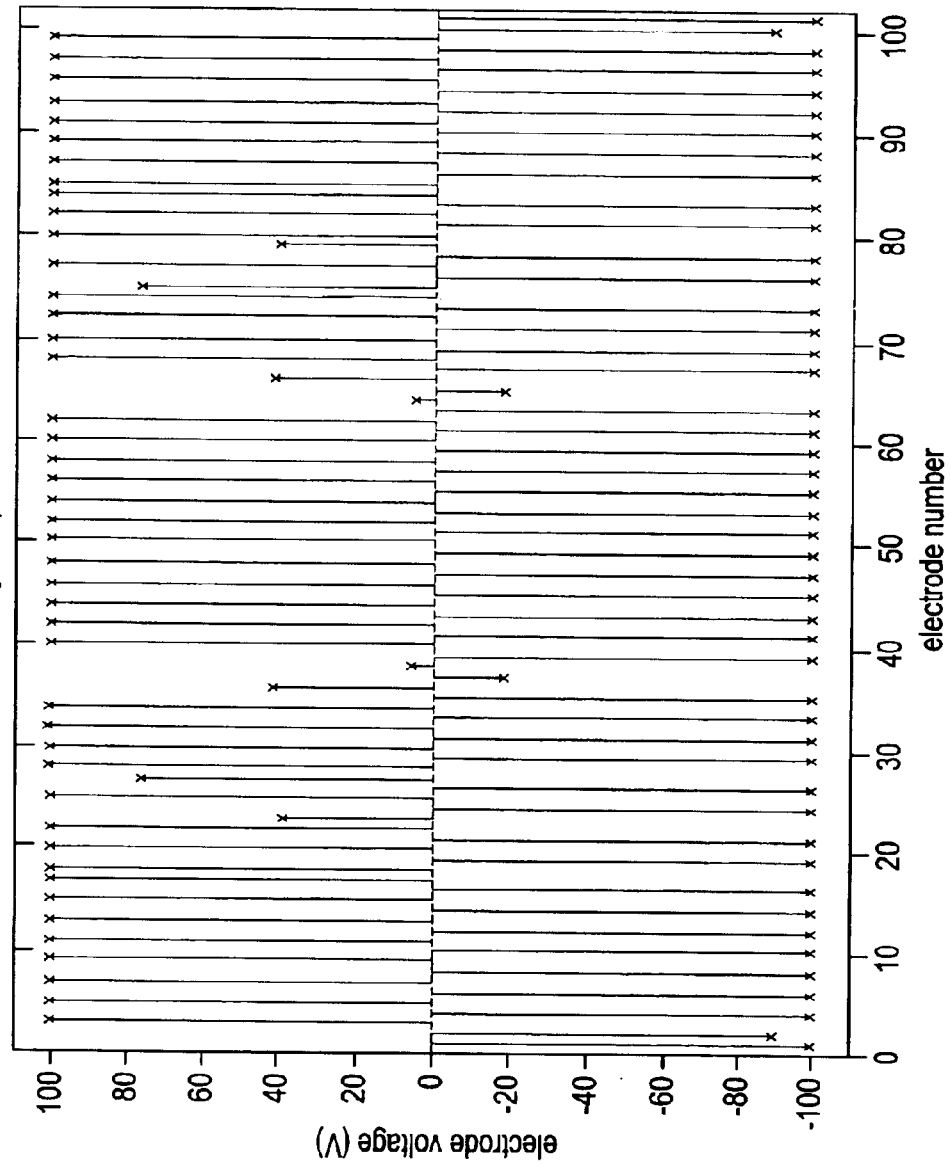

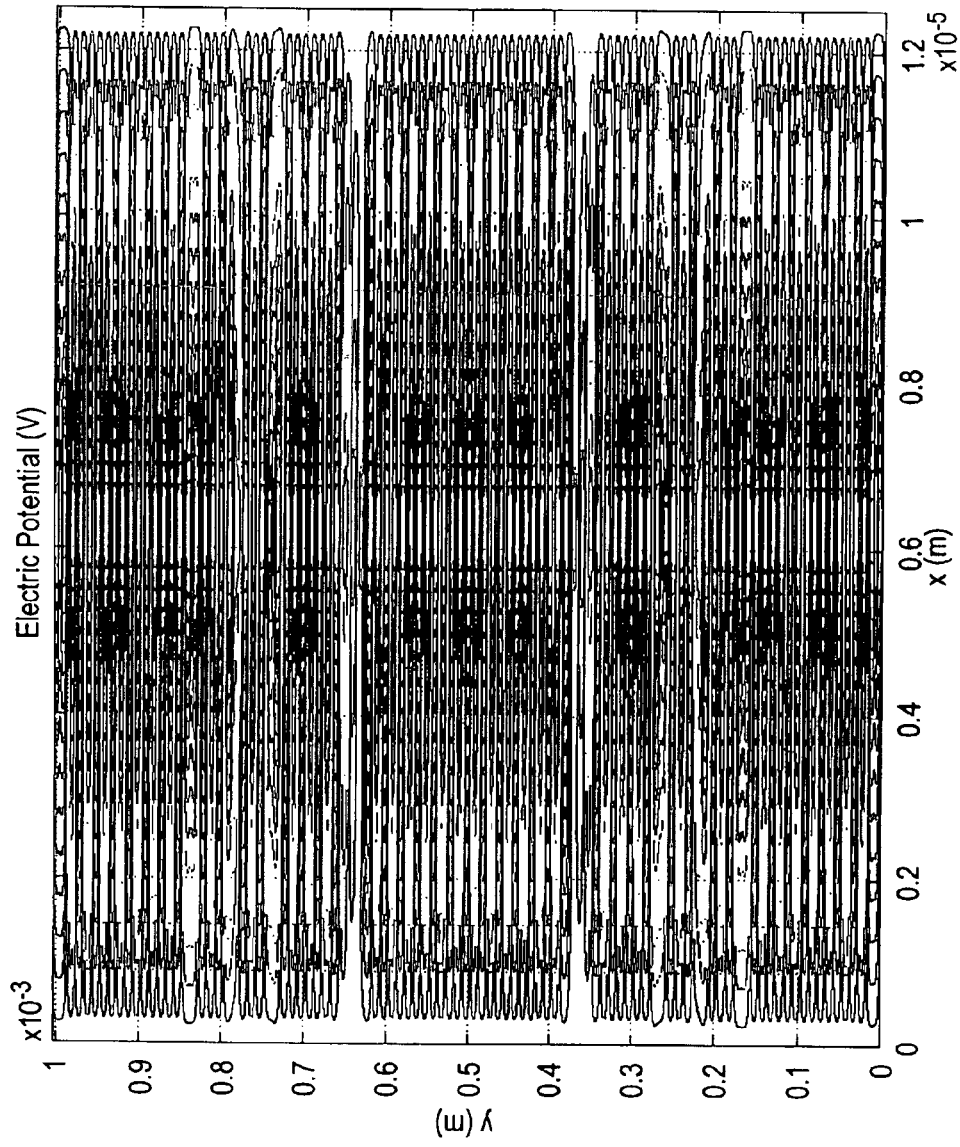

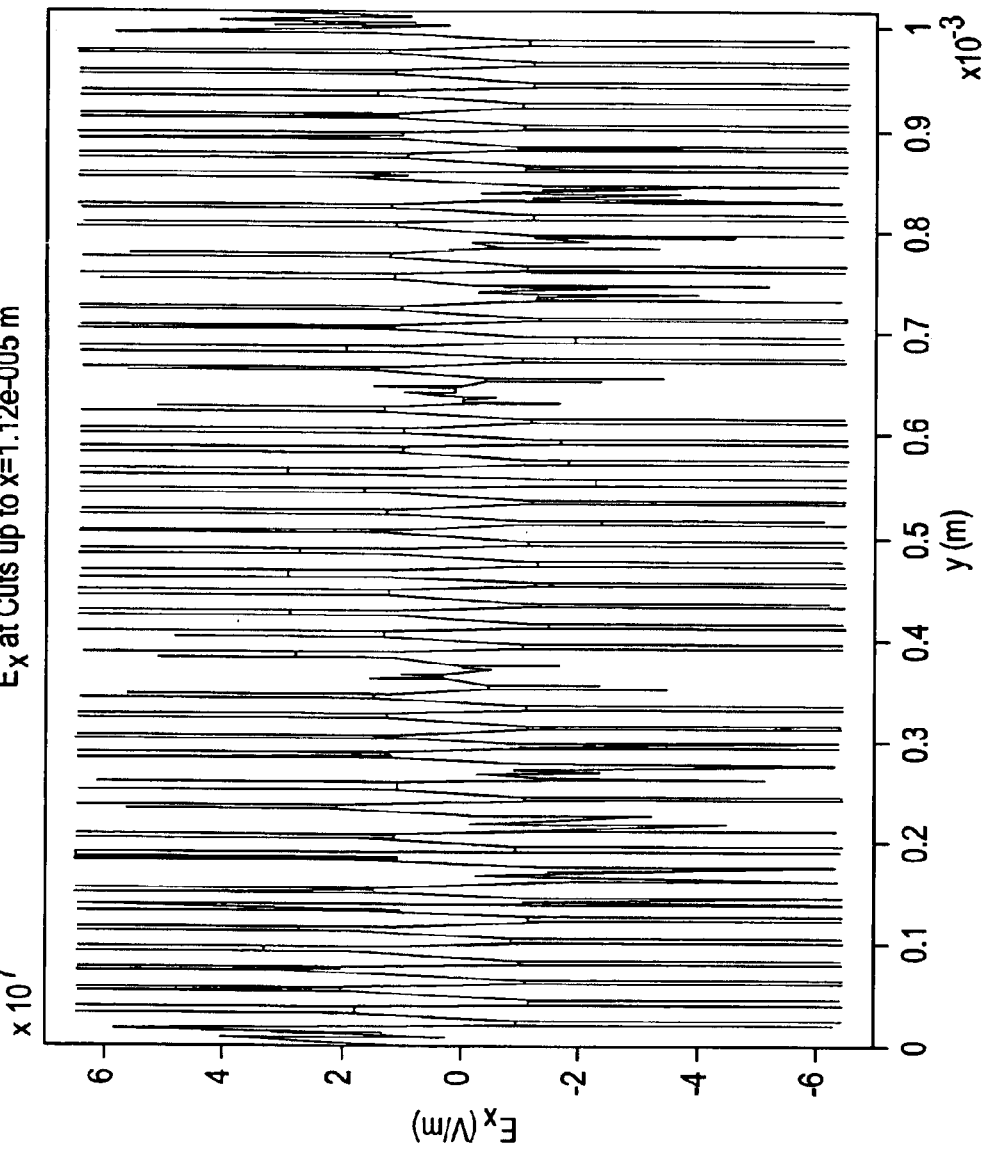

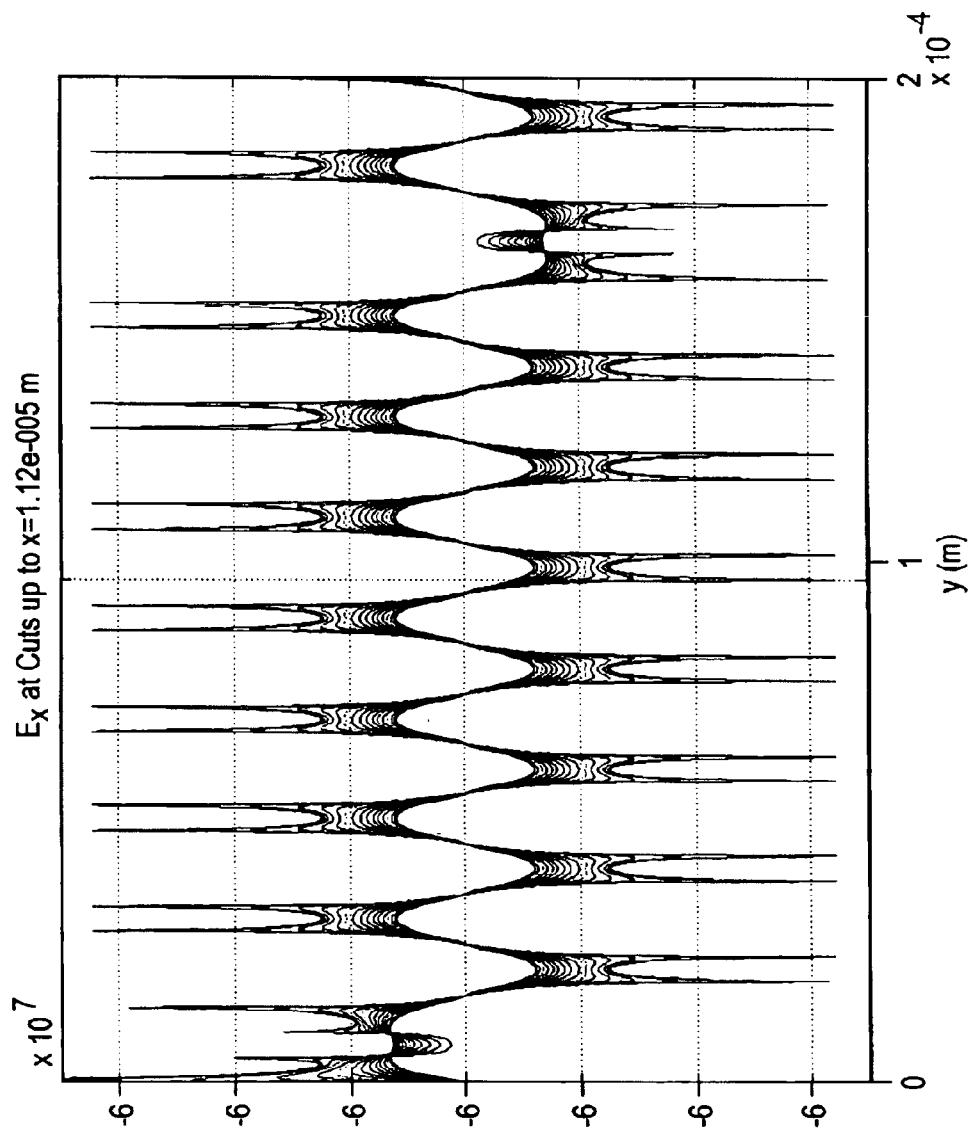

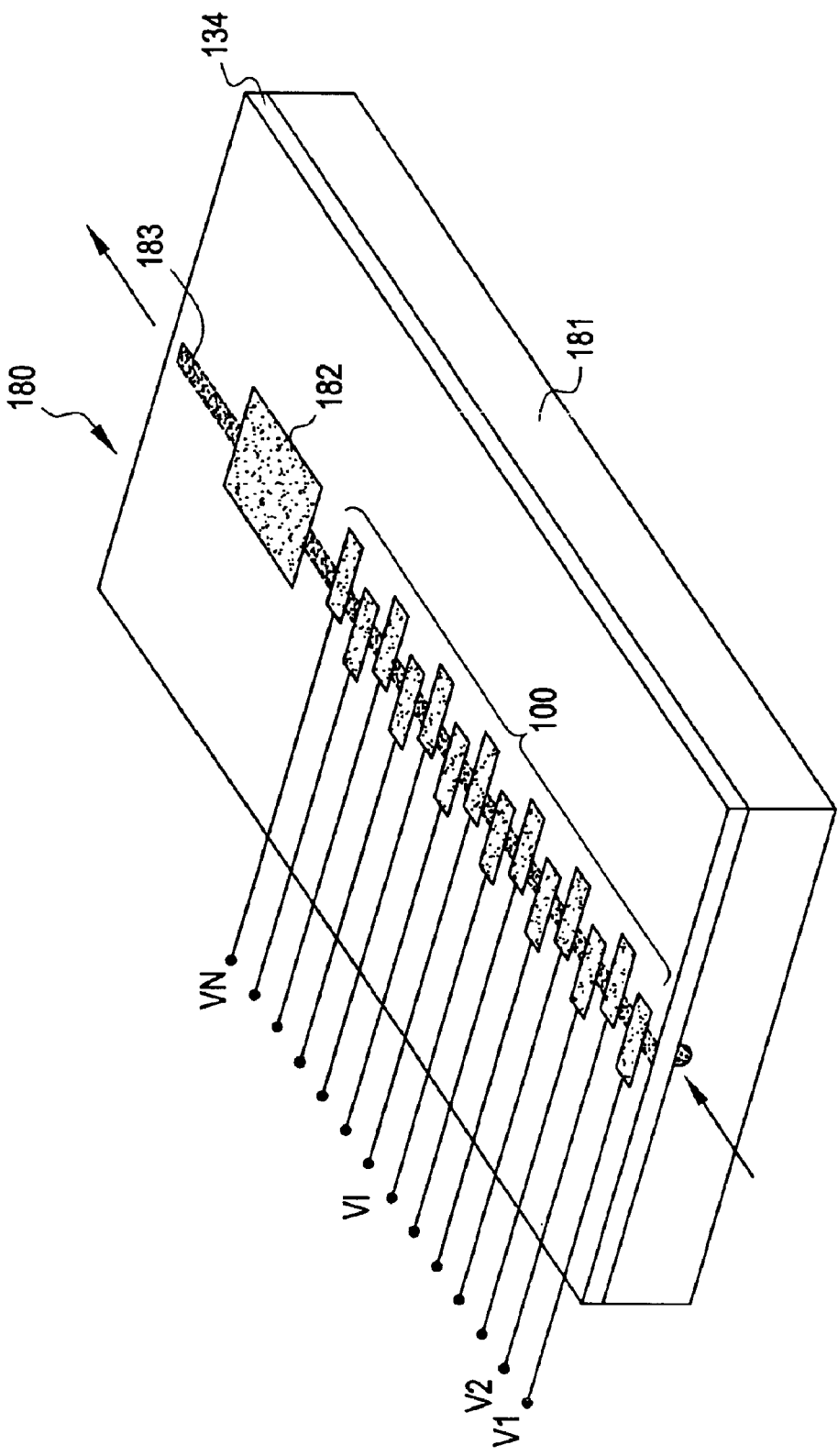

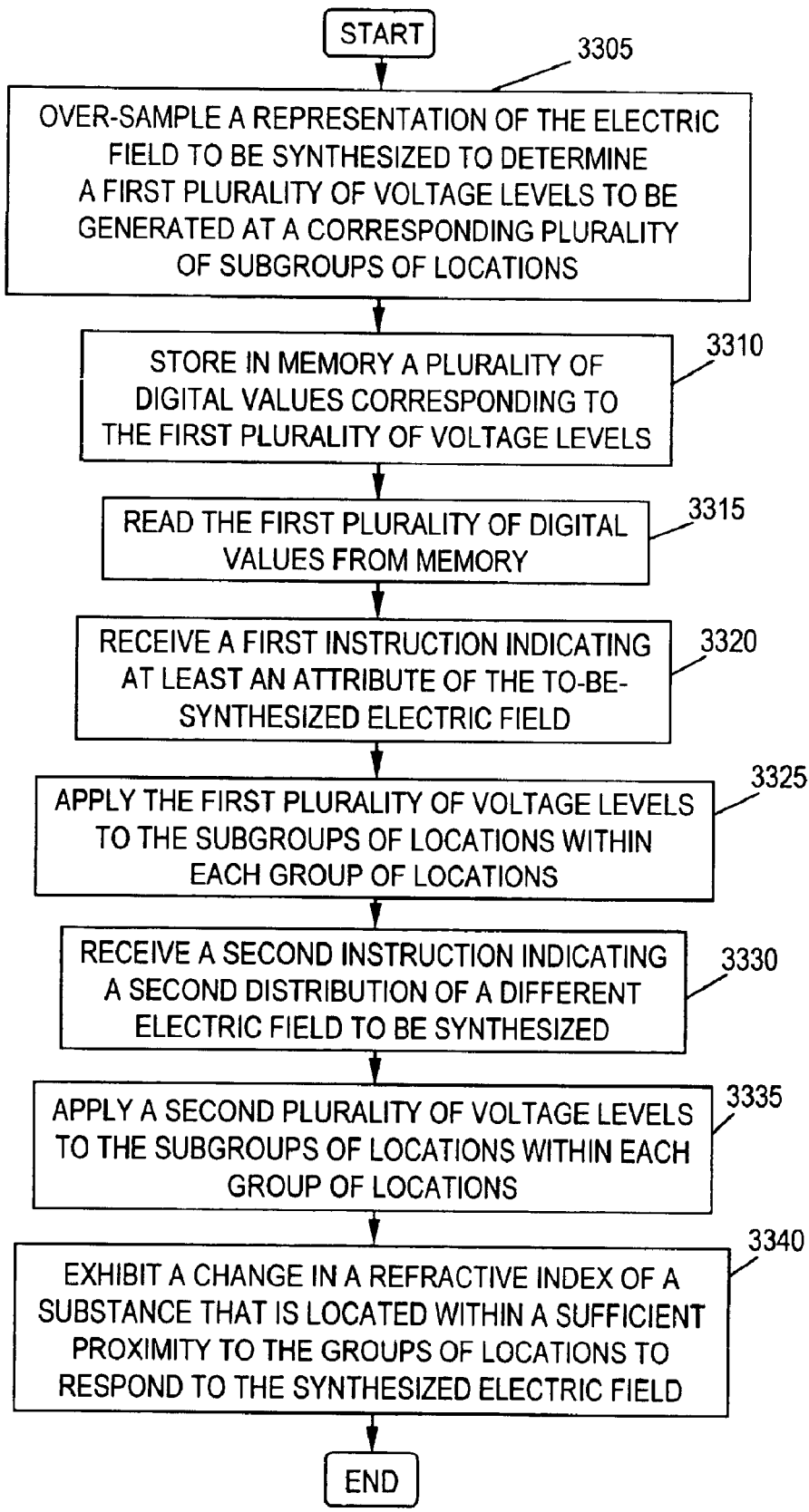

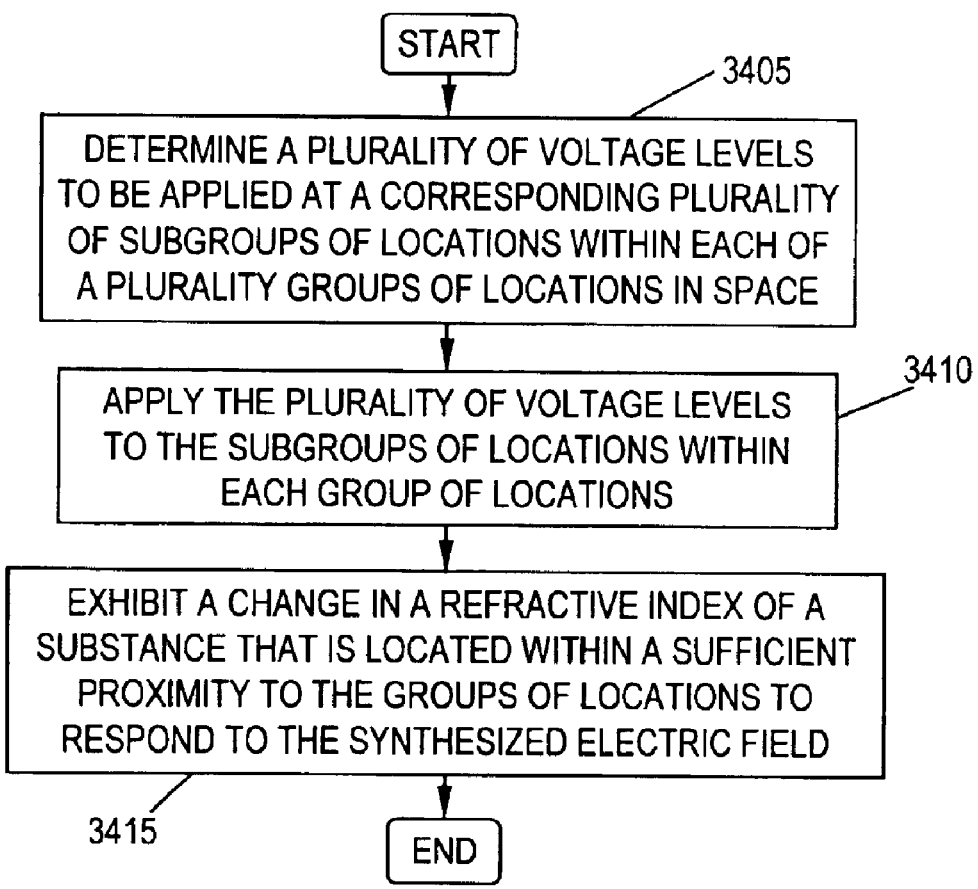

WAVELENGTH AGILE LASER

This application is a continuation-in-part of U.S. patent application Ser. No. 09/954,495, entitled "Wavelength Agile Laser," filed Sep. 10, 2001, the entire contents of which are hereby incorporated herein by reference.

COPYRIGHT NOTICE

A portion of the disclosure of this patent document contains material that is subject to copyright protection. The copyright owner has no objection to the facsimile reproduction by anyone of the patent document or the patent disclosure, as it appears in the U.S. Patent and Trademark Office patent files or records, but otherwise reserves all copyright rights whatsoever.

CROSS-REFERENCE TO ATTACHED APPENDICES

Appendices A, B, and C each contain a listing of computer software code provided as MATLAB® files "PFE.M," "PFE_HELP.M," and "PFILT.M," respectively, and are a part of the present disclosure and are incorporated by reference herein in their entireties. MATLAB® software is available from The MathWorks, Inc. of Natick, Mass.

BACKGROUND

1. Field of the Invention

The present invention relates to fiber optics. More particularly, the present invention relates to a method and system for synthesizing an electric field using a wavelength agile laser.

2. Background Information

The evolution of telecommunications networks has been such that the complexity and speed of networks in general have greatly increased. In addition to the development of network design, new and novel optical components are being brought to bear on the issues of speed and reach of optical channels. A particular aspect of network design is the need for dynamic configuration of networks. For example, in an optical mesh many circuits based on an assignation of a specific wavelength are set up and reconfigured either for reasons of efficient traffic engineering or restoration. For a detailed description of optical network design, see "Journal of Lightwave Technology, Special Issue on Optical Networks," December 2000, vol. 18, pages 1606–2223, inclusive.

An enabling device for such next generation optical networks is a wavelength agile laser. A wavelength agile laser (hereinafter "laser") is a lasing device that can be tuned to either any discrete wavelength or arbitrarily tunable (or continuously tunable) within a given wavelength window. For telecommunications applications involving dense wavelength division multiplexing (hereinafter DWDM), the wavelength range used is in what is known as the "third window." The third window is the spectral region within which the attenuation exhibited by the transmission medium (commonly silica glass) is the lowest. Although loosely defined, the third window can be identified to lie in the spectral region from approximately 1500 nm to approximately 1650 nm. Within this window, the designations "S", "C" and "L" represent subdivisions of this spectral region.

A requirement of tunable laser performance is therefore the capability to address the spectral region associated with S, C and L-band wavelengths. A further requirement of a tunable laser is that it is compliant with what is known as the "ITU grid". The ITU grid is a defined standard covering the placement, in frequency space, of optical channels launched onto a fibre. In addition to the wavelength tunability requirements, wavelength agile lasers must exhibit optical specifications compatible with high performance optical transmission. For a detailed description of the structure an optical performance requirements sets on transmission lasers, see J. Gowar, "Optical Communications Systems", Second Edition, Prentice Hall International Series in Optoelectronics, pages 257 to 487, inclusive.

An additional application enabled by tunable lasers is that of hardware restoration of an optical link in the event of the failure of a transmission source(s). A logical link may be assigned a specific wavelength from amongst a stream of optical wavelengths and, in order to protect every link, every wavelength must be protected individually. This leads, therefore, to the need for 100% redundancy in an optical transmission system and a consequent doubling of the equipment cost. The reason for this duplication in equipment is the very limited tunability of existing laser transmission sources. For a detailed description of the semiconductor based solutions to tunable laser solutions, see V. Jayaraman et al., "Theory, Design and Performance of Extended Range Semiconductor Lasers with Sampled Gratings", IEEE Journal of Quantum Electronics, vol. 29, no. 6, June 1993. In addition, see Session TuL from Optical Fibre Communications 2000, (OFC 2000) Technical Digest, p. 177 onwards.

One approach to an electro-optically controllable filter is the work of Alferness et al., as described in U.S. Pat. Nos. 4,384,760, 4,390,236, 4,533,207, 4,667,331, and 4,728,168. A device of this type can also be seen in the article entitle "Narrow Linewidth, Electro-Optically Tuneable InGaAsP—Ti:LiNbO$^3$ Extended Cavity Laser" by F. Heisman et al., Applied Physics Letters, 51, page 64 (1987).

Wavelength selected polarization mode coupling is described in U.S. Pat. No. 5,499,256 issued to Bischel et al. Electrode structures disclosed in the above-described patents are similar to the ones disclosed in U.S. Pat. No. 3,877,782.

SUMMARY OF THE INVENTION

A method and system are disclosed for synthesizing an electric field. In accordance with exemplary embodiments of the present invention, an electric field that changes across a distance in space is synthesized by applying voltage levels at several locations independently of one another.

According to an aspect of the present invention, a plurality of voltage levels are applied at a number of subgroups of locations within each of a plurality of groups of locations that are placed successively one after another along a predetermined direction, thereby to synthesize an electric field that changes along the predetermined direction. Application of voltage levels independently of one another at the subgroups of locations and across the groups of locations allows an electric field that is synthesized to be made periodic or aperiodic. Moreover, such a synthesized electric field can be changed at any time for use in, for example, a tunable laser.

According to an exemplary embodiment, the voltage levels are oversampled, although in an alternative exemplary embodiment the voltage levels need not be oversampled, e.g., if the to-be-synthesized electric field is aperiodic. Furthermore, according to an exemplary embodiment, the electric field is used to change the refractive index of an electro-optic substance (such as, for example, lithium niobate) in an optical filter to form a multi-mode laser.

However, in an alternative exemplary embodiment, no electro-optic substance is used with the electric field.

An optical filter formed by synthesis of an electric field according to exemplary embodiments of the present invention can be used in any telecommunication device, such as an optical add drop multiplexer, an optical switch, or the like. Such an optical filter can also be used for dynamic power balancing, dynamic gain equalization, or the like.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIGS. 2A and 2C illustrate, in perspective views, two implementations of electrodes of FIG. 1A to which are applied a number of voltage levels that change in space as a function of distance, in accordance with an exemplary embodiment of the present invention.

FIGS. 3, 7, 10, and 20A illustrate, in graphs, sets of voltage levels to be applied to the electrodes of FIG. 1A, in accordance with an exemplary embodiment of the present invention.

FIGS. 6A and 6B illustrate, in graphs, voltage levels applied to and electric fields generated by use of an electrode structure of the prior art.

FIGS. 4, 8, 11, and 20B illustrate, in a contour plot, the electric field generated by application of the voltage levels of the respective FIGS. 3, 7, 10, and 20A as a function of distance along the predetermined direction P in which electrodes E1–EN of FIG. 1A are arranged, in accordance with an exemplary embodiment of the present invention.

FIGS. 5, 9, 12 and 20C illustrate, in a graph, the voltage gradient at fixed distances in the vertical direction directly underneath the electrodes E1–EN of FIG. 1A, in accordance with an exemplary embodiment of the present invention.

FIGS. 16–19 and 21 illustrate, in perspective views, use of an electrode structure of the type illustrated in FIG. 1A, with wave guides of different configurations that may be formed in, for example, an electro-optic substance for use in telecommunication applications, in accordance with an exemplary embodiment of the present invention.

FIGS. 20D and 20E illustrate respectively, in an enlarged view, graphs of FIGS. 20B and 20C, in accordance with an exemplary embodiment of the present invention.

FIG. 33 is a flowchart illustrating steps for synthesizing an electric field, in accordance with an alternative exemplary embodiment of the present invention.

FIG. 34 is a flowchart illustrating steps for synthesizing an electric field, in accordance with another alternative exemplary embodiment of the present invention.

DETAILED DESCRIPTION OF THE PREFERRED EMBODIMENTS

In accordance with exemplary embodiments of the present invention, an electric field that changes across space is synthesized, by applying two or more voltage levels that are controllable independently of one another. In one embodiment illustrated in FIG. 1A, several voltage levels V1–VN are applied to a number of electrodes E1–EN (wherein $1 \leq I \leq N$, N being the total number of electrodes) that (a) are insulated from one another, and (b) are positioned successively one after another along a predetermined direction P.

Figure 1A:
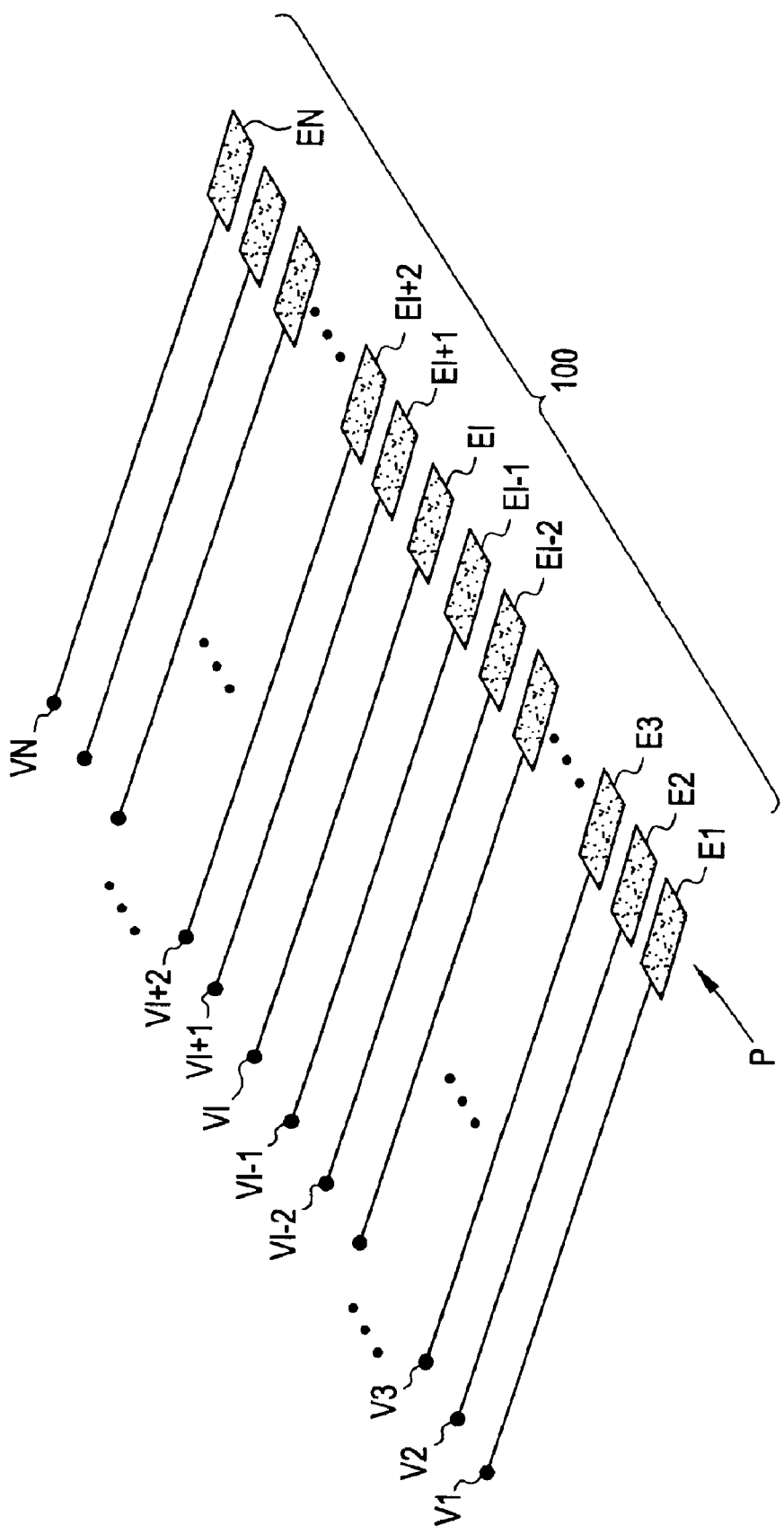
FIG. 1A illustrates, in a perspective view, a number of electrode E1–EN, to which are applied a number of independently controllable voltage levels V1–VN, in accordance with an exemplary embodiment of the present invention.

In FIG. 1A, a common set of index numbers I–N are used, for voltage levels V1–VN as well as for electrodes E1–EN, to indicate that each electrode EI can be at a different voltage level than every other electrode EJ. Depending on the implementation, voltage levels V1–VN can have either a coarse resolution (e.g., in the limit just two values V1 and V2) or a very fine resolution (e.g., 200 levels, separated by 0.1 volt between adjacent levels).

Application of such voltage levels synthesizes an electric field (not shown in FIG. 1A) that envelopes electrodes E1–EN. The electric field changes in a predetermined manner (defined by voltage levels V1–VN) along the predetermined direction P.

Figure 1B:
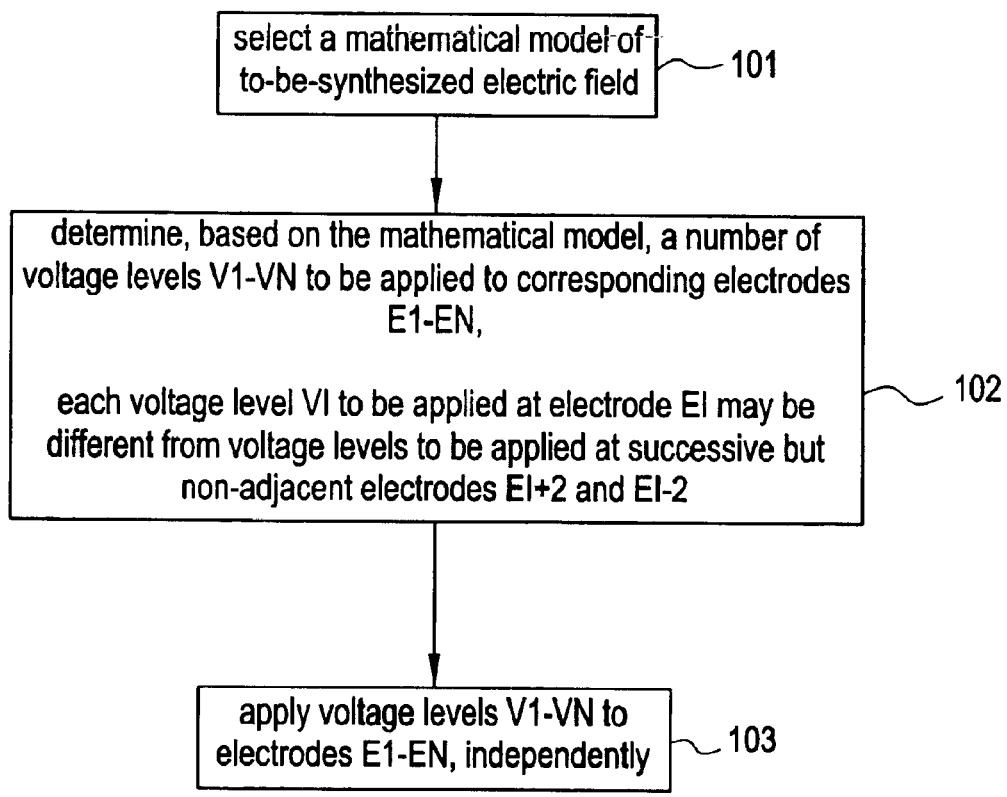
FIG. 1B illustrates, in a high level flow chart, acts performed in a method using the electrodes of FIG. 1A, in accordance with an exemplary embodiment of the present invention.

Voltage levels V1–VN can be determined (see step 102 in FIG. 1B) from a mathematical model of a to-be-synthesized electric field that can be selected (see step 101 in FIG. 1B) by a designer of a device in which the electric field is used. The designer can select a mathematical model of the electric field, based on a number of factors, such as the physical principles involved in using the electric field. Examples include coupling between (a) two forward propagation modes of light and (b) a forward propagation mode and a backward propagation mode.

In one exemplary embodiment, each voltage level VI is determined (based on a preselected mathematical model of the to-be-generated electric field) in step 102 to be any value in a predetermined range, e.g., 0–20 volts. For this reason, each voltage level VI (FIG. 1A) is controllable independently of all other voltage levels to V1–VI−1 and VI+1 to VN. Such independence is in contrast to, for example, U.S. Pat. No. 3,877,782. The independence in application of voltage levels to electrodes of an array of the type described herein eliminates the need to change the spatial distance between electrodes of the type described in U.S. Pat. No. 3,877,782 to synthesize electric fields of different periods or even aperiodic electric fields.

In other embodiments, voltage level VI can be constrained, for example, to be the same as another voltage level at another electrode as long as it is independent of at least (a) the adjacent voltage levels VI+1 and VI−1 that one applied at preceding and following electrodes EI+1 and EI−1 and (b) the successive but non-adjacent voltage levels VI+2 and VI−2. The respective electrodes EI+2 and EI−2 are successive but non-adjacent to electrode E1, because there is an intervening electrode, namely electrode E1+1 or EI−1, respectively. For this reason, usage of voltage levels in such other embodiments is also different from usage on the voltage levels described in U.S. Pat. No. 3,877,782.

Independent control of voltage levels applied at successive adjacent and non-adjacent electrodes allows the electric field that is synthesized (by application of these voltages) to be made periodic or aperiodic in space, depending on the values of VI−2, VI−1, VI, VI+1, and VI+2. Such a synthesized electric field can be changed at any time, simply by changing the voltage levels being applied.

Therefore, an electric field that is synthesized as described above can be re-synthesized at any time, for use in, for example, a tunable laser. Such re-synthesis of the electric field can be performed, for example, in response to a feedback signal that is indicative of an effect of the electric field, such as the power of a tunable laser at a specified wavelength, for use in, e.g., telecommunications.

In one exemplary embodiment, the voltage levels V1–VN (FIG. 1A) that are determined from a mathematical model as described above are oversampled. However, according to an alternative exemplary embodiment, the voltage levels V1–VN need not be oversampled, for example, if the to-be-synthesized electric field is aperiodic. Oversampled voltage levels represent values that are more in number N than a minimum number required to define the highest frequency component in the to-be-synthesized electric field (also called the "desired" electric field).

If voltage levels are applied to electrodes E1–EN that are to be spaced apart from one another at a regular distance in the predetermined direction P, then a desired electric field with a highest frequency component of frequency f requires a minimum spatial electrode frequency of 2f, according to the Nyquist criterion. Therefore, in one exemplary embodiment, the spatial frequency of electrodes E1–EN is selected to be greater than 2f, so that the oversampling ratio is greater than 1.

The spatial frequency of the highest frequency component in an electric field, when used to generate Bragg reflection (as discussed below) can be, for example, 4 million/meter, and, when used for polarization mode conversion (also discussed below), can be, for example, 1 million/meter. Such electric fields can be generated with a pattern having 100,000 electrodes/meter. The amount of oversampling that is needed (and therefore the electrode density) is chosen by a designer, based on the type of device to be built.

Oversampled voltage levels are obtained, in one implementation, from a mathematical representation (e.g., by use of a formula programmed into any type of computer system, such as, for example, a personal computer) of a distribution in space of the desired electric field. In an example illustrated in FIG. 2A, the following formula represents the electric field to be synthesized:

$$VI = V^* \cos [(I/2)^* \pi] \qquad (1)$$

wherein VI is the voltage level to be applied at electrode E1, +V to −V is the range of voltage levels that can be applied and I is an index number of the electrode EI, in a relative order of electrodes E1–EN along the predetermined direction P. As noted above, index number I starts at 1 and is successively incremented once per electrode until N is reached.

As seen from equation (1) above, the voltage levels V1–V4 to be applied to the first four electrodes E1–E4 are 0, +V, 0, and −V respectively. In this example, the number of electrodes per period is 4. In contrast, the Nyquist criterion for defining the same electric field requires only 2 electrodes per period in this example, so that the oversampling ratio is 2. The same electric field can be oversampled at any oversampling ratio F by using the following formula to generate voltage levels: $VI = V^* \cos([I/F]^* \pi)$.

Figure 2B:
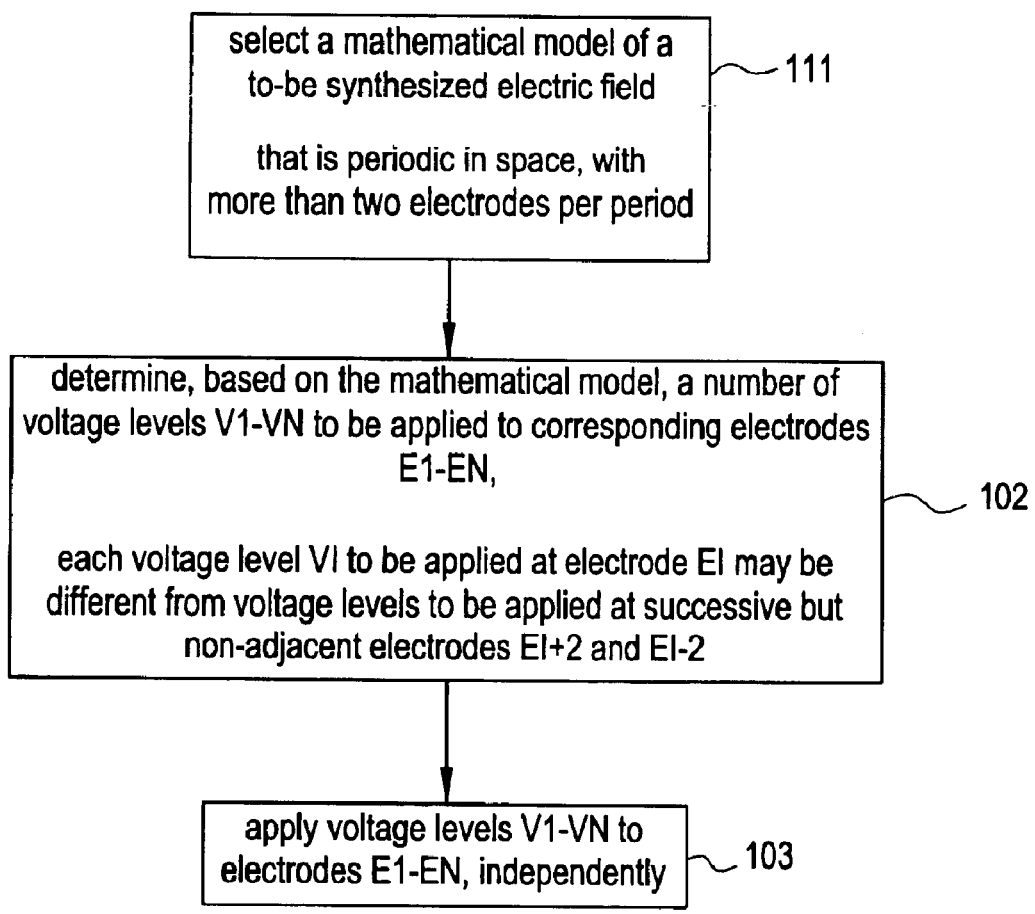
FIG. 2B illustrates, in a flow chart, one implementation of the method illustrated in FIG. 1B, in accordance with an exemplary embodiment of the present invention.

In the example illustrated in FIG. 2A, a mathematical model of an electric field selected by use of equation (1) (see step 111 in FIG. 2B) happens to be periodic in space, although such a model may be aperiodic in other exemplary embodiments. Therefore, an electric field that is synthesized by application of a sequence of independently controllable voltage levels may or may not be designed to be periodic in space, e.g., depending on the device in which the electric field is to be used.

Furthermore, regardless of the electric field being periodic or aperiodic, spacing of electrodes can also be periodic or aperiodic, depending on the implementation. If the spacing of electrodes is aperiodic, this aperiodicity is used with the mathematical model to determine the appropriate voltage levels V1–VN.

Although in FIG. 2A, each electrode EI is illustrated as being at one of the three voltage levels 0, +V and −V, in an alternative embodiment only two such voltage levels may be used. For example, if the voltage levels +V and −V are used, a number of electrodes that are adjacent to one another may carry the same voltage level, e.g. electrodes E1–E3 (FIG. 1A) may carry the same voltage level +V, followed by the next three electrodes E4–E6 carrying the other voltage level −V, with this pattern repeated for all of the remaining electrodes.

Furthermore, depending on the specific electric field to be generated, the number of electrodes that are at the same voltage level can progressively increase or progressively decrease in the predetermined direction P. For example, the first six electrodes can define a waveform as just described (e.g., with the first three electrodes at voltage level +V and the next three electrodes at the voltage level −V), followed by eight electrodes that define a similar waveform that has a larger wavelength (e.g., four electrodes at voltage level +V, followed by four electrodes at voltage level −V). In this example, the next ten electrodes define another similar waveform having a longer wavelength than the just-described first two sets of electrodes (of six electrodes and eight electrodes, respectively).

An electric field synthesized by application of a pattern of voltage levels of the type described in the above examples has an instantaneous spatial frequency that decreases over distance in the predetermined direction P. In one exemplary embodiment, such a field is used to implement a chirped grating (when the electric field is applied to a substance that exhibits a change in the refractive index in response to presence of the electric field).

An electric field having an instantaneous spatial frequency that increases or decreases over distance in the predetermined direction P can also be synthesized by use of voltage levels that have a resolution of more than two, e.g., having a resolution of 0.1 volt, and within a voltage range of 0–20 volts (which means that any voltage level VI can be set to one of 200 different values). Moreover, although FIG. 2C illustrates one waveform for each of the instantaneous spatial frequencies, any number of such waveforms can have the same instantaneous spatial frequency.

Figure 2C:
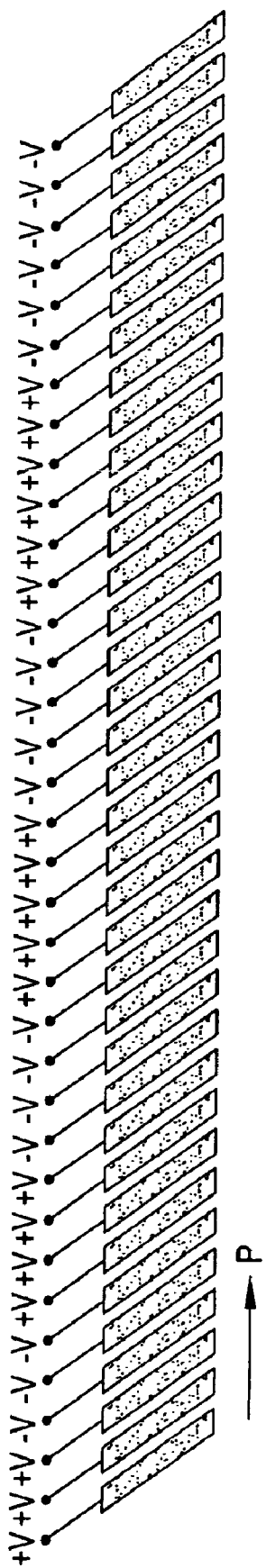

Although in FIG. 2C two voltages +V and −V have been illustrated, other voltages can be used in other embodiments, e.g., +V and 0, where 0 represents the ground reference voltage. Furthermore, although the electrodes are illustrated in FIG. 2C as being spaced at a fixed distance between two adjacent electrodes, such a distance can be changed for example, so that the electrodes are arranged at a progressively larger distance or smaller distance in the direction P.

Furthermore, in yet another embodiment, a waveform is periodic in frequency, i.e., the same waveform is repeated over and over, except that an amplitude of the waveform is progressively increased or progressively decreased, in the predetermined direction P. In one implementation of such an exemplary embodiment, the amplitude of the waveform is progressively increased as an index of the electrodes increases from one to N/2, and thereafter progressively decreased until the index reaches N. Such an implementation is used in, for example, forming a hamming filter of the type described in section 7.4 entitled "Design of FIR Filters by Windowing" in the book "Discrete-Time Signal Processing," by Alan V. Oppenheim and Ronald W. Schafer.

In one exemplary embodiment, the electrodes are spaced at a regular distance between two adjacent electrodes, and a mathematical model of a fixed maximum amplitude waveform that repeats over and over in the predetermined direction P, as illustrated by the following equation, is used to generate the voltage levels to be applied to the electrodes:

$$VI = 15 * \mathrm{Sin}\,([I-1]*\pi/5.25) \qquad (2)$$

Figure 4:
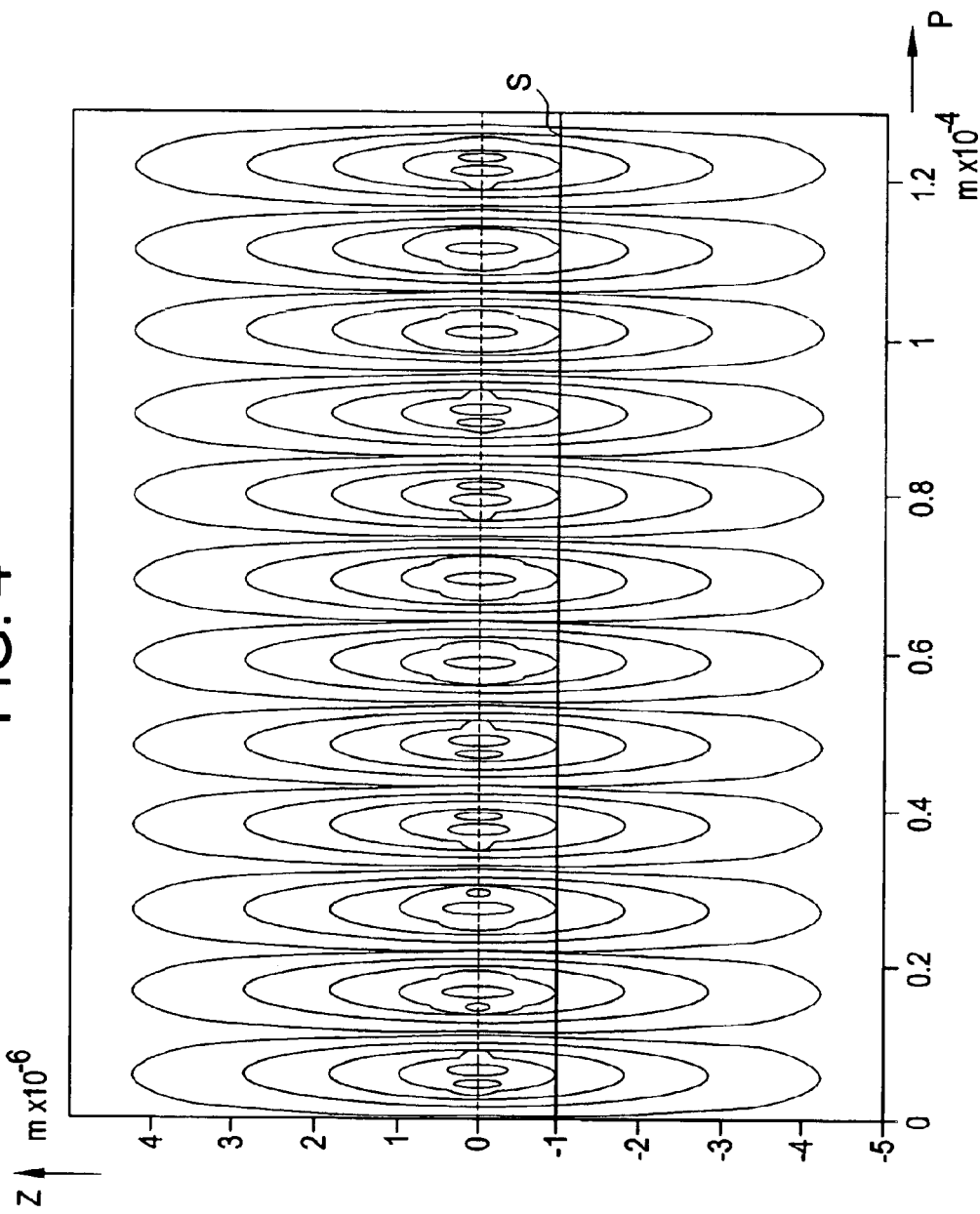

As seen from the above equation (2), an oversampling factor of 5.25 is used to yield a set of voltage levels illustrated in FIG. 3 having a period $\lambda e$ of 10.5 electrodes. If the period $\lambda e$ (FIG. 2A) is 10.5 electrodes (which have a 2 micron pitch), the voltage potential in the space enveloping the electrodes is illustrated in the contour plot of FIG. 4, wherein each contour plot represents 10% decrease in the voltage level. In the contour plot of FIG. 4, the horizontal axis represents the distance in direction P, and the vertical axis represents distance in direction Z (FIG. 2A). A slice S of the contour plot of FIG. 4 at the distance −1 micron (i.e., one micron below the electrodes) yields the graph illustrated in FIG. 5, having the vertical component of the electric field (i.e. $-\partial V/\partial x = Ex$) plotted along the vertical axis of FIG. 5.

Figure 6B:
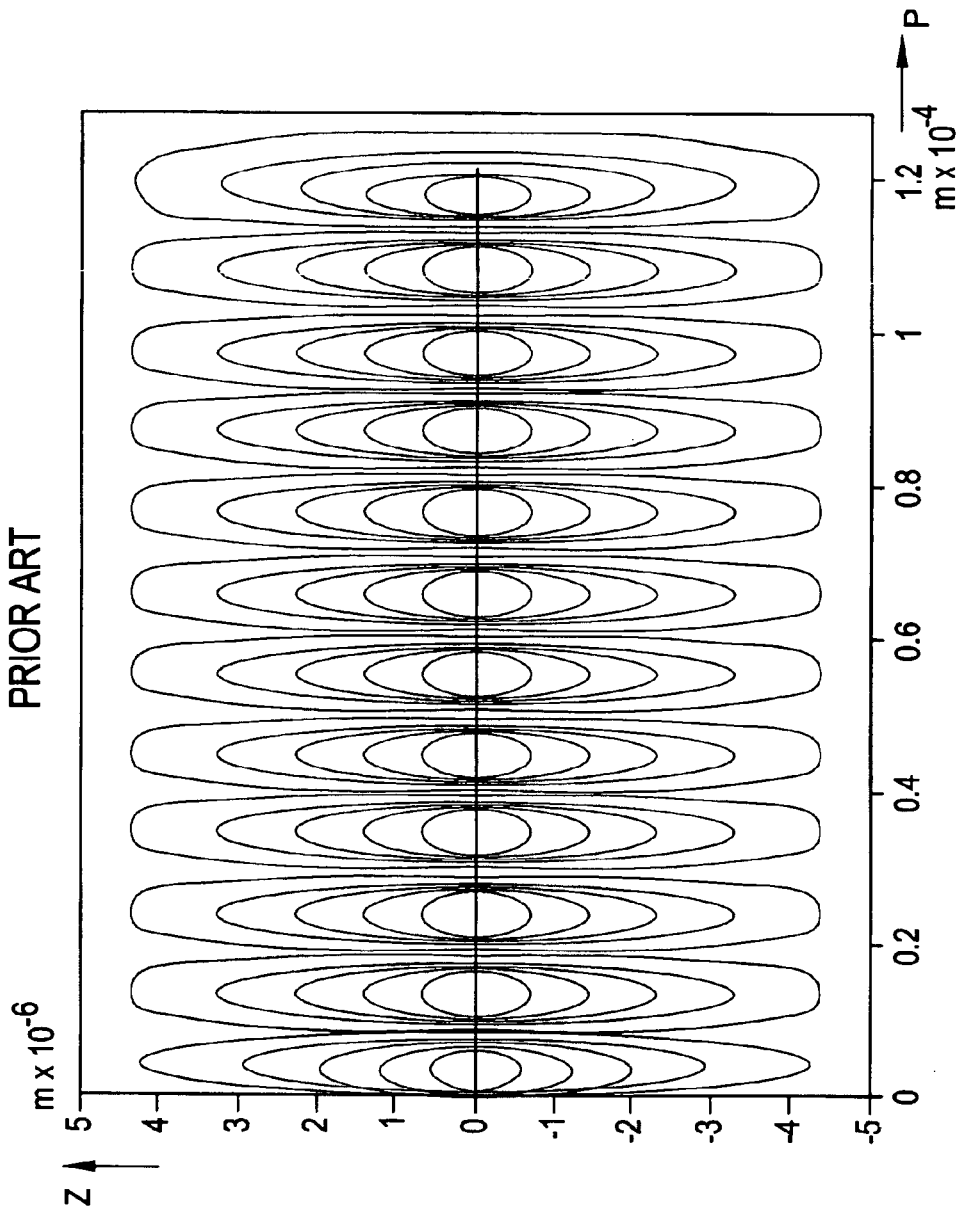

The waveform illustrated in FIG. 5 better approximates a sinusoidal waveform than a corresponding prior art waveform illustrated in FIG. 6A (that is obtained by application of alternating voltages to successive electrodes) so that the oversampling rate is 1 as per the prior art. Specifically, the waveform of FIG. 5 has a constant slope at the electrodes (e.g., in the circle C1), as compared to the waveform of FIG. 6A that has a changing slope (e.g., as illustrated in circle C2). Moreover, as the voltage potential increases away from the electrodes in FIG. 5, there is an increase in the slope (e.g., as illustrated in circle 3C) in contract to an unchanging slope in the corresponding region of FIG. 6A. Furthermore, the electric field pattern obtained by use of the voltage levels of FIG. 6A is fixed as illustrated in FIG. 6B, whereas such a pattern may be changed in accordance with the invention.

The waveform of FIG. 5 is not sinusoidal at the extremities (e.g., as illustrated in circle C4), which represent near field effects, and which may or may not be used, by appropriate design of the distance of a waveguide from the electrodes (e.g., less than 2 micron distance in this example results in a change in refractive index of a waveguide due to near field effects). The near field effects of the waveform in FIG. 5 are no worse than the corresponding near field effects of the prior art waveform in FIG. 6A. For the just-discussed reasons, oversampled voltage levels are applied to the electrodes in one exemplary embodiment of the invention.

Figure 9:
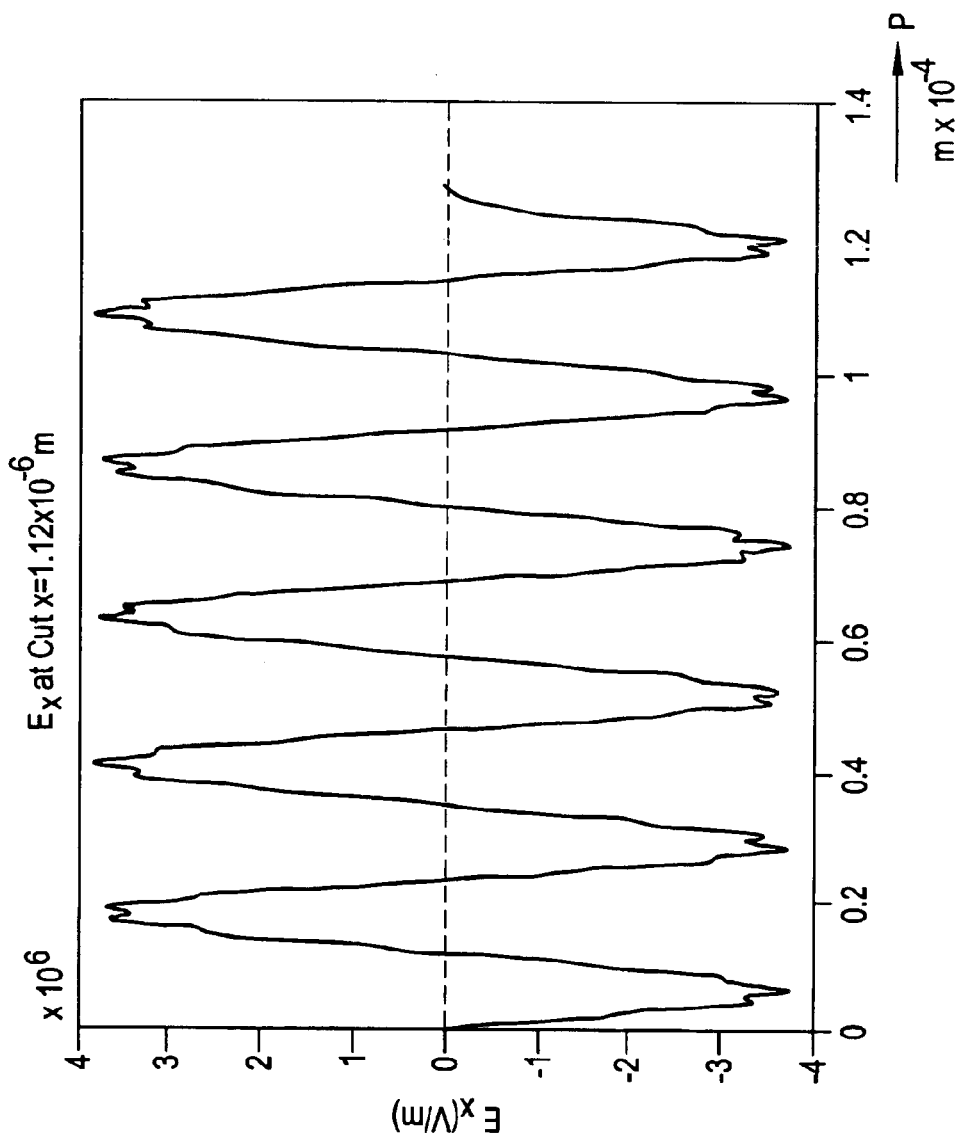

With appropriate applied voltage levels, it is possible to synthesize a wide variety of electric field patterns. For example, as illustrated in FIGS. 7–9, the spatial period of the electric field patterns synthesized by the use of independently controllable voltages as described above can be changed. For example, an initial period of 21 microns can be increased to 2*11.37213455 microns by changing the voltage levels applied to the various electrodes. In this example, as illustrated in FIG. 7, the voltage level applied to electrode E6 has been increased to slightly greater than 5 volts from the previously applied voltage level of around 2.5 volts, and the voltage level applied to electrode E7 has been also increased from a voltage level of approximately −6 volts to a voltage level of approximately −2.5 volts (compare FIGS. 3 and 7).

Figure 10:
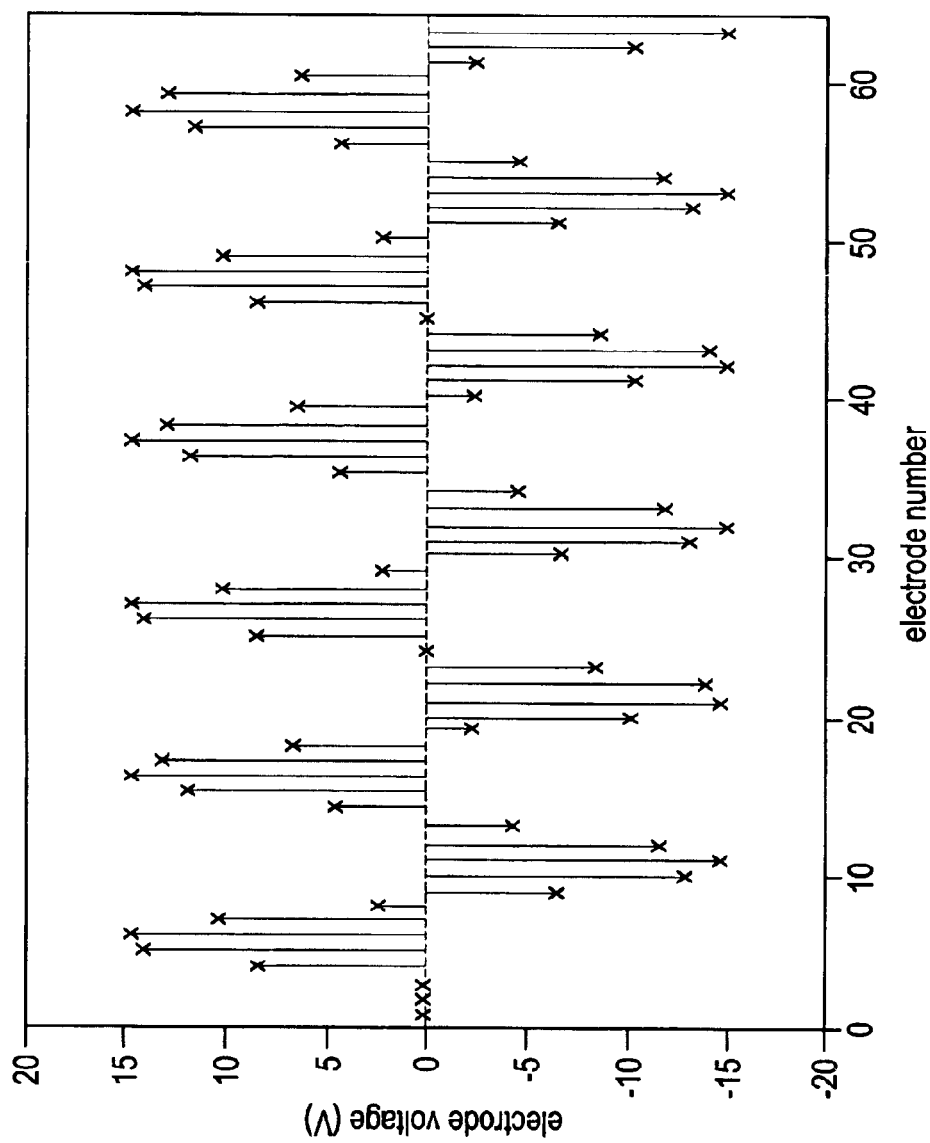
Figure 11:
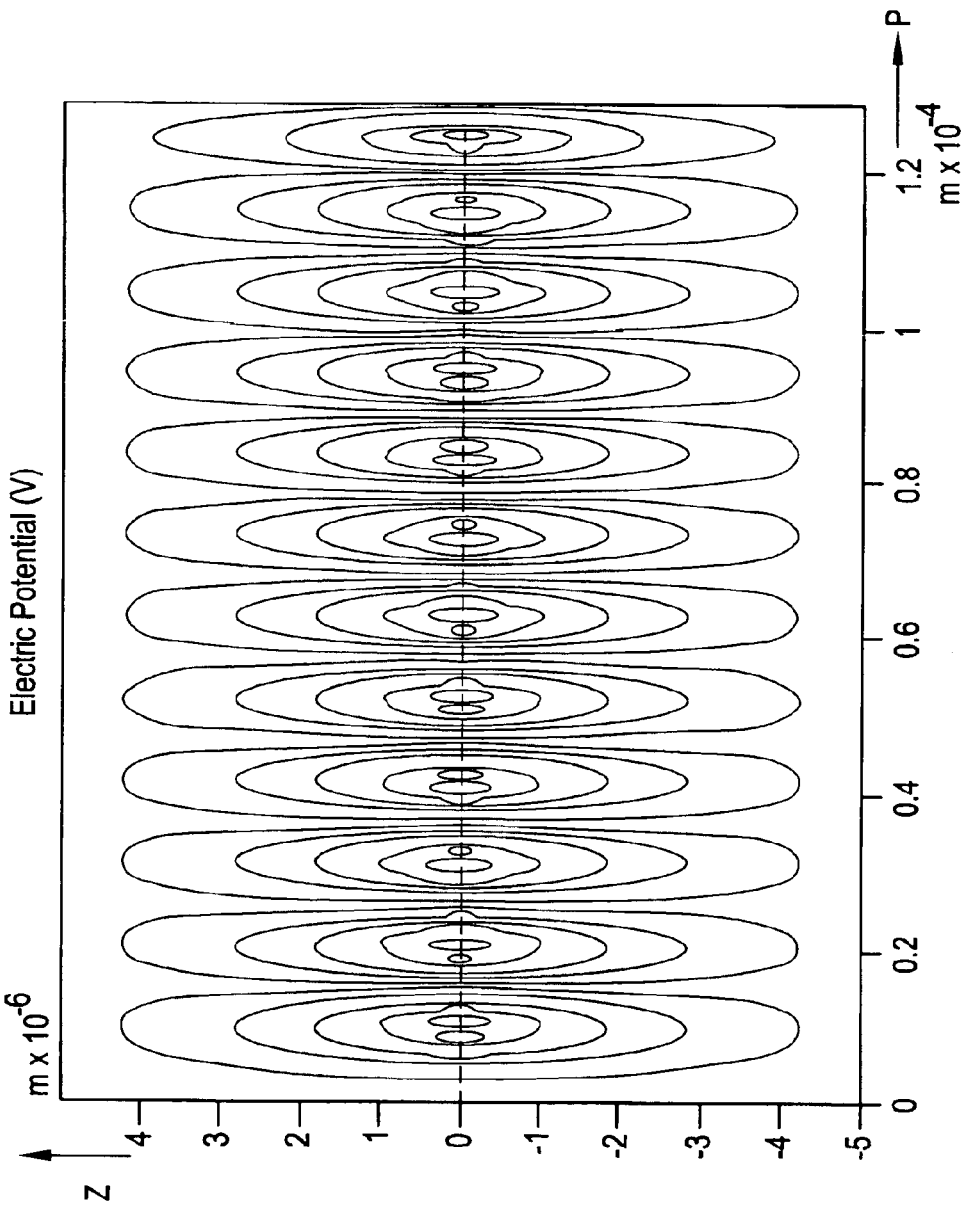
Figure 12:
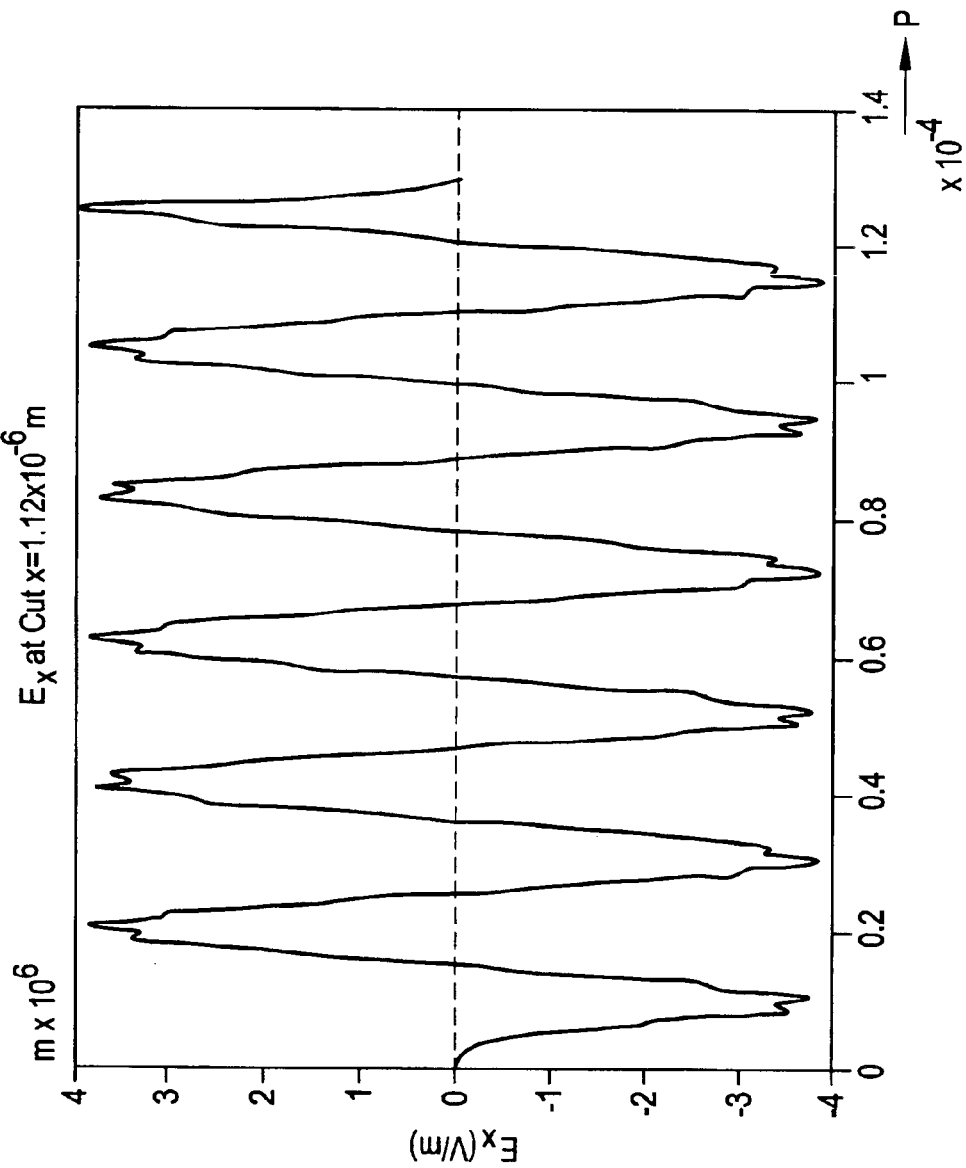

Application of the two sets of voltage levels (illustrated in FIGS. 3 and 7) to the same set of electrodes at different times allows a device that uses the electrical field to be made tunable, e.g., a wavelength agile laser or a tunable optical filter. Furthermore, the position of such an electric field relative to the device, for example, by starting the application of the voltage levels after a certain number of electrodes that are simply left floating, or alternatively coupled to the ground reference voltage. For example, FIG. 10 illustrates that the first three electrodes are not used, thereby to shift the position of the electric field in the predetermined direction P by almost ¼ of a wavelength.

A salient point of the just described exemplary embodiments illustrated in FIGS. 3–5 and 7–12 is the ability to synthesize electric field patterns that allow the wavelength at which mode conversion occurs to be shifted as desired by purely electronic means, as described below in reference to FIGS. 21 and 22.

Figure 13A:
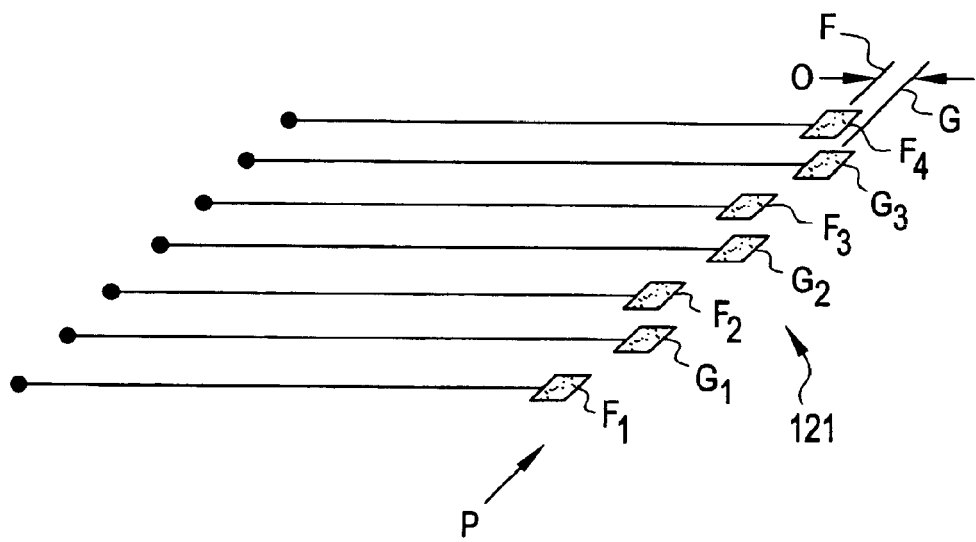
FIG. 13A illustrates, in a perspective view, an electrode structure in which adjacent electrodes are offset from one another in a direction perpendicular to the direction P along which the electrodes are positioned successively one after another, in accordance with an exemplary embodiment of the present invention.

Although electrodes E1–EN are illustrated in FIGS. 1A and 2A as being in-line with one another, the electrodes can also be offset by a distance O in other embodiments. Specifically, as illustrated in FIG. 13A, an electrode structure 121 has a set of electrodes F1–F4 that are in-line with one another along line F, and another set of electrodes G1–G3 that are also in-line with one another along line G. Although only a total of seven electrodes, namely F1–F4 and G1–G3, are illustrated in FIG. 3A, any number of such electrodes can be present in electrode structure 121, along the respective lines F and G.

Moreover, although only two lines F and G are illustrated in FIG. 13A, any number of such lines can be used, depending on the implementation of the electrode structure. Furthermore, although in FIG. 13A, lines F and G are illustrated as being coplanar, in other alternative exemplary embodiments of such electrode structures, the lines along which electrodes are arranged can be non-coplanar, e.g., arranged around a cylindrical surface, or around a conical surface with an access coinciding with the predetermined direction P.

Figure 13B:
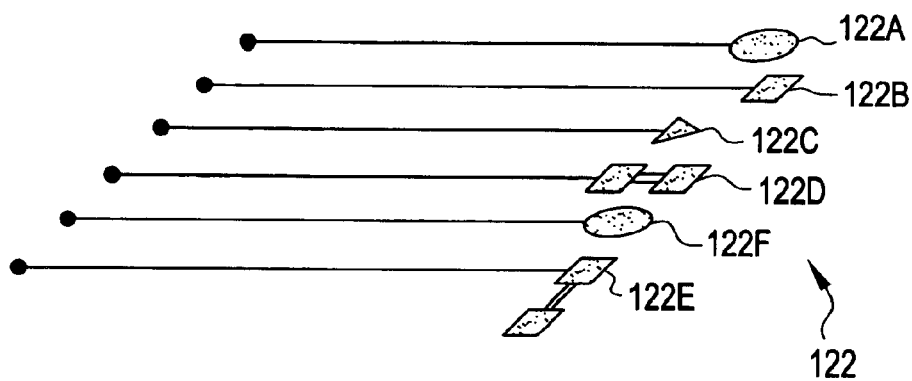
FIG. 13B illustrates, in a perspective view, electrodes of a number of different shapes that may be used depending on the embodiment, in accordance with an exemplary embodiment of the present invention.

Furthermore, although in FIG. 2A, the electrodes E1–EN are illustrated as having an elongated shape, i.e., of length L (FIG. 2A) that is much less than the width W (e.g., L is two orders of magnitude greater than W), electrodes of other shapes can also be used as illustrated in FIG. 13B. Specifically, an electrode structure of the type described herein can contain a circular electrode 122A, or a square electrode 122B, or a triangular electrode 122C. Moreover, an electrode structure can include an electrode that has two portions connected to one another by a conductive line, wherein the conductive line has any orientation relative to a line that is connected to a voltage supply, e.g., in line as illustrated by electrode 122D or lateral, as illustrated by electrode 122E.

Furthermore, shapes of such portions may not necessarily be square as illustrated in FIG. 13B, and instead could be any other shape as noted above. Similarly, an electrode 112F can have an elongated oval or elliptical shape. Therefore, it is to be understood that the specific shape of an electrode in the electrode structure 122 (FIG. 13B) is not critical to some exemplary embodiments, as long as an electric field is synthesized as described above.

In another embodiment, an electrode structure 125 (FIG. 14) has a set of electrodes 123, with each electrode individually labeled 123A–123P, wherein $P \geq K \geq A$, and another set of electrodes 124 that are individually labeled 124A–124P. Each electrode 123K in set 123 is located along a line F, and a corresponding electrode 124K in set 124 is located along line G. The two corresponding electrodes 123K and 124K are offset from one another by a distance O between lines F and G, and are otherwise colinear, i.e., are located along a line K which is perpendicular to each of lines F and G.

In electrode structure 125, each electrode 123K is coupled to a source of a corresponding voltage VK that is independent of the voltage of any other electrode in set 123. Similarly, each electrode 124K in set 124 is coupled to a source of voltage WK that is independent of the voltage applied to any other electrode in set 124. The voltages VK and WK that are applied to the corresponding electrodes 123K and 124K respectively can have a predetermined relationship, e.g. VK=WK.

Figure 15:
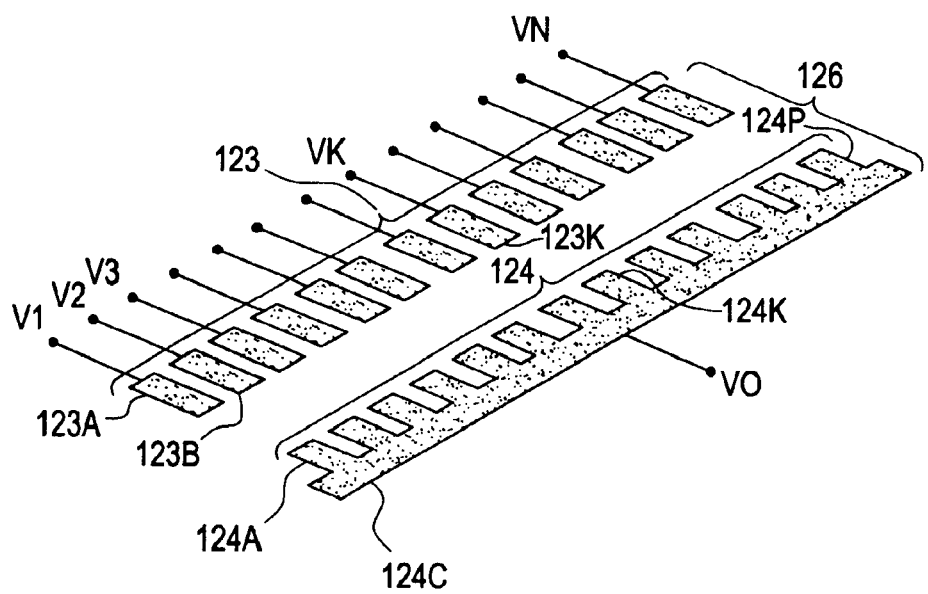
FIG. 15 illustrates, in a perspective view, another electrode structure that includes one set of electrode to which may be applied a corresponding set of independently controllable voltages V1–VN, and another electrode having a number of portions (also called "fingers") corresponding to the previously-described set of electrodes, in accordance with an exemplary embodiment of the present invention.

In an alternative exemplary embodiment illustrated in FIG. 15, a number of portions in electrode 124 do not carry a voltage level independent of one another, and instead are coupled to a source of the same voltage level, V0, for example, through a conductive strip 124C also included in electrode 124. The voltage level V0 can be, for example, the ground reference voltage. Note that in the electrode structure 126 illustrated in FIG. 15, the electrodes in set 123 can carry voltage levels independent of one another as described above.

Figure 14:
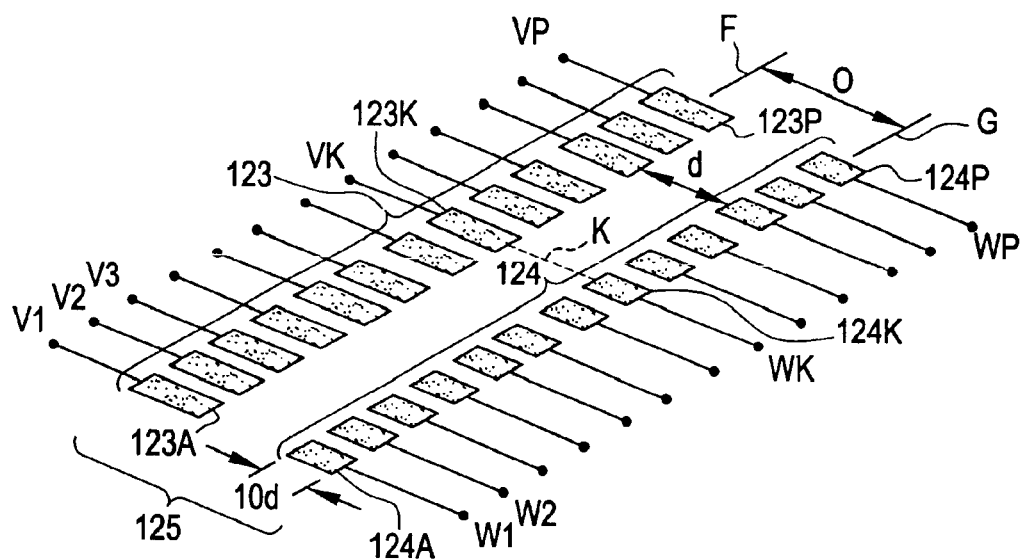
FIG. 14 illustrates, in a perspective view, an electrode structure having two sets of electrodes to which may be applied two sets of independently controllable voltages V1–VP and W1–WP, in accordance with an exemplary embodiment of the present invention.

For convenience, reference numeral 124 has been used to refer to a single electrode in FIG. 15, although the same reference number 124 illustrates a number of electrodes that carry voltages independent of one another in FIG. 14. To reiterate, each of portions 124A–124P in FIG. 15 are coupled to one another and carry the same voltage level V0. In many other respects, portions 124A–124P of electrode 124 are physically arranged in manner similar or identical to that described above for the individual electrodes 124A–124P in FIG. 14.

The electrode structures illustrated in FIGS. 14 and 15 provide a horizontal electric field variation in the space between sets 123 and 124, whereas the electric field variations with the electrode structure of FIG. 1A is vertical (Z direction).

An electrode structure of the type described above, wherein a number of electrodes are coupled to sources of voltage levels that are controlled independently of one another can be used to synthesize an electric field in any device that uses an electric field. Therefore, although certain embodiments of telecommunication devices that use such a structure are described below, other kinds of devices can also be built using an electric field that is synthesized as described above.

In one exemplary embodiment, a device contains electro-optic material present in an electric field that is synthesized as described above, and in the presence of the electric field, the electro-optic material exhibits a change in refractive index. Depending on the implementation, the electro-optic can exhibit a refractive change that is proportional to the strength of the electric field. The independent control of the voltage levels applied to the electrodes in such a device to synthesize the electric field permits the electric field to be changed ,and, therefore, permits a change in the refractive index at any given location in the device. The electric field pattern to which the electro-optic material is exposed in the device is the sum of all of the independent contributions from each individual electrode in the electrode structure, as discussed above.

In the presence of an electric field vector, an electro-optic material exhibits a change in refractive index proportional to the field strength. Several of the exemplary embodiments described herein utilize the application of voltages of varying sign and varying magnitude to independently controllable electrodes. The electric field pattern to which the electro-optic material is exposed is therefore the sum of all the independent contributions from each individual electrode.

The generated electric field can be used to cause the refractive index to change (either periodically or aperiodically) along the predetermined direction, which in turn is used in devices that convert energy between multiple modes of light, e.g., from a forward propagation mode to a backward propagation mode, or between two or more forward propagation modes (such as polarized light from transverse magnetic (TM) mode to transverse electric (TE) mode). Examples of such devices include Bragg reflectors, polarization mode converters, and devices that use waveguides having the same or different propagation constants and/or waveguides that have the same or different geometries (such as between a single mode waveguide and a multimode waveguide).

The positioning of the electrodes is such that the electric field distribution produced by application of voltage to the electrode array overlaps substantially with the guided optical mode. In one exemplary embodiment, an electrode structure 100 having a number of electrodes coupled to voltage sources that are independently controllable is located adjacent to a waveguide 132 (FIG. 16) that is formed inside an electro-optic material 131. Electro-optic material can be, for example, lithium niobate chip, or any other material that is electro-optic. A waveguide can be formed in material 131, for example, by diffusion of titanium in the normal manner. Electrode structure 100 can be formed in contact with such a lithium niobate chip, for example, if loss of power of the light due to absorption by electrode structure 100 can be tolerated in an optical device of the type described herein.

Alternatively, if electrode structure 100 is formed of a metal, the waveguide 132 can be separated from electrode structure 100 by a buffered layer 134 (FIG. 21) that can be formed of any optically non-absorbing material, such as silica. Referring back to FIG. 16, electro-optic material can have an anti-reflective layer 133 at an entry point of waveguide 132, so that most of the energy incident on waveguide 132 is transmitted therethrough.

At least a portion of the energy is reflected back, for example, due to satisfaction of the Bragg condition for reflection. Specifically, an electric field that is synthesized as described above in reference to FIG. 1A is used to cause periodic variations in the index of refraction of material 131, and the period of the index modulation is chosen to cause reflection of light off a particular wavelength, called the Bragg wavelength. Typically, the light at the Bragg wavelength is reflected back, while light of all other wavelengths is transmitted through waveguide 132.

By changing the voltage being applied at each of the electrodes of structure 100, the wavelength of light that is reflected back from waveguide 132 can be chosen, thereby to make the reflector tunable relative to the wavelength of light. Such a device can be used as an optical filter for adding and dropping single wavelength channels at nodes of a telecommunication network. When used in such telecommunication applications, the electric field that is synthesized by use of electrode 100 can be chosen to reduce the side lobes in spectral response of the optical filter to provide an improved spectral discrimination. The side lobe production can be obtained by varying the strength of the electric field in the predetermined direction P.

Figure 16:
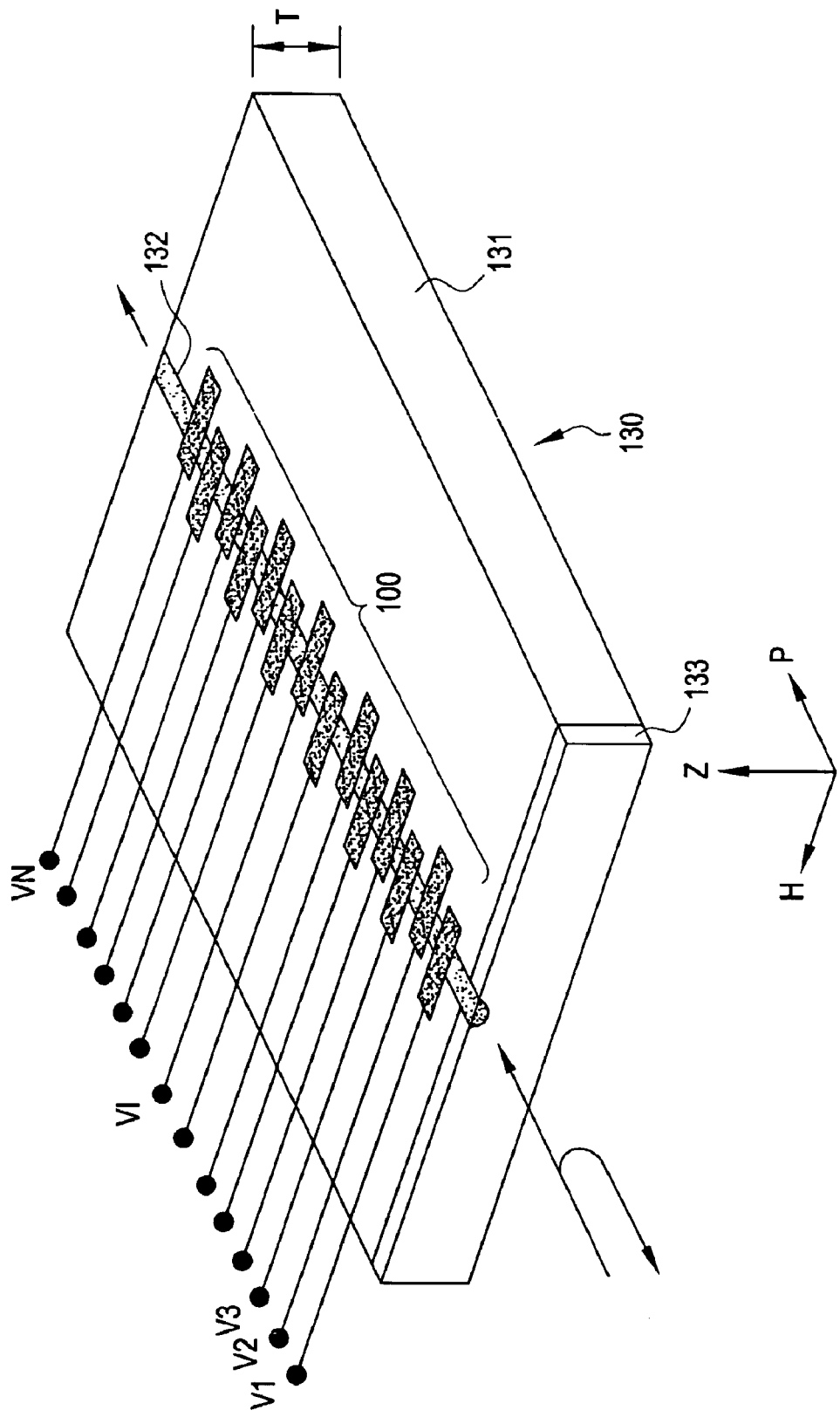

Furthermore, the electric field that is impressed on a waveguide 132 of the type illustrated in FIG. 16 can be aperiodic instead of the periodic electric field described above. (e.g., as discussed in reference to a chirped grating).

In one implementation of the just-described exemplary embodiment, a magnitude of the change in refractive index of material 131 is fixed, as a function of distance in the predetermined direction P. Such an implementation can be used to provide another kind of optical device, namely a chirped grating that reflects light of different wavelengths, for use in dispersion compensation. Specifically, the chirped grating applies a negative chirp which is opposite in sign to the chirp applied by an optical fiber through which the light incident in material 131 has passed, and has undergone dispersion.

Alternatively, a magnitude of the change in refractive index of the substance 131 due to the presence of an electric field is not fixed as described above, and instead changes with distance along the predetermined direction P. In such an embodiment, the instantaneous spatial frequency of the refractive index of material 131 remains constant.

Furthermore, in yet another alternative exemplary embodiment, the magnitude of the change in refractive index of substance 131 due to presence of the electric field, as well as an instantaneous spatial frequency of the refractive index, both change with the distance in the predetermined direction P.

A device in accordance with this invention includes an optical waveguide embedded in an electro-optic material that is exposed to a synthesized electric field of the type described above. Such a device can be used as an optical filter. The filter can be used in combination with a gain block between two mirrors, to form an optically resonant cavity, for use as an extended cavity laser in one embodiment. Specifically, the filter can be used to produce a wavelength agile laser by changing the electric field that is being synthesized, for use in optical communications. Such a laser is particularly amenable to rapidly reconfigurable optical networks, as well as to longer time constant reconfiguration, such as wavelength sparing. Alternatively, in another exemplary embodiment, the filter is used directly to perform wavelength filtering in an optical add drop multiplexer, an optical switch, or the like. In yet another exemplary embodiment, the filter is used for dynamic power balancing, dynamic gain equalization, or the like.

In one specific embodiment, an electric field synthesized by use of electrode structure 100 (FIG. 16) is periodic in space along the predetermined direction P, and is used to change the refractive index of waveguide 132, so that a period of the change in refractive index is linearly related to a wavelength in the range of approximately 1300 nanometers to approximately 1700 nanometers. Specifically, in one particular exemplary embodiment, the electric field has a period in space equal to N times half the wavelength that is linearly related, wherein N is an integer greater than zero.

The just-described condition ensures that light of the wavelength that is linearly-related is the light that is reflected, with a portion of the light being reflected each time the periods of the electric field and the light match. For example, if N is the integer 2, a portion of light is reflected at an interval along the direction P equal to a wavelength. Alternatively, if N is the integer 3, reflections occur at distances that are multiples of three wavelengths. The relative distance between and electric field that is synthesized, and an electric field due to light can be changed as described above in reference to FIG. 10, for example, if there is an offset between the two electric fields.

Electrode structure 100 (FIG. 16) can be separated from waveguide 132 in the direction Z by a distance that is sufficiently small for waveguide 132 to exhibit a change in refractive index due to presence of the electric field synthesized by electrode structure 100. In one particular example, the distance between electrode structure 100 and waveguide 132 is five microns, so that the far field effects (that occur at distances similar to or greater than the pitch p of the electrode structure) are used in changing the refractive index of waveguide 132.

In another example, the distance is only 2 microns, thereby to ensure that the refractive index change in waveguide 132 depends on the near field effect (that occurs at distances less than the pitch p), which is illustrated at the extremities of the electric field, as seen in circle C4 (FIG. 5). Depending on the embodiment, waveguide 132 can be at a distance effectively equal to a pitch p (FIG. 2A) between the electrodes E1–EN. In one example, the thickness T (FIG. 16) of the electro-optic material 131 (e.g., formed of lithium niobate) is 10 millimeters, and a buffer layer (see FIG. 21) has a thickness of 100 nanometers, and waveguide 132 is no more than 10 millimeters away from structure 100.

An optical waveguide 132 formed in the electro-optic material 131 should support substantially the lowest order spatial mode of the guide, so as to allow facile coupling of the waveguide within the electro-optic material 131, to other single mode waveguides outside the electro-optic material 131. See, for example, the article entitled "End Fire Coupling Between Optical Fibers and Diffused Channel Waveguides", by Burns et al., Applied Optics, Vol. 16, No. 8, August 1977, pages 2048–2050.

Although in one exemplary embodiment illustrated in FIG. 16 and described above, the synthesized electric field is used to change the refractive index of electro-optic material 131 sufficient for the light to be converted from a forward propagating mode to a backward propagating mode, such structures can also be used to convert light between any two modes of a multi-mode waveguide. Specifically, in an optical device 140 (FIG. 17), two waveguides 141 and 142 are located adjacent to one another, separated by a separation distance S. For example, if a fundamental mode supported by each of two identical waveguides has a majority of power in a width W, then the distance between these two waveguides can be 2 W and still be sufficient for an optical device containing the two waveguides to function effectively.

In this particular exemplary embodiment, each of electrodes E1–EN covers both waveguides 141 and 142, so that both waveguides 141 and 142 are subject to the same electric field. However, the electrodes could only overlap one of the waveguides and still be effective. In such an embodiment, light in the two waveguides has different propagation constants and application of a synthesized electric field as described above causes the propagation constant to phase match, and therefore the transfer over of energy. Such an optical device 140 can be used in an add-drop multiplexer in a telecommunication network, to transfer a wavelength of light, e.g., from a first waveguide 141 to a second waveguide 142.

Figure 17:
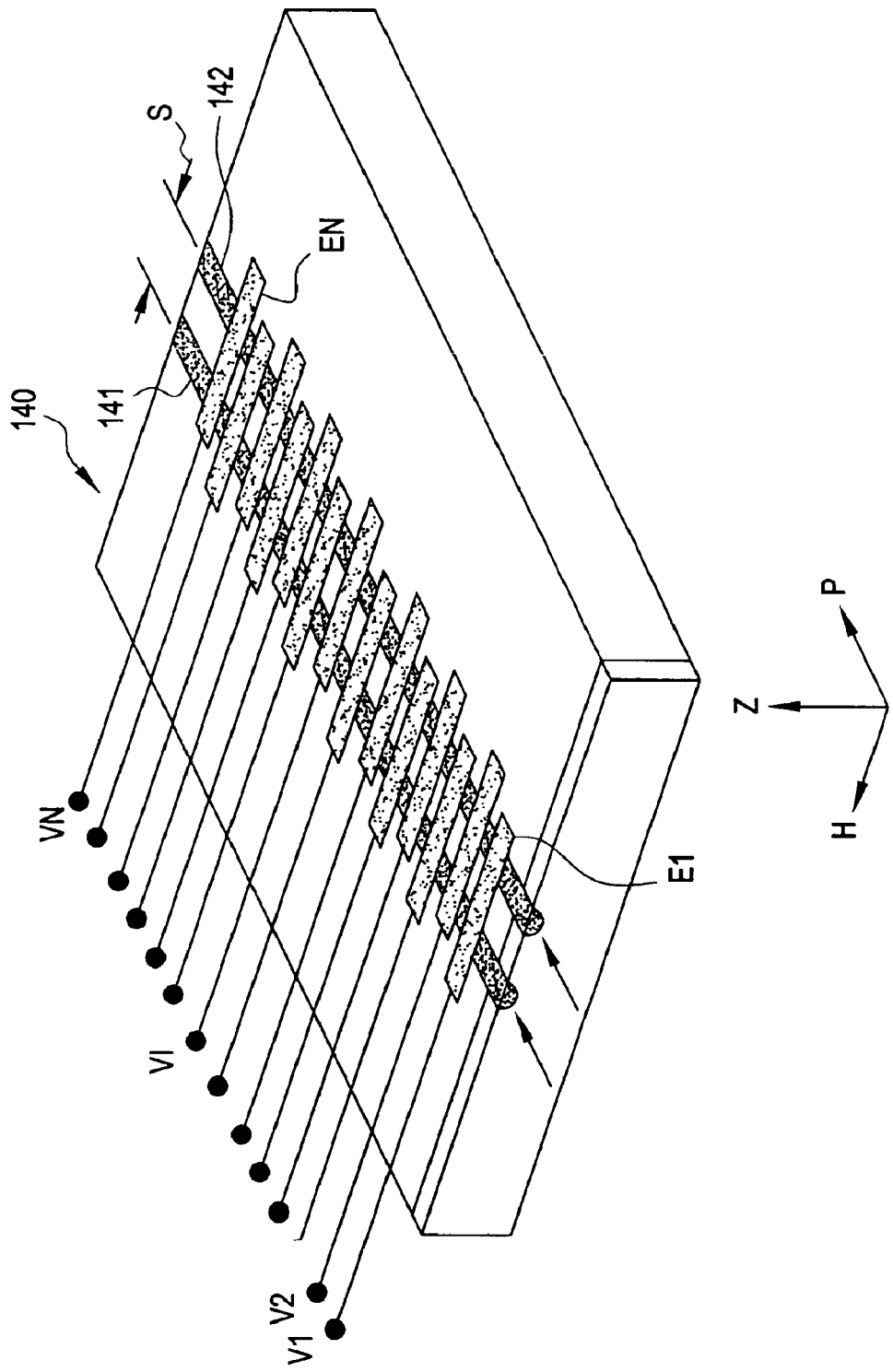

In the exemplary embodiment illustrated in FIG. 17, each of the two modes in the respective waveguides 141 and 142 propagates in the same predetermined direction P, although in an alternative embodiment, the directions of light in the two waveguides 141 and 142 are opposite to one another, e.g., the P direction and the –P direction. The relevant equations used to ensure coupling of energy between modes are given below as equations (5) and (6).

In yet another exemplary embodiment illustrated in FIG. 18, a device 150 has two electrode structures 151 and 152, with a first electrode structure 151 covering two waveguides 153 and 154, and the second electrode structure 152 covering two waveguides 154 and 155. A common waveguide 154 is present between the two electrode structures 151 and 152, so that a portion of light incident on waveguide 153 is transferred by common waveguide 154 to another waveguide 155. Device 150 implements a two stage filter that can provide twice as good performance as a single stage filter of the type illustrated in FIG. 17.

In still another exemplary embodiment, electrode structures 161 and 162 (FIG. 19) that are similar to the above-described structures 151 and 152 each cover three waveguides instead of just two. Specifically, structure 161 covers waveguides 163, 164 and 166, whereas electrode structure 162 covers waveguides 163, 164 and 165. In this embodiment, waveguides 164 and 163 are common to the two electrode structures 161 and 162. Waveguides 166 and 165 are not connected to one another, although they are present in a space between waveguides 163 and 164. In one use of the device illustrated in FIG. 19, light of a particular wavelength in waveguide 166 is coupled over to both of waveguides 163 and 164 on application of a synthesized electric field by electrode structure 161 and this light is coupled over to waveguide 165 by application of an identical electric field by electrode structure 162, thereby to result in a four stage filter.

Although in the above-described exemplary embodiments a waveguide has been illustrated as being in a direction P that is parallel to the direction of the periodicity of an electric field synthesized by application of the different voltage levels to the electrodes, in other exemplary embodiments the two directions can be different from one another. Specifically, an angle θ between direction of a waveguide and the predetermined direction P of the electric field being synthesized creates an appearance of a change in the period of the electrodes (assuming the electrodes are periodically spaced), so that the electrodes appear to be further apart as the distance increases in the predetermined direction P.

The change in the refractive index of a waveguide is dependent on the cos(θ) component of the electric field (i.e., the component in the direction of the waveguide). Depending on the physical principle being used, the conversion of energy can be between two forward propagation modes, as opposed to conversion of energy between opposite propagation modes, and for this reason design of the optical device can be different.

Figure 20D:
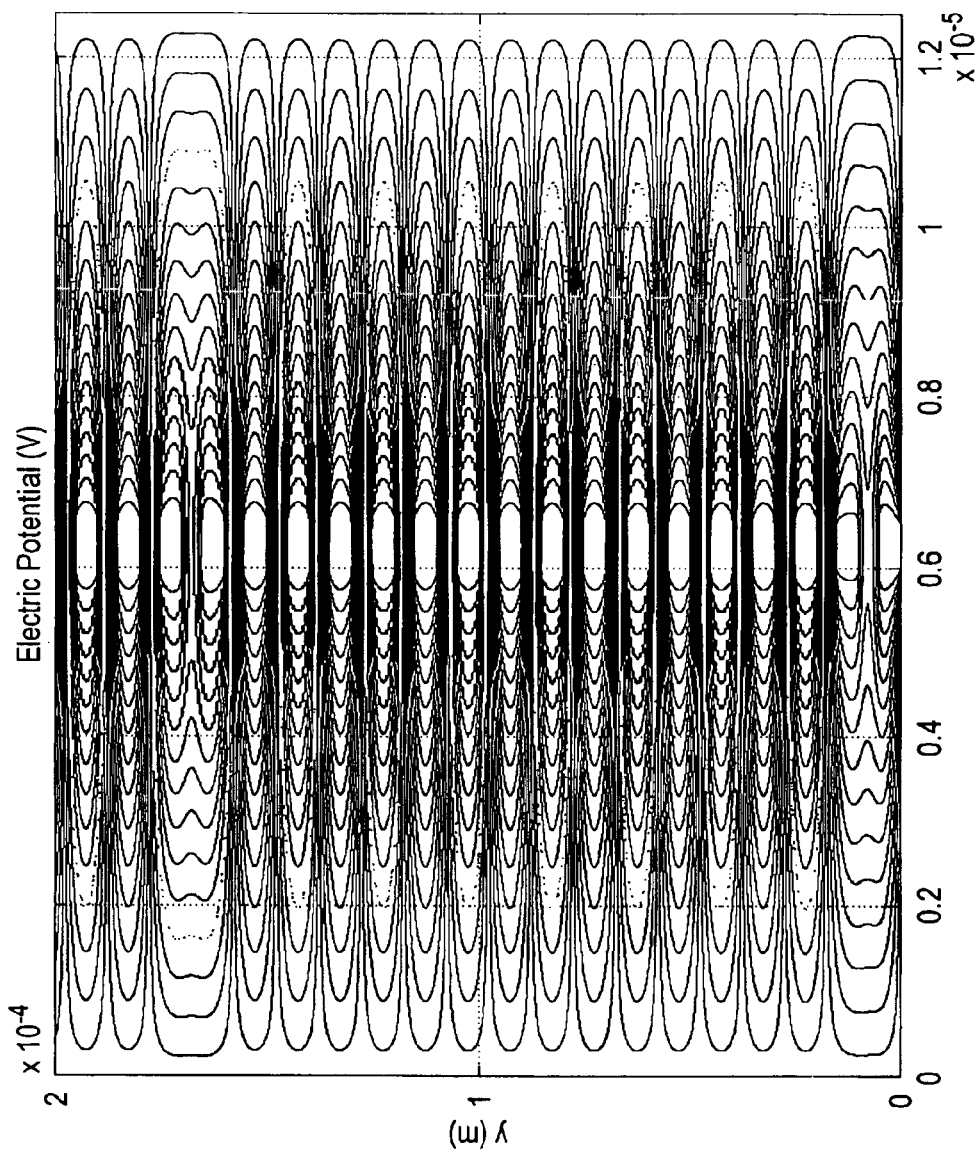

In yet another exemplary embodiment illustrated in FIGS. 20A–20C (of the type described above in reference to FIGS. 3–5 and 7–12), the synthesized electric field generated by use of an electrode structure coupled to a set of voltage sources that are independently controllable is aperiodic instead of periodic. The aperiodic electric field of this embodiment is used for polarization mode conversion in a laser.

Specifically, light of one polarization mode is converted into light of another polarization mode by use of a substance 181 (FIG. 21) that is birefringent. Moreover, device 180 (FTC. 21) also includes a polarizer 182 formed by, for example, a layer of metal that absorbs light of predetermined polarization mode, e.g., the polarization mode TM (or alternatively, polarization mode TE). Therefore, light in waveguide 183 that is not converted into the predetermined polarization gets absorbed, and light of the predetermined polarization is transmitted out.

Such a polarization mode converter can be used as a filter, because only light of a specific polarization mode is transmitted therethrough. Alternatively, instead of being transmitted out, such light can be reflected back by use of a reflector 252 (FIG. 22) for use of device 180 in a laser 200 (as described below in reference to FIG. 22). The light incident on device 180 can be of any polarization, e.g., TE or TM, as long as light of the same polarization is absorbed by polarizer 182, and an electric field synthesized by electrode structure 100 changes polarization of at least one wavelength of the incident light.

In one specific exemplary embodiment, the electric field generated by electrode structure 100 has a period in space in the predetermined direction P which is greater than or equal to four times the wavelength of light that is incident on waveguide 183, which is the light undergoing polarization mode conversion in waveguide 183, e.g., wavelength 1610 nanometers. Moreover, the periodicity of the synthesized electric field can be changed at any time by changing the voltage levels being applied to the individual electrodes.

In contrast, U.S. Pat. No. 3,877,782 discloses individual electrodes that cannot be independently controlled. Specifically, the selection of an oversampling factor F greater than 1 requires an electrode structure with a spatial pitch p greater than that appropriate for polarization mode coupling of a wavelength at $\lambda_{opt}$ if alternating voltages must be applied to the electrode structure as taught by U.S. Pat. No. 3,877,782. Implementation of oversampling of the electrode spatial period is absent in U.S. Pat. No. 3,877,782. Additionally, the applied voltage structure used is of alternating values.

As noted above, in one exemplary embodiment, an electro-optic substance 181 that is present adjacent to the electrodes (FIG. 21) is birefringent, with a difference in refractive indices in the two polarization modes of $|ne-no|=0.072$. The spatial period of 21 microns for the electric field corresponds to optimum polarization mode conversion at approximately 1523 nm, as illustrated in FIG. 3. Therefore, a variable polarization coupling process is combined with polarizing element 182 to produce optical attenuation for a particular polarization mode.

Once a cavity (FIG. 22) is formed by appropriate alignment of the optical elements, the wavelength (at which optimum coupling of optical power is achieved) is the resonator mode that sees the lowest loss. The mode-coupled wavelength is therefore preferred over all others. Such preference can also be described as differential loss. In many ways, use of device 180 (FIG. 21) in the exemplary embodiment of FIG. 22 shares some similarity with an intra-cavity Lyot filter, namely, the use of an optical element to alter the polarization eigenmodes of the laser resonator as a function of their wavelengths. Into this depolarized resonator a polarization dependent loss is introduced that modifies the loss structure of the polarization eigenmodes. As a result, there is one resonator frequency at which the optical loss is the lowest.

A wavelength uncommitted Fabry-Perot gain chip 242 (FIG. 22) incorporating its own optical waveguide and excited by current injection is optically linked by optical coupler 246 (such as a fiber, a tapered waveguide, or a lens) to the waveguide 183 in the electro-optic substrate 181. The Fabry-Perot chip 242 exhibits polarization dependence in its optical gain and optical loss. An additional polarizing element can be inserted to complement the polarizing effect of the Fabry-Perot gain chip 242. On the extreme opposite facets of the lithium niobate chip 180 and the Fabry-Perot chip 242, cavity defining mirrors 252 and 243 are deposited.

The reflectivity of cavity defining mirrors 242 and 253 yield a sufficient cavity "Q" so as to allow laser oscillation to build up within the cavity. On the internal facets of the gain chip 242 and the electro-optic substrate chip 180, anti-reflective coatings 251 and 245 are deposited to eliminate the magnitude of any sub-cavity resonances. In addition, the optical coupler 246 is similarly coated with anti-reflective layers 247 and 248 and for the same reason.

Added to the electro-optic gain chip 180 is an electrode structure (e.g., formed of electrodes 253A–253N laid out substantially transversely to the device resonator axis). Prior to the deposition of these conductive electrodes 253A–253N, a buffer layer 134 formed of an optically-transparent material can be deposited to lower the propagation losses in the electro-optic waveguide 183. Each of the aforementioned electrodes 253A–253N are independently controlled. The spatial period of the electrodes 253A–253N is such that they satisfy the following relationship:

$$\Lambda = \lambda_{opt}*(2*F*|n_e-n_o|)^{-1} \quad (3)$$

where
$\Lambda$=Electrode period in space;
$\lambda_{opt}$=Wavelength at which the polarization mode coupling process is at its most efficient;
$n_e$=Refractive index of the electro-optic material in the extraordinary axis;
$n_o$=Refractive index of the electro-optic material in the ordinary axis; and
F=Oversampling factor (>1).

In laser 200 (FIG. 22), a thermoelectric cooler 239 is interfaced with a heatsink 240 and a device submount 241. A semiconductor gain chip 242 is affixed to the submount 241. Submount 241 is designed to have various surfaces used to mount one or more components used to implement a device, such as a laser. For example, submount 241 can have surfaces at heights H1, H2 and H3 (FIG. 22) that are chosen to ensure that light from a component (e.g., chip 242) reaches another component (e.g., chip 181) and vice versa. Depending on the manufacturer, in one example, H3–H1 is 1 mm and H2–H1 is 0.5 mm.

As noted above, the semiconductor gain chip 242 has a cavity defining mirror 243 placed on its outermost surface, and also has a contact pad 244 for the injection of a current $I_{diode}$, and also has an anti-reflecting surface 245 placed on the intra-cavity surface of the gain chip. The output beam from the gain chip 242 is interfaced with a coupling optic 246 that has anti-reflective surfaces 247 and 248 deposited on all its intra-cavity interfaces. Surfaces 291 and 292 are heating and cooling surfaces of the cooler 239 and are normally made of ceramic.

Coupling optic 246 ensures power coupling efficiency between a waveguide (not shown) in gain element 242 and another waveguide 249 in electro-optic chip 180. The waveguide chip 180 has an anti-reflective surface 251 on its intra-cavity face and the remaining cavity defining mirror 252 is deposited on the outermost face of the electro-optic chip 180. Overlaid upon the upper surface of the electro-optic chip 180 is a buffer layer 134 comprising an optically non-absorbing material, such as, for example, silica. The buffer layer 134 covers the entire length upon which electrodes 253 are to be overlaid.

The electrodes are electrically connected by contacts 254A–254N to an array of sources 255 of voltages VA–VN, to introduce polarization dependent loss in a direction at normal incidence to the horizontal surface 181H of the electro-optic chip 180. An overlap between the electric field environment 256 and the transverse dimensions of waveguide 183 is required to ensure that the refractive index of the waveguide 183 changes in response to the electric field, and such an overlap is shown in FIG. 22.

In one embodiment, the analog voltages VA–VN, wherein $A \leq I \leq N$, are determined according to the following relationship:

$$VI = A*\cos(2*\pi*\Lambda*|n_e-n_o|*I/\lambda_{opt, des}) \quad (4)$$

where
A=Amplitude constant, determined as described below;
$\pi$=The fundamental constant pi;
$\Lambda$=Electrode period;
$\lambda_{opt, des}$=Wavelength at which the polarization mode coupling process is desired to be its most efficient;
$n_e$=Refractive index of the electro-optic material in the extraordinary axis;

$n_o$ = Refractive index of the electro-optic material in the ordinary axis; and I = Electrode number.

In practice, the effective birefringence |ne−no| are weakly dependent on wavelength of the synthesized electric field and on waveguide properties. Thus in an experimental setting, the designer may have to experimentally perturb $\lambda_{opt,\ des}$ in order to obtain the most efficient mode conversion at precisely the desired wavelength.

Consider the wavelength $\lambda_{opt,\ des}$ at which the most efficient mode conversion is effected. The fraction of energy that is converted from one mode of propagation to the other mode of propagation is a function of the amplitude constant A, the guide properties, the overlap between the electric field due to the fixed electrodes and the electromagnetic field of the light, and the total length of the mode converter section (nominally the product of the total number of electrodes and the electrode period L). In a practical experimental setting, some tuning may be required to maximize the energy conversion from one mode to the other.

The relevant equations needed to determine the coupling of energy between modes (in either the same waveguide or in adjacent waveguides) are given by the following relationships:

$$\frac{dM}{dz} ik_{MN}(Z) N e^{-i(\beta M - \beta N)z} \tag{5}$$

$$k_{MN} = \frac{\beta_N}{4} \int_{-\infty}^{\infty} \frac{\varepsilon^2}{\varepsilon(x)\varepsilon_0} r(x,z) E^{(0)}(x,z) H_{y,M}(x) E_{y,N}(x) dx \tag{6}$$

where

M = the (complex) amplitude of the waveform in mode M;
N = the (complex) amplitude of the waveform in mode N;
z = the distance traveled down the guide;
$\beta_m$ = the propagation constant of mode M;
$\beta_n$ = the propagation constant of mode N;
$\varepsilon$ = permittivity of the waveguide material(s);
$\varepsilon_o$ = permittivity of free space;
r = the electro-optic tensor of the waveguide material(s);
$E^{(o)}$ = the electric field due to the electrodes;
$H_{y,m}$ = y component of the magnetic field of M mode; and
$E_{y,n}$ = y component of the electric field of N mode.

Since $E^{(o)} = -\nabla V$, the electric field can be computed from the gradient of the electric potential in waveguide's material. The total electric field in the material can be computed from the electrode voltages using finite difference methods. Since the scaling of A will effect the scaling of the electric field $E^{(0)}$, larger A produces more rapid coupling as the light travels down the waveguide. "A" is chosen so that complete coupling occurs as the light exits the mode conversion section of the waveguide (which is the section having electrodes 253A–253N). In practice, selection of A can be determined experimentally.

In one particular example of such a device, the mode converter is 5.12 mm long, the polarizer is 2 mm long and the device includes a spare length of 0.08 mm. The electrodes have micron pitch, and are 200 microns long and each electrode has 5 micron width, and there are 512 electrodes. The buffer layer is 180 nanometers thick and waveguide is 7 microns wide (and alternatively 9 microns wide). In this example, "A" is 16 volts. The spare length can be used, for example, to align the electric field being synthesized with the electric field of the light travelling in the waveguide as discussed above in reference to FIG. 10.

Voltages VA–VN (FIG. 22) that are applied to electrodes 253A–253N can be determined by a designer as follows.

The designer initially selects a transfer function in the digital domain that models the electric field to be generated to perform a specific mode conversion that is desired in the device being designed. Thereafter, the designer uses the transfer function in a computer to obtain the digital values of voltage levels that are to be applied to the electrodes (based on the pitch p). The transfer function can be used as described by the software in Appendices A and B, provided as MATLAB® files "PFE.M" and "PFE-HELP.M," respectively, that create a mathematical model of the electric field, and in Appendix C, provided as MATLAB® file "PFILT.M" that uses a linear program and the mathematical model to determine a set voltage levels for 1550 nm wavelength light and 10 micron pitch of electrodes, and 101 total electrodes. MATLAB® software is available from The MathWorks, Inc. of Natick, Mass.

Next, the designer simulates the electric field that will be synthesized if the voltage levels were to be applied to the electrode structure. The simulated electric field merely approximates the transfer function initially chosen by the designer, due to the fact that the electrodes are limited to N in number and are separated from one another by a pitch p. The designer then uses the simulated electric field to determine whether a desired optical effect is being achieved and, if not, selects a different transfer function and repeats the above-described process.

Depending on the need, the designer can optimize the above-described process by use of, for example, linear programming, second-order cone programming, semi-definite programming (using linear matrix inequalities) and non-linear programming. One example of linear programming is attached hereto in file "PFILT.M" in Appendix A. Such linear programming is described in, for example, an article entitled "FIR Filter Design Via Spectral Factorization And Convex Optimization" by Shao-Po Wu, Stephen Boyd and Lieven Vandenberghe.

The attached files of Appendices A, B, and C generate the graphs 15 illustrated in FIGS. 20A–20E. Voltages VA–VN (FIG. 22) that are applied to electrodes 253A–253N are controlled in one exemplary embodiment by a digital computer 302 (FIG. 23) that is coupled to multiple voltage sources 301, each of which can be implemented by one of digital-to-analog converters (DACs) 301A–301N, as illustrated in FIG. 23. Each DAC 301A–301N in turn is connected to a single electrode (not shown in FIG. 23; see FIG. 22). In this exemplary embodiment, DACs 301A–301N are all connected to an address bus and a data bus, which is in turn connected to the controlling digital computer 302.

Computer 302 of this exemplary embodiment is also coupled to thermoelectric cooler 239 (described above) via a power regulator to control the supply of power to cooler 239, and is further coupled to receive a temperature signal from a thermistor 261 via an analog-to-digital converter (ADC). Thermistor 261 is physically attached to waveguide chip 180 to provide a measure of the temperature of waveguide chip 180. Therefore, computer 302 controls the temperature of waveguide chip 180 via a feedback loop, in the normal manner (e.g., in the well known "proportional integral" manner).

The attached files of Appendices A, B, and C generate the graphs illustrated in FIGS. 20A–20E. Specifically, a transfer function encoded in the file "PFILT.M" defines matrices and vectors "A," "B," and "F," and is used to generate an electric field for pass band gain of 1 and stop band gain of 0.9 or less, with optimization to make the pass band as narrow as possible, subject to voltage levels being in the range −100 volt to +100 volt. In the file "PFILT.M", the optimization variable is "xtemp" and the computer is programmed to minimize $F_T$ (xtemp) subject to A*xtemp<B and VLB<xtemp<VUB, wherein VLB and VUB are respectively −100 and +100. Such optimization minimizes the pass band width to 500 GHz for a 1550 mm laser (in the band 1520–1620 nm.).

Computer 302 of this exemplary embodiment is further coupled to diode driver 244 (described above) via a DAC to control the supply of current to gain chip 242, and is further coupled to receive signals from a wave locker and power monitor 262 via an analog-to-digital converter (ADC) 263. Wave locker and power monitor 262 provides an indication of the power of a laser signal being generated by device 200. Wave locker and power monitor 262 can include, for example, two diodes. In one implementation, the two diodes generate sum and difference signals of the energy incident thereon and these two signals are transmitted on a two-wire bus to the ADC. In an alternative implementation, one diode is used for measuring the wavelength of the laser beam being generated, and another diode is used for measuring the power being generated. Therefore, computer 302 controls the wavelength and power of the laser beam generated by waveguide chip 180 via a feedback loop.

Figure 24:
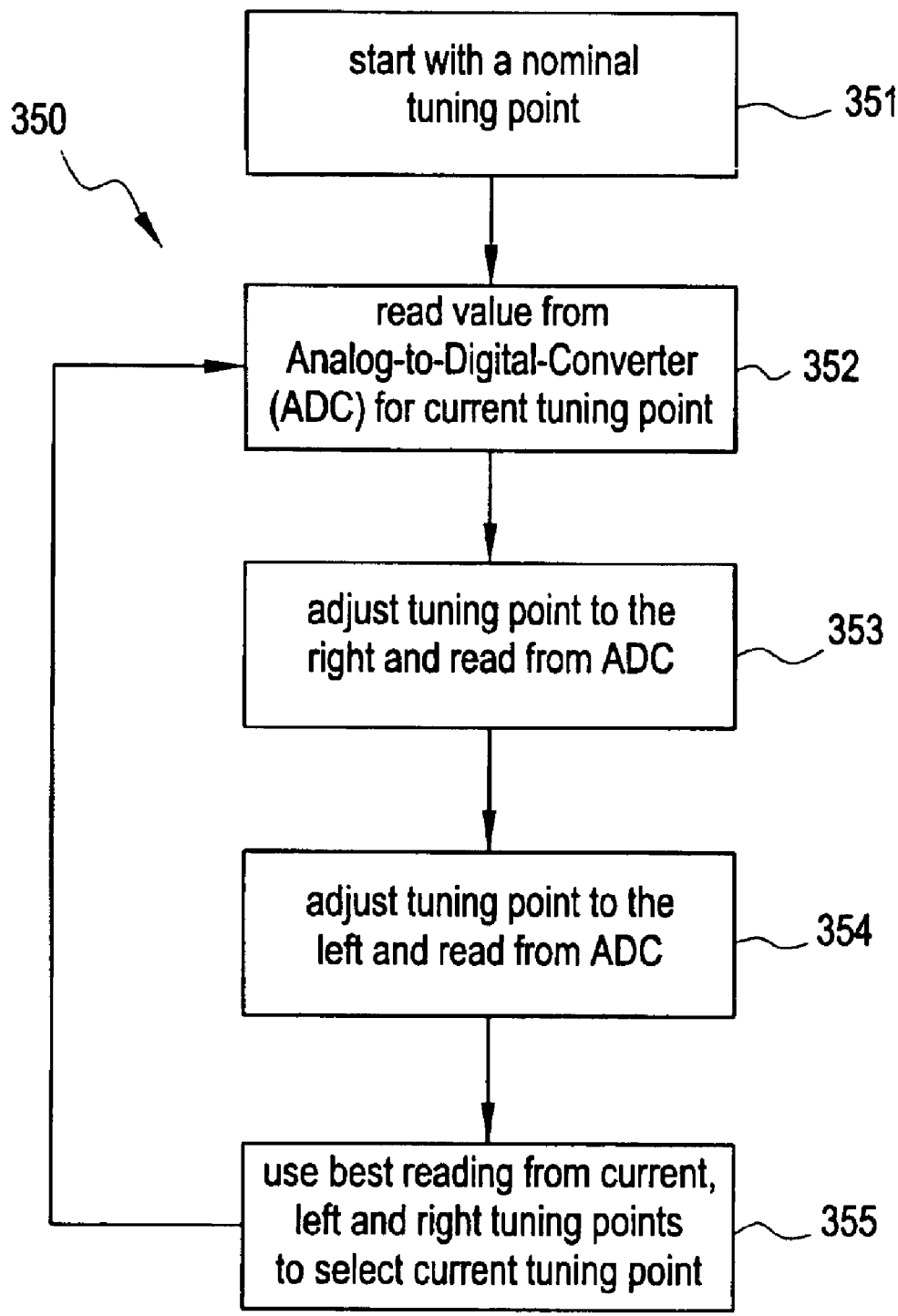
FIG. 24 illustrates, in a flowchart, software for use in the computer of FIG. 23, in accordance with an exemplary embodiment of the present invention.

The analog voltages applied to electrodes 253A–253N are set by a computer program that performs the method 350 of FIG. 24 (described below). Specifically, in one exemplary embodiment, computer 302 hunts for the best set of voltage levels to be applied from among a group of sets that are predetermined and stored in memory. For example, a single set of voltage levels VA–VN (also called "tuning point") can be effective at a specific temperature to produce a laser of a specific wavelength. If the temperature changes, a different set of voltage levels is needed. For this reason, computer 302 starts with a set SC (see step 351 in FIG. 24) that is known (from experiment) to produce a laser of the specified wavelength $\lambda$s. Thereafter, computer 302 repeatedly performs steps 352–355 in a loop as follows.

In step 352, computer 302 reads values of the wavelength and power from ADC 263 (described above). Thereafter, in step 353, computer 302 replaces the set SC of voltage levels that are currently applied with another set SN that is known to produce a laser of the next larger wavelength $\lambda$n (depending on the resolution, such a wavelength may be just 0.01 nm larger than the current wavelength). Then computer 302 again reads from ADC 263 the values of wavelength and power generated by use of set SN.

Then in step 354, computer 302 replaces set SN with another set SP that is known to produce a laser of a next smaller wavelength $\lambda$p, and again reads from ADC 263. Next, in step 354, computer 302 determines which of the respective sets produced the best readings (e.g., which produced the most power at the specified wavelength $\lambda$s), and then selects this set as the current set for the next iteration of the loop (and returns to step 352, e.g., after waiting for a predetermined duration). In this manner, over time, a single set SC is used (for successive periods of the predetermined duration), as long as the operating conditions remain unchanged.

Devices that include electrodes that are insulated from one another and that carry independently controllable voltages can be packaged in any manner well known in the art. Moreover, such devices can be packaged with any components well known in the art. In one example, a mode converter has a number of electrodes of the type described above, and is packaged with a laser diode and a submount thereby to form a laser. Instead of or in addition to the laser diode, a gain medium and an optical coupler can be enclosed in the same package that encloses a mode converter. For example, in one implementation, items 301, 102, 263–267, 239, 180, and 261 of FIG. 23 are all packaged together. In such an implementation, a power monitor can also be included in the same package with a wave locker external to the package.

Figure 25:
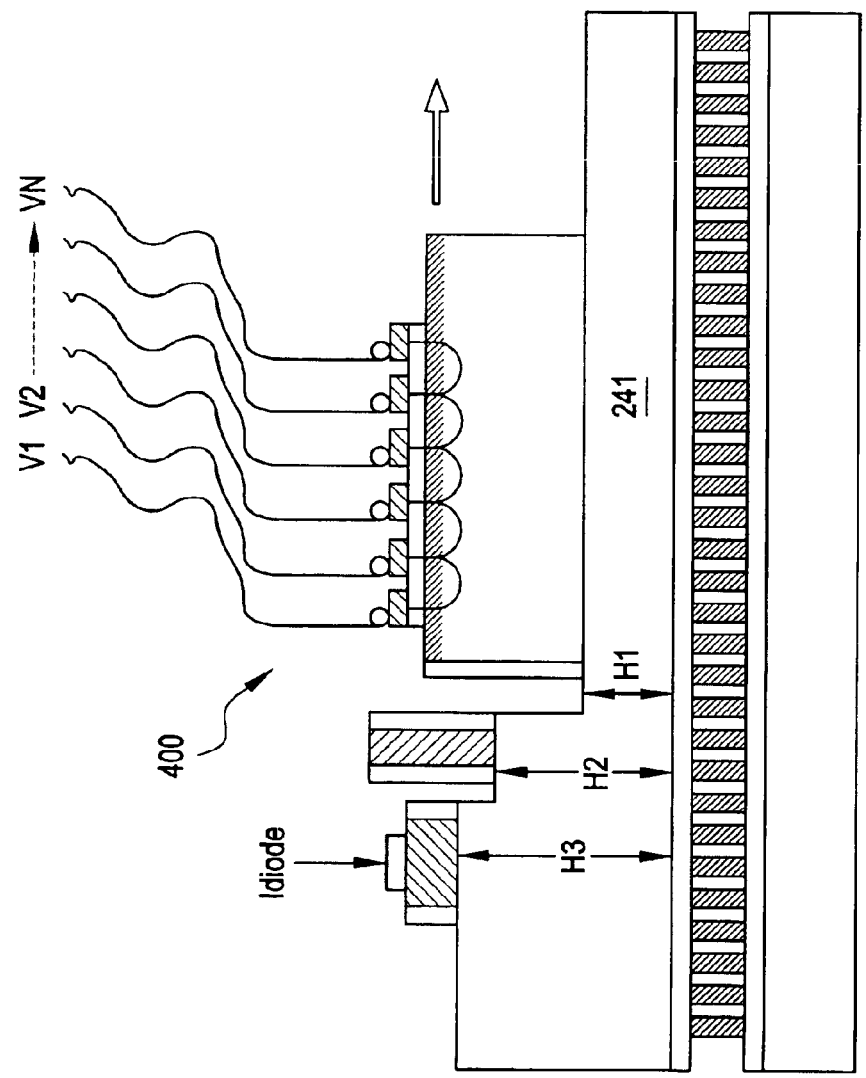
FIG. 25 illustrates, in a cross-sectional view, similar to the view of FIG. 22, and optical further formed using the arrangement of FIG. 16, in accordance with an exemplary embodiment of the present invention.

Numerous modifications and adaptations of the embodiments described herein will be apparent to the skilled artisan in view of the disclosure. For example, although device 200 illustrated in FIG. 22 is a laser, a similar device 400 (FIG. 25) can be constructed without mirror 252, for use as a filter.

Figure 26:
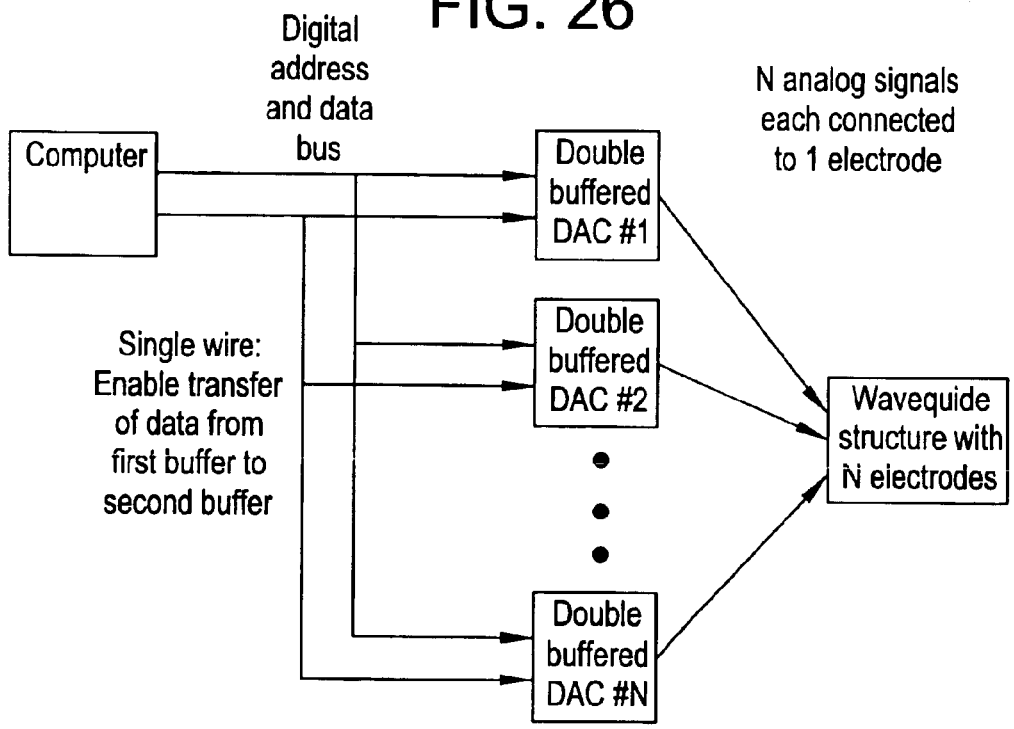
FIGS. 26–29 illustrate, in high level block diagrams, alternative circuits for use in the laser of FIG. 22, in accordance with an exemplary embodiment of the present invention.
Figure 27:
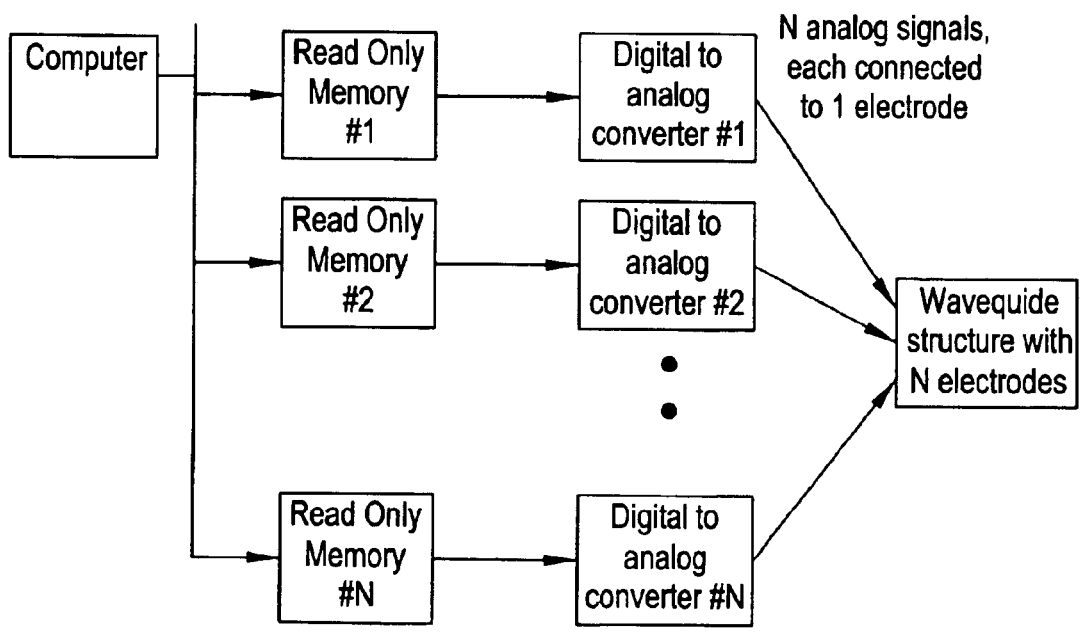

Furthermore, instead of using a buffered DAC for each electrode as illustrated in FIG. 23, a doubly buffered DAC can be used as illustrated in FIG. 26, e.g., so that a new set SN is present in the DACs and is available for use while a current set SC is being currently applied to the electrodes. Moreover, instead of a doubly buffered DAC, a combination of a read-only-memory and a DAC can be coupled to each electrode as illustrated in FIG. 27.

Figure 28:
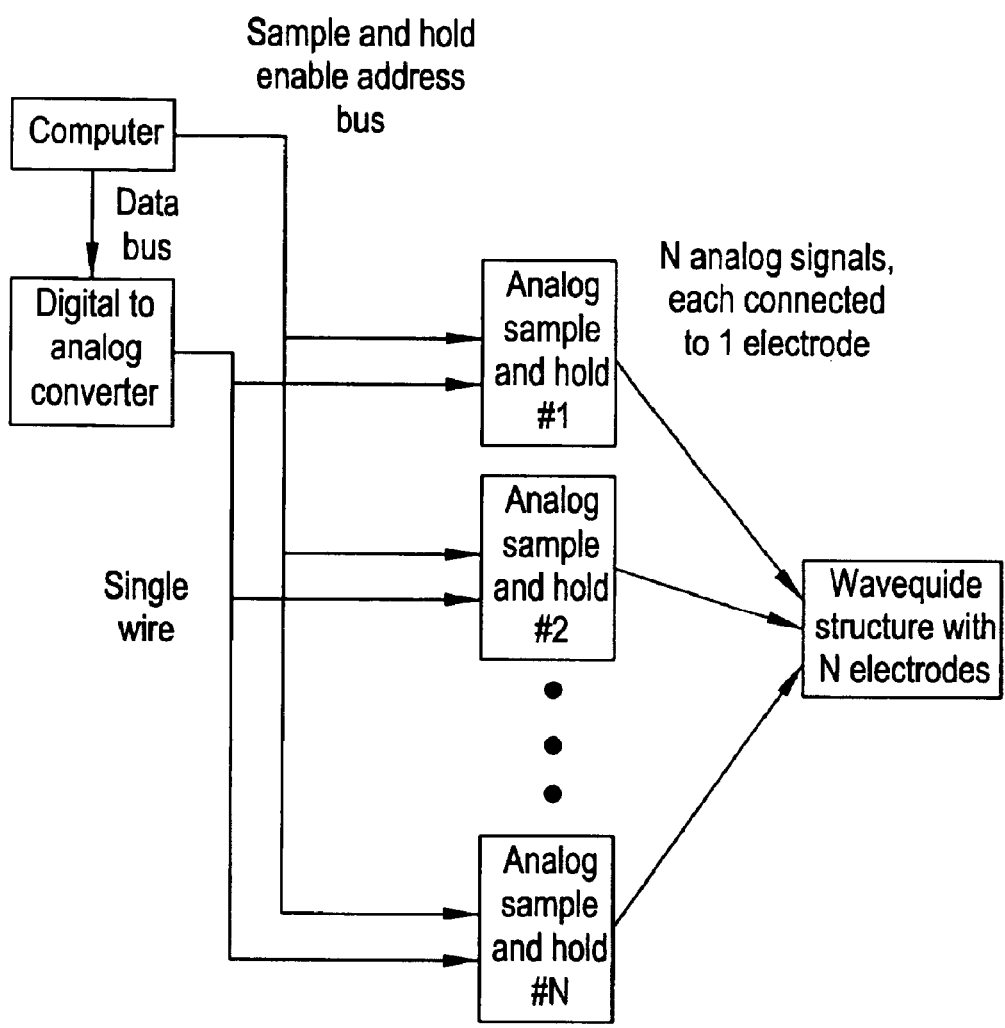
Figure 29:
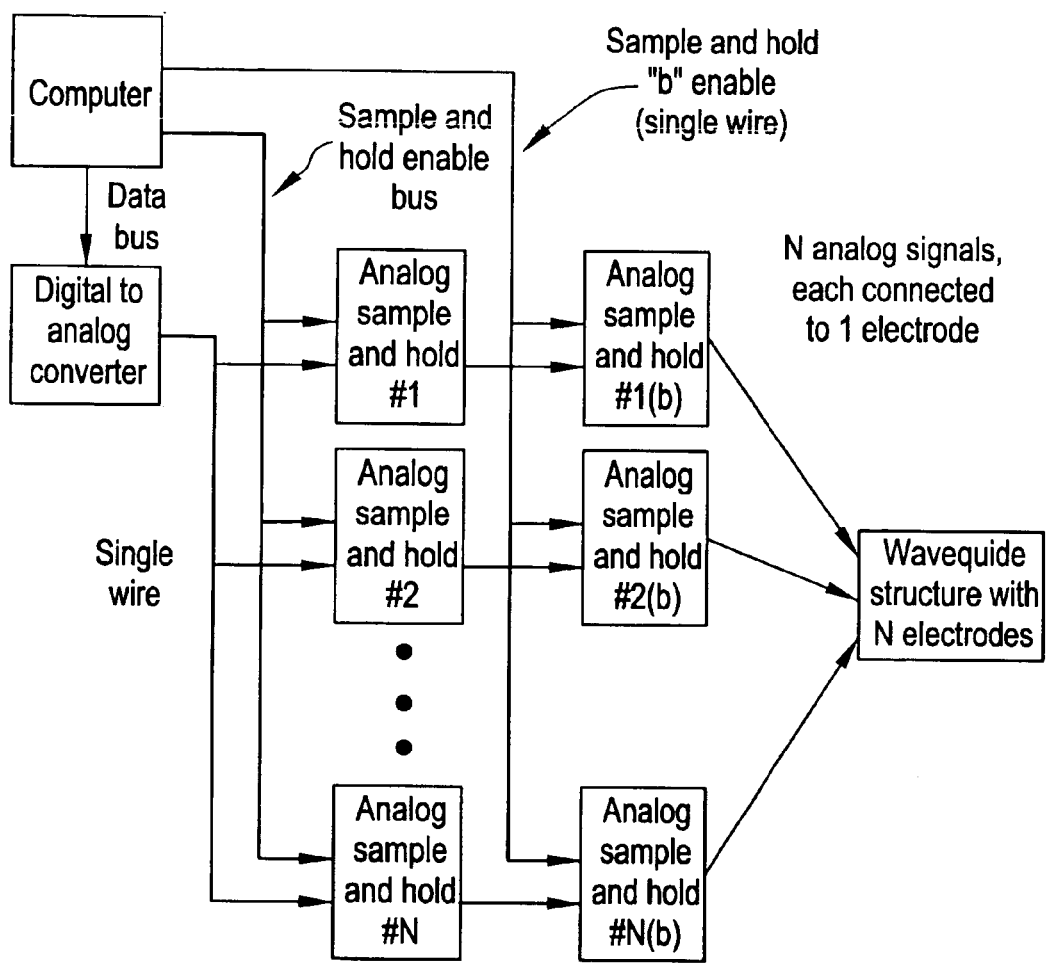

Also, instead of using multiple DACs, one for each electrode, a single DAC can be used for all electrodes if each electrode is coupled to the single DAC through an individual analog sample and hold circuit, as illustrated in FIG. 28. Specifically, this exemplary embodiment utilizes an analog bus with a single wire going to each sample and hold from the DAC (i.e., the inputs to all the analog sample and hold circuits are all connected to the output of a single DAC). The DAC is connected to a digital computer. In order for the digital computer to assign a voltage to an electrode, the DAC is commanded to the desired electrode, and the sample and hold associated with the electrode is taken to the sample state, and then returned to the hold state. The process is in turn repeated with each electrode. Furthermore, as illustrated in FIG. 29, each electrode could be coupled to the DAC through a pair of sample and hold circuits, wherein one circuit holds the voltage level being currently applied and another circuit holds the voltage level that is to be applied next.

Figure 22:
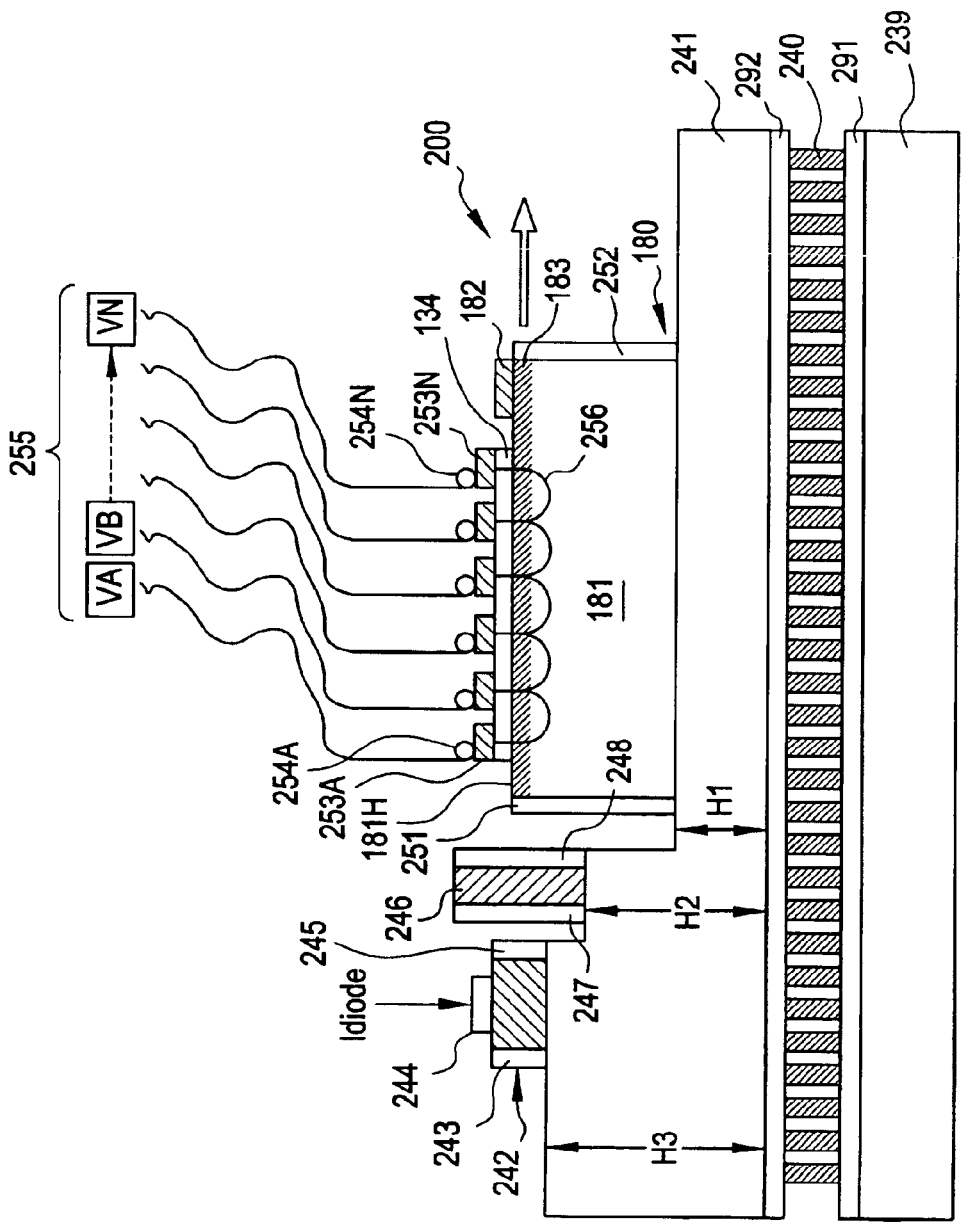
FIG. 22 illustrates, in a cross-sectional view, a block diagram using the arrangement of FIG. 16 to form a wavelength agile laser, in accordance with an exemplary embodiment of the present invention.
Figure 23:
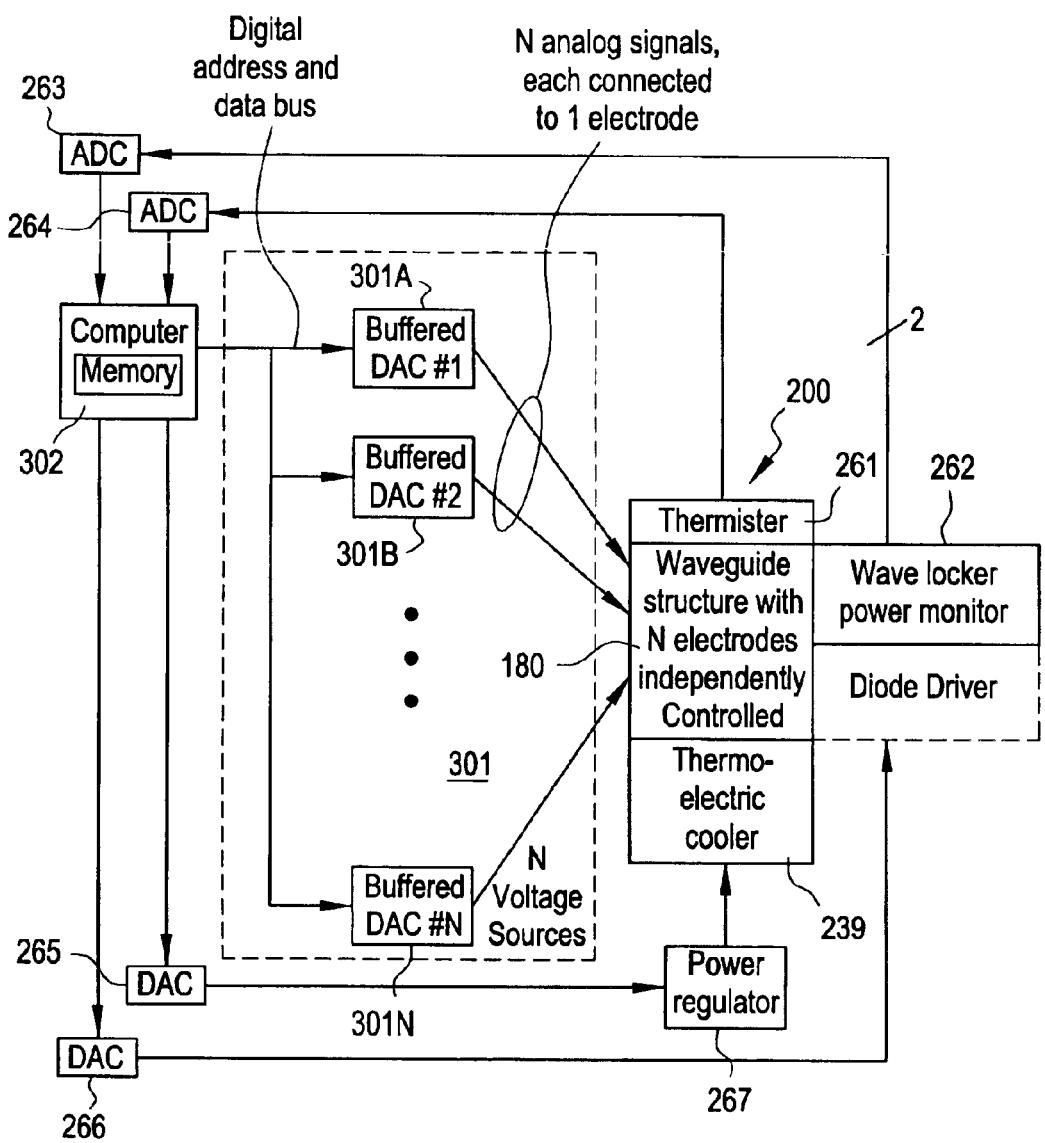
FIG. 23 illustrates, in a high level block diagram, circuitry for use in the laser of FIG. 22, in accordance with an exemplary embodiment of the present invention.

As another example, orientation of device 180 can be upside down relative to the arrangement illustrated in FIG. 22 (i.e., electrodes 253A–253N are sandwiched between device 180 and submount 241).

In the afore-described exemplary embodiments, the voltage levels applied to the electrodes are controlled independently of one another. The afore-described exemplary embodiments disclose a general method of creating a widely tunable optical filter. As described above, the optical filter is constructed in an electro-optic material such that nearly arbitrary optical transfer functions can be synthesized. According to these exemplary embodiments, independently controlled electrodes are used to synthesize an optical filter with the desired optical transfer function. In this manner, it is possible to synthesize optical filters at frequencies from, but not including, DC, up to and including the spatial Nyquist rate for the optical filter.

In many optical applications, however, it is not necessary to control the optical transfer function at optical frequencies below a certain limit, hereinafter referred to as $f_{min}$. Exploiting this freedom, it is possible to choose the voltages on the electrodes such that the voltage on each electrode is identical to the voltage applied to several other nearby electrodes, thereby forming groups of electrodes. According to this alternative exemplary embodiment, it is possible to greatly reduce the number of independent voltage sources that are constructed to control the optical filter.

According to an alternative exemplary embodiment of the present invention, the electrodes can be organized into groups of electrodes. The electrodes within each group can be organized into a plurality of subgroups of electrodes. According to an exemplary embodiment, each group of electrodes can comprise two subgroups of electrodes, and each subgroup of electrodes comprises five electrodes, although each group can comprise any number of subgroups and each subgroup can comprise any number of electrodes. The electrodes in a subgroup can be electrically-connected to each other, while each group of electrodes can be electrically-insulated from all other groups of electrodes. The voltage levels can then be applied not only independently to each group of electrodes, but also independently to each subgroup of electrodes within each group of electrodes. According to this alternative exemplary embodiment, S/L as many circuits for independently controlling the electrode voltages are needed, where L is the number of electrodes in a group, and S is the number of subgroups within each group. In addition, if the electrode control circuits are external to the electro-optic material, approximately S/L as many interconnects are needed to connect the electrodes of the electro-optic material to the external driving circuitry.

According to this alternative exemplary embodiment, the voltages that are applied to the electrodes are modeled as a "discrete space" signal. Consider a discrete space signal $m[n]$ with frequency domain representation $M(e^{jw})$. Assume that the sample rate of m is T. In the frequency domain, the Nyquist rate is normalized to $w=\pi$. Furthermore, assume that L is an even positive integer, and L/2 is an odd positive integer. The signal $m_{up}$, an upsampled version of m, can be formed by the following equation:

$$m_{up}[n] = \begin{cases} m[\text{round}(n/L)] & n \text{ even} \\ 0 & n \text{ odd} \end{cases} \quad (7)$$

Thus, according to equation (7), the spatial sample period of $m_{up}$ is T/L. In this case, the discrete time Fourier transform of $m_{up}$ is:

$$M_{up}(e^{jw}) = M(e^{jwL})(e^{-jw(-L/2+1)} + e^{-jw(-L/2+3)} + \ldots + 1 + \ldots + e^{-jw(L/2-1)}) \quad (8)$$

or equivalently $$M_{up}(e^{jw}) = M(e^{jwL}) F(w)$$

where $$F(w) = (1 + 2\cos(2w) + \ldots + 2\cos((L/2-1)w)). \quad (9)$$

Similarly, if L is odd and $m_{up}$ is formed by the following equation:

$$m_{up}[n] = \begin{cases} m[\text{round}(n/L)] & n \text{ even} \\ -m[\text{round}(n/L)] & n \text{ odd} \end{cases} \quad (10)$$

then $$M_{up}(e^{jw}) = M(e^{jwL}) G(w) \quad (11)$$

where $$G(w) = \left(1 - 2\cos(w) + 2\cos(2w) - \ldots \pm 2\cos\left(\frac{1}{2}(L-1)w\right)\right).$$

In both cases, consider the expression for $M_{up}$ under the assumption that $F(w)=G(w)=1$. Since $M(e^{jwL})$ is periodic in w, with period 2/L, then in the range $\pi-\pi/L<w<\pi$, $M_{up}(e^{jw})$ is a frequency-scaled replica of $M(e^{jw})$ in the range $-\pi<w<0$. Thus, it is possible to independently control $M_{up}(e^{jw})$ in the range $\pi-\pi/L<w<\pi$ by the design of $M(e^{jw})$ in the range $-\pi<w<0$. Restating this in the non-normalized frequency domain, it is possible to independently control the frequency response in the band $f_{min}<w<f_{nyquist}$, where $f_{min}=(1-1/L)f_{nyquist}$.

In other words, according to this alternative exemplary embodiments, by independently controlling groups of electrodes and subgroups of electrodes within the groups of electrodes, an optical filter with the desired optical transfer function can be synthesized to control the frequency response over a fraction of the total frequency band. In this manner, it is possible to synthesize optical filters at frequencies from $(1-1/L)f_{nyquist}$ up to the Nyquist rate for the optical filter. For example, for L=10 electrodes (i.e., each group of electrodes comprises ten electrodes), it is possible to control the frequency response from $(1-1/L)f_{nyquist}=(1-1/10)f_{nyquist}=0.90f_{nyquist}=90\%$ of the Nyquist rate for the optical filter to the Nyquist rate of the optical filter. The transfer function of the desired fraction of the total of the frequency band will then be replicated in the other frequency bands (e.g., for L=10, the first tenth of the frequency band, the second tenth of the frequency band, and so forth). However, any number of electrodes can be grouped together to synthesize a transfer function to control the frequency response of any desired fraction of the frequency band.

Figure 30:
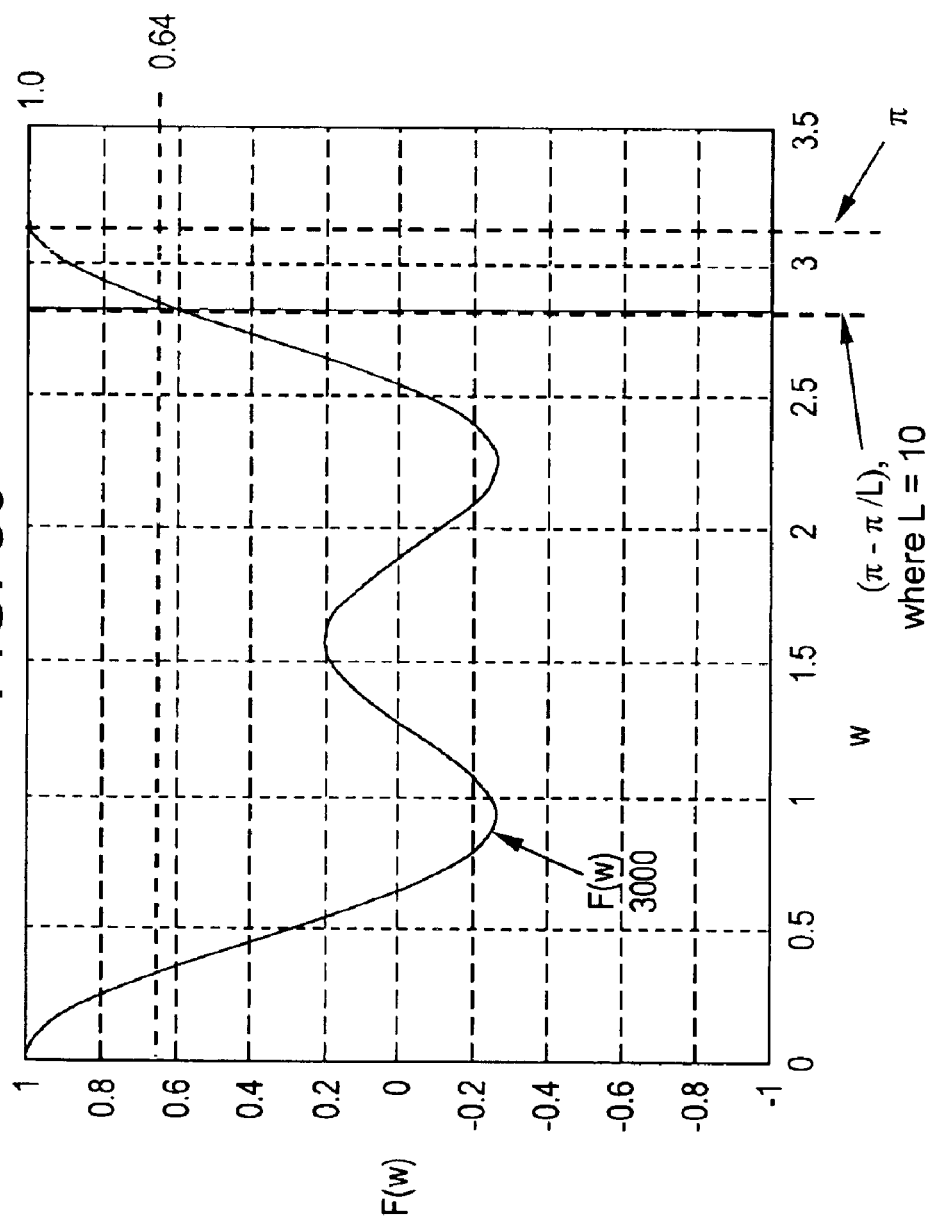
FIG. 30 is a plot of normalized transfer function F(w), in accordance with an alternative exemplary embodiment of the present invention.
Figure 31:
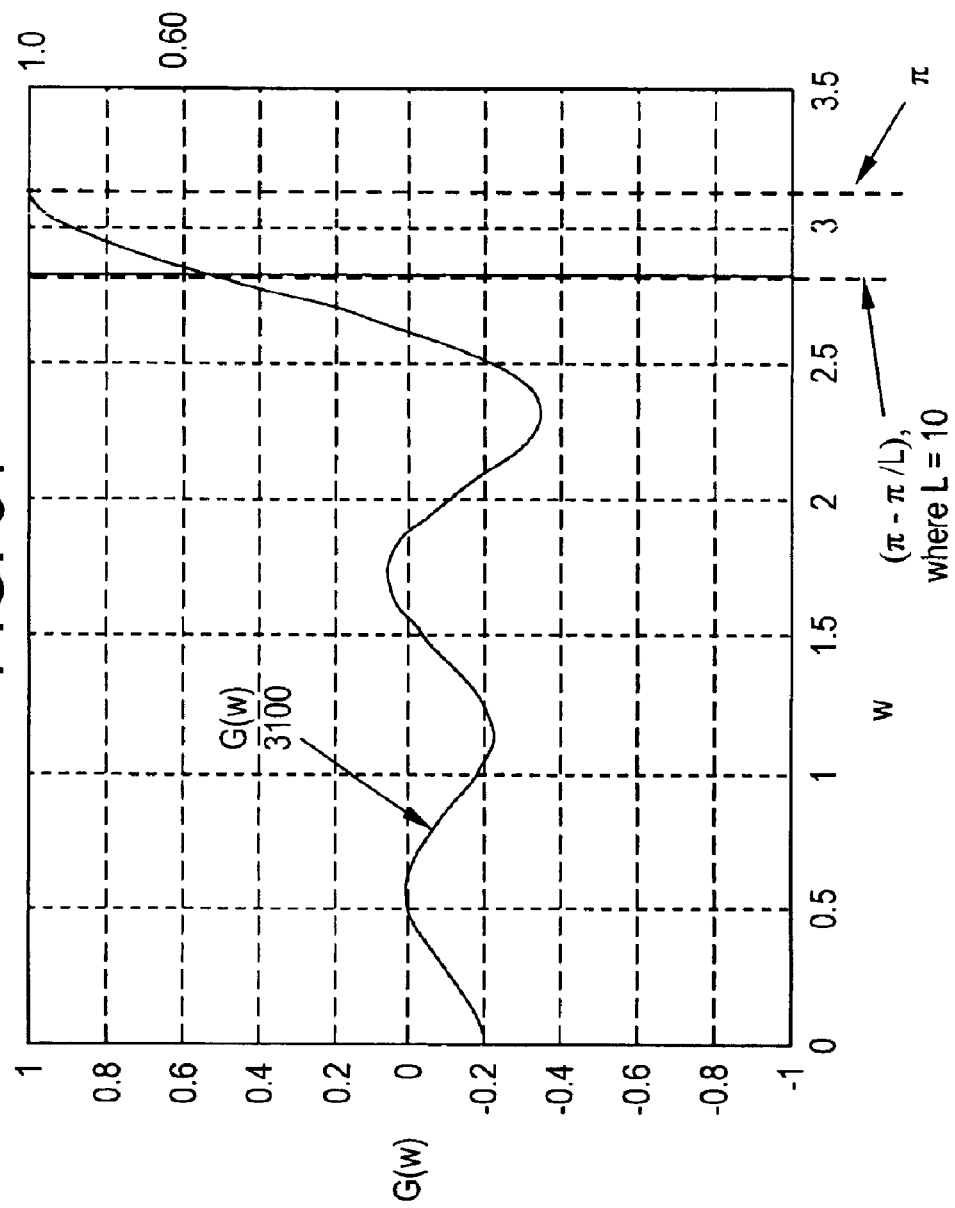
FIG. 31 is a plot of normalized transfer function G(w), in accordance with another alternative exemplary embodiment of the present invention.

What remains is an understanding of how the terms $F(w)$ and $G(w)$ disturb $M_{up}(e^{jw})$. A plot of normalized $F(w)$ 3000 is illustrated in FIG. 30 and a plot of normalized $G(w)$ 3100 is illustrated in FIG. 31, both for an example of L=10, although any value of L can be used. As shown in FIG. 30, in the range $\pi-\pi/L<w<\pi$, $F(w)$ 3000 is monotonic, and $0.64<F(w)<1$. As shown in FIG. 31, in the range $\pi-\pi/L<w<\pi$, $G(w)$ 3100 is monotonic, and $0.60<G(w)<1$. These relations can hold over a very wide range of L, and at least span the range $4 \leq L \leq 100$.

Figure 32:
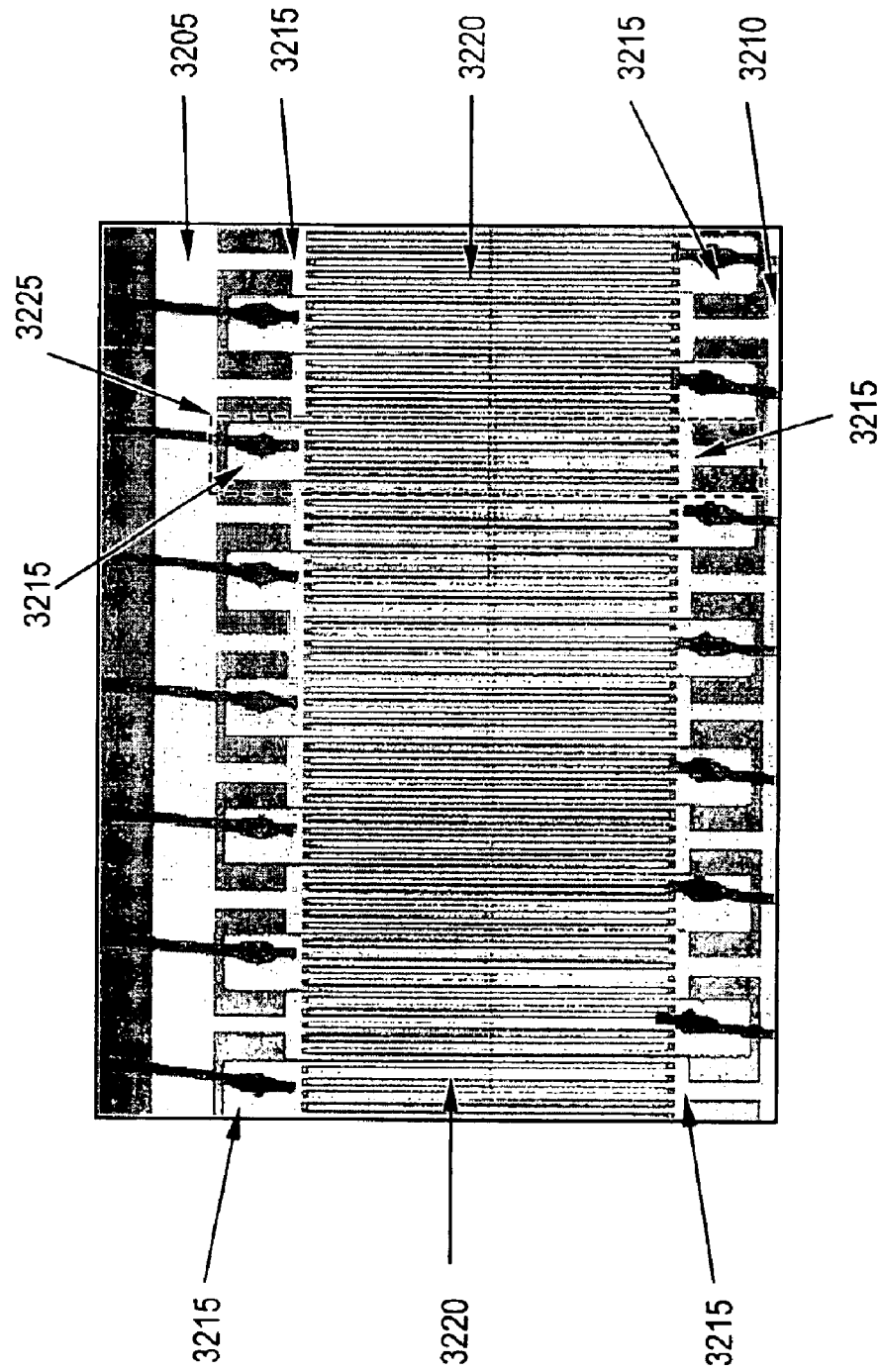
FIG. 32 is an illustration of how to construct an electrode pattern, and wirebond the electrode pattern to external driving circuitry, in which electrodes are organized into groups of electrodes and electrodes with a group are organized into subgroups of electrodes, in accordance with an alternative exemplary embodiment of the present invention.

An example embodiment of how to construct such an electrode pattern, and wirebond the electrode pattern to external driving circuitry, is illustrated in FIG. 32. In this image, for purposes of illustration and not limitation, L=10, although L can be any number of electrodes. The long bar on the top (long bar 3205) and bottom (long bar 3210) of FIG. 32 are ground busses. In this example, the individual wirebonds 3215 connect to five individual electrodes 3220. Thus, in this example, a group 3225 of electrodes comprises L=10 electrodes, while each subgroup 3215 of electrodes within the group 3225 of electrodes comprises five individual electrodes 3220. The waveguide relief is visible under the electrodes running the full width of FIG. 32, roughly centered from top to bottom in FIG. 32.

Thus, according to an alternative exemplary embodiment of the present invention, an apparatus for synthesizing an electric field comprises a plurality of groups 3225 of electrodes. The electrodes 3220 within a group 3225 and the groups 3225 of electrodes are positioned successively one after another along a predetermined direction in space. The electrodes 3220 within a group are organized into a plurality of subgroups 3215 of electrodes. The electrodes 3220 within a subgroup 3215 are electrically-connected to each other. Each group 3225 of electrodes is electrically-insulated from all other groups 3225 of electrodes.

The apparatus includes a first plurality of storage elements encoded with a corresponding first plurality of digital values indicative of a first plurality of voltage levels to be applied to the groups 3225 of electrodes. The first plurality of digital values are greater in number than a minimum number used for representing a highest frequency component in a representation of an electric field distribution from which the first plurality of digital values are derived. Each group 3225 of electrodes is coupled to a different storage element in the first plurality of storage elements. According to this alternative exemplary embodiment, each group 3225 of electrodes comprises two subgroups 3215 of electrodes, and each subgroup 3215 of electrodes comprises five electrodes 3220. However, each group 3225 of electrodes can comprise any number of subgroups, and each subgroup 3215 can comprise any number of electrodes 3220.

According to an exemplary embodiment, the voltage levels to be applied to each group 3225 of electrodes are applied independently to each subgroup 3215 of electrodes within each group 3225 of electrodes. Additionally, the voltage levels at successive adjacent groups 3225 of electrodes are applied independently of one another. Thus, the voltage levels can be applied independently to each group 3225 of electrodes, and independently to each subgroup 3215 of electrodes within each group 3225 of electrodes.

According to an exemplary embodiment, at least one subgroup 3215 of electrodes in each of at least two different groups 3225 of electrodes can be directly connected together using, for example, the ground bus 3205 or any other type of direct electrical connection. By directly connecting together at least one subgroup 3215 of electrodes in each of at least two groups 3225 of electrodes in such a manner, the number of interconnects can be further reduced from S/L to (1/L+1), and the number of independent voltage sources can be further reduced from S/L to 1/L. However, although the subgroups 3215 of electrodes can be directly connected to any number of other subgroups 3215 of electrodes in any number of other groups 3225 of electrodes, the subgroups 3215 of electrodes in each group 3225 of electrodes do not need to be directly connected to other subgroups 3215 of electrodes in other groups 3225 of electrodes.

According to another alternative exemplary embodiment, an apparatus for synthesizing an electric field comprises a plurality of groups 3225 of electrodes. Each group 3225 of electrodes is electrically-insulated from all other groups 3225 of electrodes. The apparatus also comprises a plurality of storage elements encoded with digital values corresponding to a plurality of voltage levels to be applied to the groups 3225 of electrodes. According to an exemplary embodiment, the plurality of storage elements comprises at least four in number. Each group 3225 of electrodes is coupled to a different storage element in the plurality of storage elements.

According to an exemplary embodiment, the electrodes 3220 within a group 3225 are organized into a plurality of subgroups 3215 of electrodes. According to an exemplary embodiment, each group 3225 of electrodes comprises two subgroups 3215 of electrodes, and each subgroup 3215 of electrodes comprises five electrodes. However, each group 3225 of electrodes can comprise any number of subgroups, and each subgroup 3215 can comprise any number of electrodes 3220. The electrodes 3220 within a subgroup 3215 are electrically-connected to each other.

According to an exemplary embodiment, the voltage levels to be applied to each group 3225 of electrodes are applied independently to each subgroup 3215 of electrodes within each group 3225 of electrodes. Additionally, the voltage levels at successive adjacent groups 3225 of electrodes are applied independently of one another. Thus, the voltage levels can be applied independently to each group 3225 of electrodes, and independently to each subgroup 3215 of electrodes within each group 3225 of electrodes.

According to another alternative exemplary embodiment, an apparatus for synthesizing an electric field comprises a plurality of groups 3225 of electrodes. The electrodes 3220 within a group 3225 and the groups 3225 of electrodes are positioned successively one after another along a predetermined direction. The electrodes 3220 within a group 3225 and the groups 3225 of electrodes are separated by an equal pitch therebetween. Each of the electrodes 3220 within a group 3225 has a width substantially equal to fifty percent of the pitch. The apparatus also comprises a plurality of storage elements encoded with digital values corresponding to a plurality of voltage levels to be applied to the groups 3225 of electrodes. Each group of electrodes is coupled to a different storage element in the plurality of storage elements.

According to this alternative exemplary embodiment, the electrodes 3220 within a group 3225 are organized into a plurality of subgroups 3215 of electrodes. According to an exemplary embodiment, each group 3225 of electrodes comprises two subgroups 3215 of electrodes, and each subgroup 3215 of electrodes comprises five electrodes. However, each group 3225 of electrodes can comprise any number of subgroups, and each subgroup 3215 can comprise any number of electrodes 3220. The electrodes 3220 within a subgroup 3215 are electrically-connected to each other.

According to this alternative exemplary embodiment, the voltage levels to be applied to each group 3225 of electrodes are applied independently to each subgroup 3215 of electrodes within each group 3225 of electrodes. Additionally, the voltage levels at successive adjacent groups 3225 of electrodes are applied independently of one another. Thus, the voltage levels can be applied independently to each group 3225 of electrodes, and independently to each subgroup 3215 of electrodes within each group 3225 of electrodes.

According to another alternative exemplary embodiment, an apparatus for synthesizing an electric field comprises a plurality of groups 3225 of electrodes. The electrodes 3220 within a group 3225 and the groups 3225 of electrodes are positioned successively one after another along a predetermined direction. Each group 3225 of electrodes is electrically-insulated from all other groups 3225 of electrodes. The apparatus also comprises a plurality of storage elements encoded with digital values corresponding to a plurality of voltage levels to be applied to the plurality of groups 3225 of electrodes. The voltage levels applied to at least four successive groups 3225 of electrodes along the predetermined direction have different values.

According to this alternative exemplary embodiment, the electrodes 3220 within a group 3225 are organized into a plurality of subgroups 3215 of electrodes. According to an exemplary embodiment, each group 3225 of electrodes comprises two subgroups 3215 of electrodes, and each subgroup 3215 of electrodes comprises five electrodes. However, each group 3225 of electrodes can comprise any number of subgroups, and each subgroup 3215 can comprise any number of electrodes 3220. The electrodes 3220 within a subgroup 3215 are electrically-connected to each other.

According to this alternative exemplary embodiment, the voltage levels to be applied to the at least four successive groups 3225 of electrodes are applied independently to each subgroup 3215 of electrodes within each group 3225 of electrodes. Additionally, the voltage levels at the at least four successive groups 3225 of electrodes are applied independently of one another. Thus, the voltage levels applied to the at least four successive groups 3225 of electrodes can be applied independently to each group 3225 of electrodes, and independently to each subgroup 3215 of electrodes within each group 3225 of electrodes.

According to another alternative exemplary embodiment, an apparatus for synthesizing an electric field comprises a substance of variable refractive index. The apparatus also comprises a plurality of groups 3225 of electrodes. The electrodes 3220 within a group 3225 and the groups 3225 of electrodes are positioned successively one after another along a predetermined direction. The electrodes 3220 within a group 3225 and the groups 3225 of electrodes are separated by an equal pitch therebetween. Each group 3225 of electrodes is electrically-insulated from all other groups 3225 of electrodes. The groups 3225 of electrodes are located adjacent to the substance. During operation, a plurality of voltages applied to the groups 3225 of electrodes cause a change in the variable refractive index of the substance along the predetermined direction. The pitch is less than a spatial periodicity of the change in the variable refractive index. The apparatus also comprises a plurality of storage elements encoded with digital values corresponding to a plurality of voltage levels to be applied to the groups 3225 of electrodes. Each group 3225 of electrodes is coupled to a different storage element in the plurality of storage elements.

According to this alternative exemplary embodiment, the electrodes 3220 within a group 3225 are organized into a plurality of subgroups 3215 of electrodes. According to an exemplary embodiment, each group 3225 of electrodes comprises two subgroups 3215 of electrodes, and each subgroup 3215 of electrodes comprises five electrodes. However, each group 3225 of electrodes can comprise any number of subgroups, and each subgroup 3215 can comprise any number of electrodes 3220. The electrodes 3220 within a subgroup 3215 are electrically-connected to each other.

According to this alternative exemplary embodiment, the voltage levels to be applied to each group 3225 of electrodes are applied independently to each subgroup 3215 of electrodes within each group 3225 of electrodes. Additionally, the voltage levels at successive adjacent groups 3225 of electrodes are applied independently of one another. Thus, the voltage levels can be applied independently to each group 3225 of electrodes, and independently to each subgroup 3215 of electrodes within each group 3225 of electrodes.

FIG. 33 is a flowchart illustrating steps for synthesizing an electric field, in accordance with an alternative exemplary embodiment of the present invention. In step 3305, a representation of the electric field to be synthesized is over-sampled to determine a first plurality of voltage levels to be generated at a corresponding plurality of subgroups of locations within each of a plurality of groups of locations in space. In step 3310, subsequent to the step of over-sampling, a plurality of first digital values corresponding to the first plurality of voltage levels is stored in memory. In step 3315, the first plurality of digital values is read from memory. In step 3320, a first instruction is received indicating at least an attribute of the to-be-synthesized electric field. In step 3325, the first plurality of voltage levels is applied to the subgroups of locations within each group of locations. The voltage levels applied to the subgroups of locations within each group of locations are applied independently of one another. In addition, the voltage levels applied to the subgroups of locations within successive groups of locations are applied independently of one another. Thus, the voltage levels can be applied independently to each group of locations, and independently to each subgroup of locations within each group of locations.

According to this alternative exemplary embodiment, the electric field synthesized during the step of applying comprises a first distribution, and, subsequent to the first step of applying, in step 3330, a second instruction is received indicating a second distribution of a different electric field to be synthesized. In step 3335, a second plurality of voltage levels is applied to the subgroups of locations within each group of locations. A different electric field synthesized by applying the second plurality of voltage levels has a second distribution that is different from the first distribution. In step 3340, a change is exhibited in a refractive index of a substance that is located within a sufficient proximity to the groups of locations to respond to the electric field synthesized during the steps of applying.

According to this alternative exemplary embodiment, the first plurality of voltage levels are applied to a corresponding plurality of subgroups of electrodes within each of a corresponding plurality of groups of electrodes. The electrodes within a group are organized into the plurality of subgroups of electrodes. The subgroups of electrodes correspond to the subgroups of locations in space. According to an exemplary embodiment, each group of electrodes comprises two subgroups of electrodes, and each subgroup of electrodes comprises five electrodes. However, each group of electrodes can comprise any number of subgroups, and each subgroup can comprise any number of electrodes. The electrodes within a subgroup are electrically-connected to each other. Each of the groups of electrodes is electrically-insulated from all other groups of electrodes.

FIG. 34 is a flowchart illustrating steps for synthesizing an electric field, in accordance with another alternative exemplary embodiment of the present invention. In step 3405, based on a mathematical model of the to-be-synthesized electric field, a determination is made of a plurality of voltage levels to be applied at a corresponding plurality of subgroups of locations within each of a plurality of groups of locations in space. The groups of locations are arranged successively one after another in spatial succession. In step 3410, the plurality of voltage levels are applied to the subgroups of locations within each group of locations. The voltage levels applied to the subgroups of locations within each group of locations are applied independently of one another. In addition, the voltage levels applied to the subgroups of locations within successive adjacent groups of locations are applied independently of one another. Thus, the voltage levels can be applied independently to each group of locations, and independently to each subgroup of locations within each group of locations. In step 3415, a change is exhibited in a refractive index of a substance that is located within a sufficient proximity to the groups of locations to respond to the electric field synthesized during the steps of applying.

According to this alternative exemplary embodiment, the plurality of voltage levels are applied to a corresponding plurality of subgroups of electrodes within each of a corresponding plurality of groups of electrodes. The electrodes within a group are organized into the plurality of subgroups of electrodes. The subgroups of electrodes correspond to the subgroups of locations in space. According to an exemplary embodiment, each group of electrodes comprises two subgroups of electrodes, and each subgroup of electrodes comprises five electrodes. However, each group of electrodes can comprise any number of subgroups, and each subgroup can comprise any number of electrodes. The electrodes within a subgroup are electrically-connected to each other. Each of the groups of electrodes is electrically-insulated from all other groups of electrodes.

The steps of a computer program as illustrated in FIGS. 1B, 2B, 24, 33 and 34 for synthesizing an electric field can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents, foreign patents, and publications discussed above are hereby incorporated herein by reference in their entireties.

What is claimed is:

1. An apparatus for synthesizing an electric field, comprising:
    a plurality of groups of electrodes,
        wherein the electrodes within each group and the groups of electrodes are positioned successively one after another along a predetermined direction in space,
        wherein the electrodes within each group are organized into a plurality of subgroups of electrodes,
        wherein the electrodes within each subgroup are electrically-connected to each other,
        and wherein each group of electrodes is electrically-insulated from all other groups of electrodes;
    a first plurality of storage elements encoded with a corresponding first plurality of digital values indicative of a first plurality of voltage levels to be applied to the groups of electrodes,
        wherein the first plurality of digital values are greater in number than a minimum number used for representing a highest frequency component in a representation of an electric field distribution from which the first plurality of digital values are derived,
        wherein each group of electrodes is coupled to a different storage element in the first plurality of storage elements.

2. The apparatus of claim 1, wherein the voltage levels to be applied to each group of electrodes are applied independently to each subgroup of electrodes within each group of electrodes.

3. The apparatus of claim 1, wherein each group of electrodes comprises two subgroups of electrodes, and
    wherein each subgroup of electrodes comprises five electrodes.

4. The apparatus of claim 1, wherein the voltage levels at successive adjacent groups of electrodes are applied independently of one another.

5. The apparatus of claim 1, comprising:
    a substance that exhibits a change in refractive index in response to an electric field,
        wherein the substance is located adjacent to the groups of electrodes.

6. The apparatus of claim 5, comprising:
    a light source positioned to propagate light into the substance.

7. The apparatus of claim 1, wherein the first plurality of digital values define the electric field to comprise a first distribution in space perpendicular to the predetermined direction, and wherein the apparatus comprises:
    an additional storage element encoded with an instruction indicating an attribute of a second distribution different from the first distribution.

8. The apparatus of claim 1, wherein the electric field is approximately sinusoidal in space, and wherein the approximation depends on a number of the first plurality of digital values.

9. The apparatus of claim 1, comprising:
    a second plurality of storage elements encoded with a corresponding second plurality of digital values,
        wherein each group of electrodes is coupled to a different storage element in the second plurality of storage elements;
    an additional storage element encoded with an attribute of a different electric field represented by the second plurality of digital values; and
    a plurality of multiplexers,
        wherein each multiplexer comprises two input ports respectively coupled to a first storage element in the first plurality of storage elements and to a second storage element in the second plurality of storage elements, and
        wherein each multiplexer comprises an output port coupled to one of the groups of electrodes.

10. The apparatus of claim 1, comprising:
    two reflective surfaces arranged opposite one another so as to define a cavity,
        wherein the groups of electrodes are positioned to generate an electric field within the cavity.

11. The apparatus of claim 10, comprising:
    a gain medium located within the cavity;
    a mode converter located within the cavity and adjacent to the groups of electrodes; and
    an optical coupler located between the gain medium and the mode converter.

12. The apparatus of claim 11, comprising:
    a first anti-reflective coating formed on the gain medium; and
    a second anti-reflective coating formed on the mode converter.

13. The apparatus of claim 11, comprising:
    a first waveguide formed within the gain medium; and
    a second waveguide formed within the mode converter.

14. The apparatus of claim 11, wherein the optical coupler comprises one of a lens, a tapered waveguide, and an optical fiber.

15. The apparatus of claim 11, wherein the mode converter comprises a polarization mode converter, and wherein the polarization mode converter camprises:
    a substance of variable refractive index,
        wherein the substance is located within a proximity to the groups of electrodes to respond to the electric field generated by the groups of electrodes; and
    a polarizing element located adjacent to a first reflective surface of the two reflective surfaces.

16. The apparatus of claim 15, wherein the first reflective surface is partially transmissive, and wherein the apparatus comprises:
    a photodiode located adjacent to the first reflective surface.

17. The apparatus of claim 16, comprising:
    a wavelength filter located between the first reflective surface and the photodiode.

18. The apparatus of claim 16, comprising:
    an analog-to-digital converter coupled to the photodiode; and
    a computer coupled to the analog-to-digital converter to receive a signal from the analog-to-digital converter.

19. The apparatus of claim 16, comprising:
    a laser diode; and
    a package, wherein the package encloses the laser diode and the mode converter.

20. The apparatus of claim 19, wherein the package also encloses the gain medium and the optical coupler.

21. The apparatus of claim 15, comprising:
an optical modulator coupled to the first reflective surface to modulate light in accordance with one of a digital waveform and an analog waveform.

22. The apparatus of claim 11, wherein the gain medium comprises a semiconductor device.

23. The apparatus of claim 22, wherein the semiconductor device comprises a laser diode.

24. The apparatus of claim 23, wherein the laser diode is excited by an injection current.

25. The apparatus of claim 24, comprising:
driver circuitry configured to modulate the injection current in accordance with one of an analog waveform and a digital waveform.

26. The apparatus of claim 22, wherein the gain medium comprises the semiconductor device excited by an optical output of a laser device.

27. The apparatus of claim 11, wherein the gain medium comprises a plurality of rare-earth ions embedded in a dielectric material.

28. The apparatus of claim 11, wherein the gain medium comprises a waveguide having an asymmetric cross-section.

29. The apparatus of claim 11, wherein the gain medium comprises a waveguide having an artificially-induced strain in an active layer.

30. The apparatus of claim 29, wherein the voltage levels at successive adjacent groups of electrodes are applied independently of one another.

31. The apparatus of claim 29, wherein the electrodes within each group are organized into a plurality of subgroups of electrodes, and
wherein the electrodes within each subgroup are electrically-connected to each other.

32. The apparatus of claim 31, wherein the voltage levels to be applied to each group of electrodes are applied independently to each subgroup of electrodes within each group of electrodes.

33. The apparatus of claim 31, wherein each group of electrodes comprises two subgroups of electrodes, and
wherein each subgroup of electrodes comprises five electrodes.

34. The apparatus of claim 11, comprising:
a microprocessor flip-chip bonded to the groups of electrodes.

35. An apparatus for synthesizing an electric field, comprising:
a plurality of groups of electrodes,
wherein electrodes within each group and the groups of electrodes are positioned successively one after another along a predetermined direction, and
wherein each group of electrodes is electrically-insulated from all other groups of electrodes; and
a plurality of storage elements encoded with digital values corresponding to a plurality of voltage levels to be applied to the groups of electrodes,
wherein the plurality of storage elements comprises at least four in number, and
wherein each group of electrodes is coupled to a different storage element in the plurality of storage elements.

36. The apparatus of claim 35, comprising:
a substance of a variable refractive index,
wherein the substance is located adjacent to the groups of electrodes.

37. The apparatus of claim 35, comprising:
a light source positioned to transmit light into the electric field synthesized by the groups of electrodes when the voltage levels are applied.

38. An apparatus for synthesizing an electric field, comprising:
a plurality of groups of electrodes,
wherein the electrodes within each group and the groups of electrodes are positioned successively one after another along a predetermined direction,
wherein the electrodes within each group and the groups of electrodes are separated by an equal pitch therebetween, and
wherein each of the electrodes within each group has a width substantially equal to fifty percent of the pitch.

39. The apparatus of claim 38, comprising:
a plurality of storage elements encoded with digital values corresponding to a plurality of voltage levels to be applied to the groups of electrodes,
wherein each group of electrodes is coupled to a different storage element in the plurality of storage elements.

40. The apparatus of claim 39, wherein the voltage levels at successive adjacent groups of electrodes are applied independently of one another.

41. The apparatus of claim 39, wherein the electrodes within each group are organized into a plurality of subgroups of electrodes, and
wherein the electrodes within each subgroup are electrically-connected to each other.

42. The apparatus of claim 41, wherein the voltage levels to be applied to each group of electrodes are applied independently to each subgroup of electrodes within each group of electrodes.

43. The apparatus of claim 41, wherein each group of electrodes comprises two subgroups of electrodes, and
wherein each subgroup of electrodes comprises five electrodes.

44. The apparatus of claim 39, comprising:
a substance of a variable refractive index,
wherein the substance is located adjacent to the groups of electrodes.

45. The apparatus of claim 44, comprising:
a light source positioned to transmit light into the substance.

46. An apparatus for synthesizing an electric field, comprising:
a plurality of groups of electrodes,
wherein the electrodes within each group and the groups of electrodes are positioned successively one after another along a predetermined direction,
wherein each group of electrodes is electrically-insulated from all other groups of electrodes; and
a plurality of storage elements encoded with digital values corresponding to a plurality of voltage levels to be applied to the plurality of groups of electrodes,
wherein the voltage levels applied to at least four successive groups of electrodes along the predetermined direction have different values.

47. The apparatus of claim 46, wherein the voltage levels at the at least four successive groups of electrodes are applied independently of one another.

48. The apparatus of claim 46, wherein the electrodes within each group are organized into a plurality of subgroups of electrodes, and
wherein the electrodes within each subgroup are electrically-connected to each other.

49. The apparatus of claim 48, wherein the voltage levels to be applied to the at least four successive groups of electrodes are applied independently to each subgroup of electrodes within each group of electrodes.

50. The apparatus of claim 48, wherein each group of electrodes comprises two subgroups of electrodes, and wherein each subgroup of electrodes comprises five electrodes.

51. The apparatus of claim 46, comprising:
a substance of a variable refractive index,
wherein the substance is located adjacent to the groups of electrodes.

52. The apparatus of claim 51, comprising:
a light source positioned to transmit light into the substance.

53. An apparatus for synthesizing an electric field, comprising:
a substance of variable refractive index; and
a plurality of groups of electrodes,
wherein the electrodes within each group and the groups of electrodes are positioned successively one after another along a predetermined direction,
wherein the electrodes within each group and the groups of electrodes are separated by an equal pitch therebetween,
wherein each group of electrodes is electrically-insulated from all other groups of electrodes,
wherein the groups of electrodes are located adjacent to the substance,
wherein, during operation, a plurality of voltages applied to the groups of electrodes cause a change in the variable refractive index of the substance along the predetermined direction, and
wherein the pitch is less than a spatial periodicity of the change in the variable refractive index.

54. The apparatus of claim 53, comprising:
a plurality of storage elements encoded with digital values corresponding to a plurality of voltage levels to be applied to the groups of electrodes,
wherein each group of electrodes is coupled to a different storage element in the plurality of storage elements.

55. The apparatus of claim 54, wherein the voltage levels at successive adjacent groups of electrodes are applied independently of one another.

56. The apparatus of claim 54, wherein the electrodes within each group are organized into a plurality of subgroups of electrodes, and
wherein the electrodes within each subgroup are electrically-connected to each other.

57. The apparatus of claim 56, wherein the voltage levels to be applied to each group of electrodes are applied independently to each subgroup of electrodes within each group of electrodes.

58. The apparatus of claim 56, wherein each group of electrodes comprises two subgroups of electrodes, and
wherein each subgroup of electrodes comprises five electrodes.

59. The apparatus of claim 54, comprising:
a light source positioned to transmit light into the substance.

60. A method of synthesizing an electric field, comprising the steps of:
over-sampling a representation of the electric field to be synthesized to determine a first plurality of voltage levels to be generated at a corresponding plurality of subgroups of locations within each of a plurality of groups of locations in space;
wherein the locations within each group and the groups of locations are arranged successively one after another in spatial succession; and
applying the first plurality of voltage levels to the subgroups of locations within each group of locations,
wherein the voltage levels applied to the subgroups of locations within each group of locations are applied independently of one another.

61. The method of claim 60, wherein the voltage levels applied to the subgroups of locations within successive groups of locations are applied independently of one another.

62. The method of claim 60, comprising the step of:
exhibiting a change in a refractive index of a substance that is located within a sufficient proximity to the groups of locations to respond to the electric field synthesized during the step of applying.

63. The method of claim 62, wherein locations within each group and the groups of locations are spaced apart from one another along a predetermined direction, wherein the method comprises the step of:
passing a light through the substance.

64. The method of claim 63, wherein the electric field is aperiodic in space along the predetermined direction, and
wherein at least a portion of the light has wavelengths in a range of about 1300 nanometers to about 1700 nanometers.

65. The method of claim 64, wherein an instantaneous spatial frequency of the change in the refractive index of the substance due to a presence of the electric field changes linearly with a distance along the predetermined direction, and
wherein a magnitude of the change in the refractive index is fixed across the distance.

66. The method of claim 64, wherein a magnitude of the change in the refractive index of the substance due to a presence of the electric field changes with a distance along the predetermined direction, and
wherein an instantaneous spatial frequency of the change in the refractive index is constant.

67. The method of claim 64, wherein a magnitude of the change in refractive index of the substance due to a presence of the electric field and an instantaneous spatial frequency of the refractive index both change with a distance along the predetermined direction.

68. The method of claim 63, wherein the electric field is periodic in space along the predetermined direction,
wherein at least a portion of the light has wavelengths in a range of about 1300 nanometers to about 1700 nanometers, and
wherein a period in space of the change in the refractive index of the substance due to a presence of the electric field is linearly-related to a wavelength in the range.

69. The method of claim 68, wherein the electric field has a period in space equal to N times half the wavelength that is linearly-related, wherein N comprises an integer greater than zero.

70. The method of claim 68, wherein a magnitude of the change in the refractive index of the substance is sufficient for a percentage of a portion of the light to be reflected.

71. The method of claim 68, wherein the electric field has a period in space that is one of greater than and equal to four times the wavelength that is linearly-related.

72. The method of claim 68, wherein a magnitude of the change in the refractive index of the substance is sufficient for a portion of the light of a wavelength in the range to be converted from a first mode to a second mode.

73. The method of claim 72, wherein the substance is birefringent, and
wherein the first mode has a first polarization and the second mode has a second polarization.

74. The method of claim 73, wherein the first polarization is transverse electric (TE) and the second polarization is transverse magnetic (TM).

75. The method of claim 73, wherein the first polarization is tranverse magnetic (TM) and the second polarization is transverse electric (TE).

76. The method of claim 72, wherein the first mode is opposite in a direction of propagation to the second mode.

77. The method of claim 72, wherein the first mode has a first propagation constant and the second mode has a second propagation constant.

78. The method of claim 72, wherein the first mode and the second mode have different propagation constants, and
wherein the first mode is in a first waveguide that is physically separated from the second mode in a second waveguide.

79. The method of claim 60, wherein the electric field synthesized during the step of applying comprises a first distribution, and wherein the method comprises the steps of:
applying a second plurality of voltage levels to the subgroups of locations within each group of locations,
wherein a different electric field synthesized by applying the second plurality of voltage levels has a second distribution that is different from the first distribution.

80. The method of claim 79, comprising the step of:
prior to the second step of applying, receiving an instruction indicating an attribute of the to-be-synthesized different electric field.

81. The method of claim 60, comprising the steps of:
prior to the step of applying, receiving a first instruction indicating at least an attribute of the to-be-synthesized electric field.

82. The method of claim 60, wherein the electric field synthesized during the step of applying comprises a first distribution, and wherein the method comprises the steps of:
subsequent to the step of applying, receiving a second instruction indicating a second distribution of a different electric field to be synthesized; and
in response to the step of receiving, applying a second plurality of voltage levels based on the second distribution to the subgroups of locations within each group of locations.

83. The method of claim 60, comprising the steps of:
subsequent to the step of over-sampling, storing in memory a first plurality of digital values corresponding to the first plurality of voltage levels; and
prior to the step of applying, reading the first plurality of digital values from memory.

84. The method of claim 60, wherein the first plurality of voltage levels are applied to a corresponding plurality of subgroups of electrodes within each of a corresponding plurality of groups of electrodes,
wherein the electrodes within each group are organized into the plurality of subgroups of electrodes,
wherein the subgroups of electrodes correspond to the subgroups of locations in space,
wherein the electrodes within each subgroup are electrically-connected to each other, and
wherein each of the groups of electrodes is electrically-insulated from all other groups of electrodes.

85. The method of claim 84, wherein the electrodes within each group and the groups of electrodes are separated by an equal pitch therebetween.

86. The method of claim 85, wherein each of the electrodes within each subgroup has a width substantially equal to fifty percent of the pitch.

87. The method of claim 85, wherein each of the electrodes within each group has a length of at least an order of magnitude greater than the pitch.

88. The method of claim 84, wherein each group of electrodes comprises two subgroups of electrodes, and
wherein each subgroup of electrodes comprises five electrodes.

89. A method of synthesizing an electric field, comprising the steps of:
determining, based on a mathematical model of the to-be-synthesized electric field, a plurality of voltage levels to be applied at a corresponding plurality of subgroups of locations within each of a plurality of groups of locations in space,
wherein the locations within each group and the groups of locations are arranged successively one after another in spatial succession; and
applying the plurality of voltage levels to the subgroups of locations within each group of locations,
wherein the voltage levels applied to the subgroups of locations within each group of locations are applied independently of one another.

90. The method of claim 89, wherein the voltage levels applied to the subgroups of locations within successive adjacent groups of locations are applied independently of one another.

91. The method of claim 89, wherein the groups of locations are arranged along a predetermined direction in space.

92. The method of claim 91, wherein the groups of locations are arranged at a spatial frequency that is greater than two times a highest spatial frequency of the mathematical model of the electric field.

93. The method of claim 89, wherein the groups of locations comprise at least three in number.

94. The method of claim 89, wherein the plurality of voltage levels comprise at least three in number.

95. The method of claim 89, wherein each of the voltage levels applied to at least four successive groups of locations have different values.

96. The method of claim 89, wherein each of the voltage levels applied to at least two successive groups of locations have identical values.

97. The method of claim 89, comprising the step of:
exhibiting a change in a refractive index of a substance that is located within a sufficient proximity to the groups of locations to respond to the electric field synthesized during the step of applying.

98. The method of claim 89, wherein the plurality of voltage levels are applied to a corresponding plurality of subgroups of electrodes within each of a corresponding plurality of groups of electrodes,
wherein the electrodes within each group are organized into the plurality of subgroups of electrodes,
wherein the subgroups of electrodes correspond to the subgroups of locations in space,
wherein the electrodes within each subgroup are electrically-connected to each other, and
wherein each of the groups of electrodes is electrically-insulated from all other groups of electrodes.

99. The method of claim 98, wherein each group of electrodes comprises two subgroups of electrodes, and
wherein each subgroup of electrodes comprises five electrodes.

* * * * *